United States Patent
Ng et al.

(10) Patent No.: US 12,211,844 B2
(45) Date of Patent: Jan. 28, 2025

(54) SEMICONDUCTOR STRUCTURE

(71) Applicant: Taiwan Semiconductor Manufacturing Company, Ltd., Hsinchu (TW)

(72) Inventors: Jin-Aun Ng, Hsinchu (TW); Yu-Chao Lin, Hsinchu (TW); Tung-Ying Lee, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 165 days.

(21) Appl. No.: 17/870,133

(22) Filed: Jul. 21, 2022

(65) Prior Publication Data
US 2022/0359506 A1  Nov. 10, 2022

Related U.S. Application Data

(62) Division of application No. 16/895,795, filed on Jun. 8, 2020, now Pat. No. 11,545,490.
(Continued)

(51) Int. Cl.
*H01L 29/66*  (2006.01)
*H01L 21/306*  (2006.01)
(Continued)

(52) U.S. Cl.
CPC .... *H01L 27/0886* (2013.01); *H01L 21/30604* (2013.01); *H01L 21/76224* (2013.01);
(Continued)

(58) Field of Classification Search
None
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |

(Continued)

FOREIGN PATENT DOCUMENTS

| | | |
|---|---|---|
| KR | 10-2015-0022905 A | 3/2015 |
| KR | 10-2019-0024523 A | 3/2019 |

(Continued)

OTHER PUBLICATIONS

Korean Notice of Allowance for Korean Application No. 10-2020-0114693, dated Oct. 18, 2022, with a partial English translation.

*Primary Examiner* — Joseph C. Nicely
*Assistant Examiner* — Lamont B Koo
(74) *Attorney, Agent, or Firm* — Birch, Stewart, Kolasch & Birch, LLP

(57) ABSTRACT

A semiconductor structure is provided. The semiconductor structure includes a first gate-all-around FET over a substrate, and the first gate-all-around FET includes first nanostructures and a first gate stack surrounding the first nanostructures. The semiconductor structure also includes a first FinFET adjacent to the first gate-all-around FET, and the first FinFET includes a first fin structure and a second gate stack over the first fin structure. The semiconductor structure also includes a gate-cut feature interposing the first gate stack of the first gate-all-around FET and the second gate stack of the first FinFET.

20 Claims, 45 Drawing Sheets

Related U.S. Application Data

(60) Provisional application No. 62/949,261, filed on Dec. 17, 2019.

(51) Int. Cl.
  *H01L 21/762* (2006.01)
  *H01L 21/8234* (2006.01)
  *H01L 27/088* (2006.01)
  *H01L 29/06* (2006.01)
  *H01L 29/423* (2006.01)

(52) U.S. Cl.
  CPC ........... *H01L 21/823431* (2013.01); *H01L 21/823437* (2013.01); *H01L 21/823481* (2013.01); *H01L 29/0673* (2013.01); *H01L 29/42392* (2013.01); *H01L 29/66545* (2013.01)

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,536,738 B2 | 1/2017 | Huang et al. |
| 9,576,814 B2 | 2/2017 | Wu et al. |
| 9,608,116 B2 | 3/2017 | Ching et al. |
| 9,620,482 B1 | 4/2017 | Chen et al. |
| 2016/0056181 A1 | 2/2016 | Anderson et al. |
| 2017/0104060 A1 | 4/2017 | Balakrishnan et al. |
| 2017/0140933 A1* | 5/2017 | Lee ............... H01L 29/1079 |
| 2017/0141210 A1 | 5/2017 | Yang |
| 2017/0194480 A1 | 7/2017 | Chen et al. |
| 2018/0151570 A1 | 5/2018 | Wang et al. |
| 2019/0067284 A1 | 2/2019 | Ching et al. |
| 2019/0252266 A1 | 8/2019 | Chen et al. |
| 2019/0305099 A1 | 10/2019 | Jo et al. |
| 2019/0355724 A1 | 11/2019 | Chiang et al. |
| 2020/0006333 A1 | 1/2020 | Noh et al. |
| 2020/0411661 A1* | 12/2020 | Guler ............... H01L 29/66484 |
| 2021/0020644 A1* | 1/2021 | Paul ............... H01L 21/28123 |

FOREIGN PATENT DOCUMENTS

| | | |
|---|---|---|
| KR | 10-2019-0062131 A | 6/2019 |
| KR | 10-2019-0063353 A | 6/2019 |
| KR | 10-2019-0112910 A | 10/2019 |
| WO | WO 2014/018201 A1 | 1/2014 |

* cited by examiner

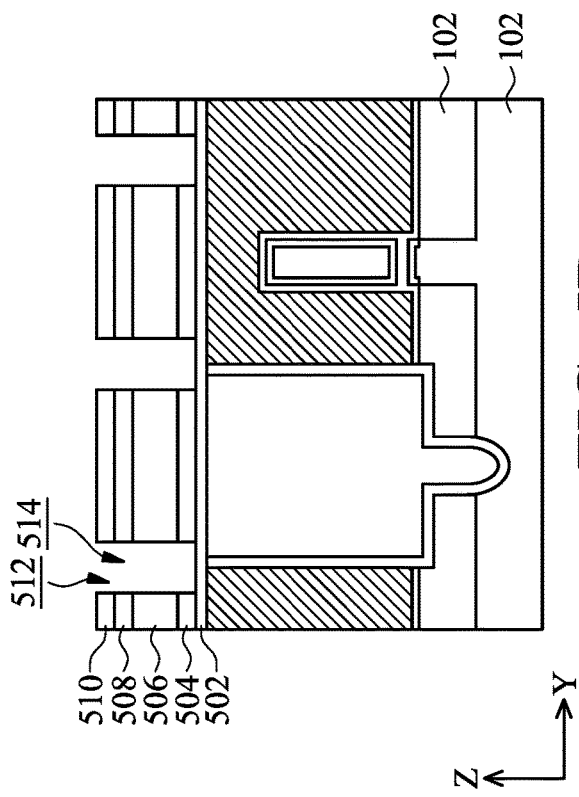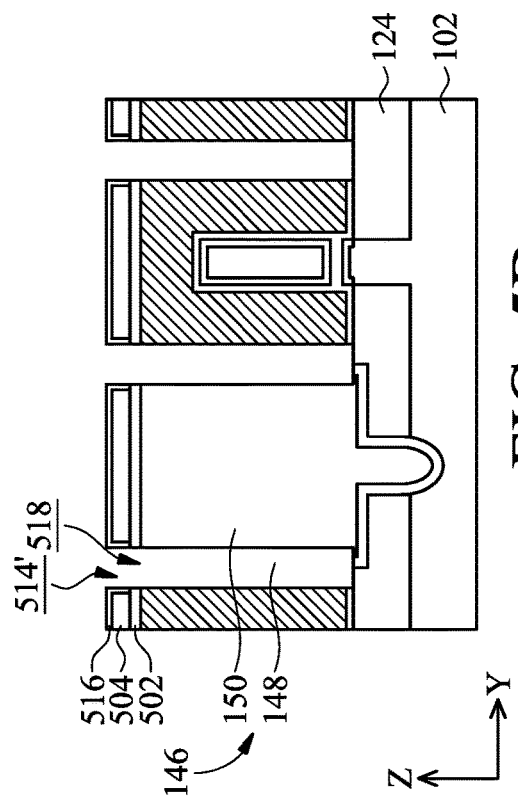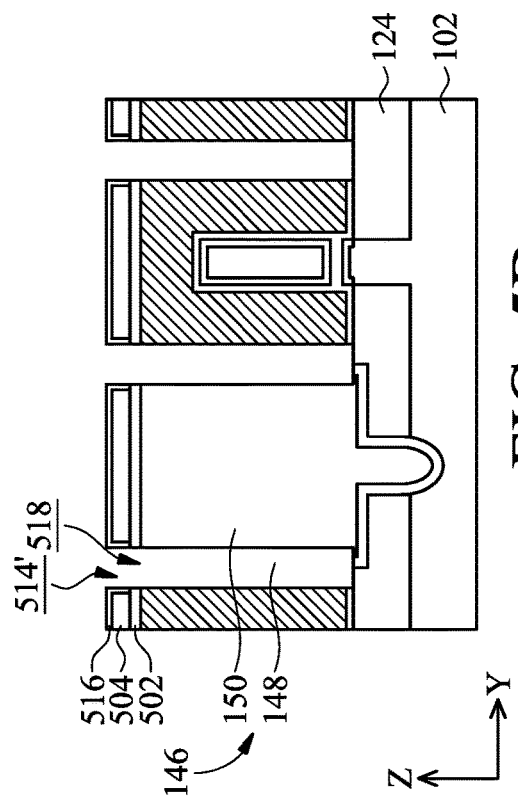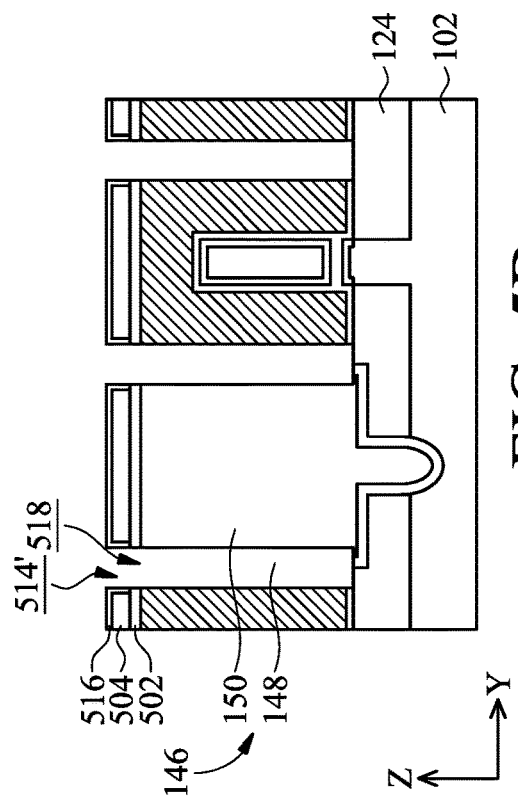

SEMICONDUCTOR STRUCTURE

PRIORITY CLAIM

This application is a divisional application of U.S. application Ser. No. 16/895,795, filed on Jun. 8, 2020, entitled "SEMICONDUCTOR STRUCTURE AND METHOD FOR FORMING THE SAME," which claims the benefit of U.S. Provisional Application No. 62/949,261, filed on Dec. 17, 2019 and entitled "SEMICONDUCTOR STRUCTURE AND METHOD FOR FORMING THE SAME," all of which are incorporated herein by reference.

BACKGROUND

The electronics industry is experiencing an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such miniaturization has introduced greater complexity into the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the gate-all around transistor (GAA). The GAA device gets its name from the gate structure which can extend around the channel region providing access to the channel on two or four sides. GAA devices are compatible with conventional complementary metal-oxide-semiconductor (CMOS) processes and their structure allows them to be aggressively scaled-down while maintaining gate control and mitigating SCEs. In conventional processes, GAA devices provide a channel in a silicon nanowire. However, integration of fabrication of the GAA features around the nanowire can be challenging. For example, while the current methods have been satisfactory in many respects, continued improvements are still needed.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2D-1, 2E-1, 2F-1, 2G-1, 2H-1, 2I-1, 2J-1, and 2K-1 are top views illustrating the formation of a semiconductor structure at various intermediate stages, in accordance with some embodiments of the disclosure.

FIG. 3 is a flowchart of a method for forming a semiconductor structure, in accordance with some embodiments of the disclosure.

FIGS. 5A-5D are cross-sectional views illustrating the formation of gate-cut openings, in accordance with some embodiments of the disclosure.

FIGS. 6-1, 7-1, 8-1, 9-1, 10-1, 11-1, 12-1, 13-1, 14-1, 15-1, 16-1, 17-1, 18-1, 19-1, 20-1, 21-1, and 22-1 are top views of various modifications of the semiconductor structure, in accordance with some embodiments of the disclosure.

FIGS. 6-2 and 6-3, 7-2 to 7-4, 8-2, 9-2, 10-2, 11-2, 12-2, 13-2, 14-2, 14-3, 15-2, 16-2, 17-2, 18-2, 19-2, 20-2, 21-2, and 22-2 are cross-sectional views of various modifications of the semiconductor structure, in accordance with some embodiments of the disclosure.

DETAILED DESCRIPTION

Figure 1:
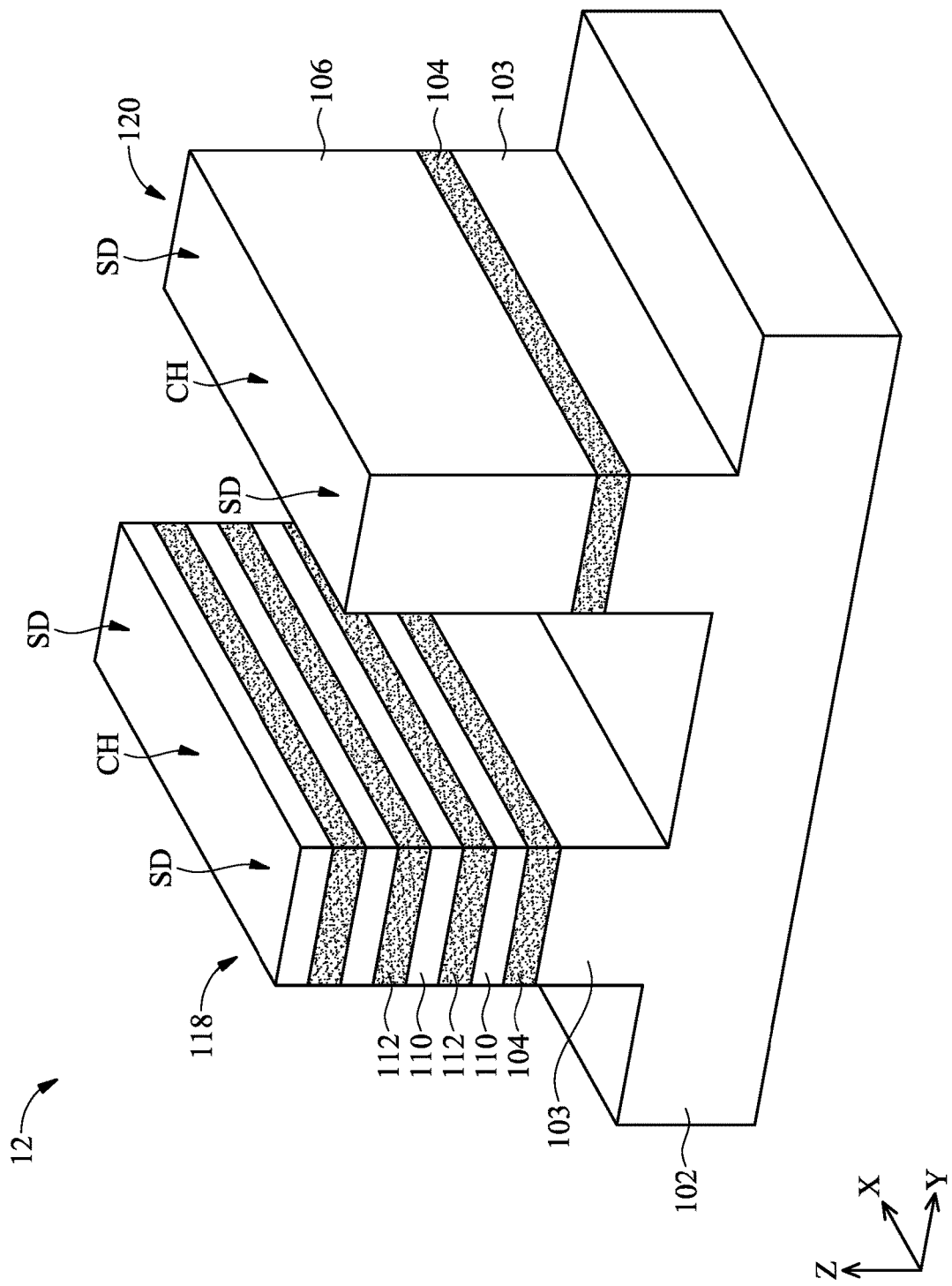
FIG. 1 is a perspective view of a semiconductor structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

Furthermore, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The gate all around (GAA) transistor structures described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Fin field effect transistors (FinFETs) are widely used in integrated circuits (ICs) including different type of devices, e.g., logic devices, memory devices (such as static random access memory (SRAM)), etc. Gate-all-around FETs (GAA FETs) can exhibit improved gate control over its channel region (e.g., low DIBL) than FinFET. The aspect of the embodiments of the present disclosure is direct to a formation method and structures that provide hybrid structures including gate-all-around field-effect transistors (GAA FETs) and FinFETs formed over the same semiconductor substrate (or chip). In addition, the embodiments of the present disclosure provide the hybrid structures including an isolation feature and gate-cut features to electrically isolate those transistors from one another. Therefore, lower processing difficulty and greater design flexibility for integrated circuits including different type of devices may be achieved by the semiconductor structure of the embodiments of the present disclosure.

FIG. 1 is a perspective view of a semiconductor structure, in accordance with some embodiments of the disclosure. A semiconductor structure 12 is provided, as shown in FIG. 1, in accordance with some embodiments. The semiconductor structure 12 includes a substrate 102, and a first fin structure 118 and a second fin structure 120 over the substrate 102, in accordance with some embodiments. For example, the first fin structure 118 may be used to form gate-all-around field-effect transistor devices, and the second fin structure 120 may be used to form FinFET devices.

For a better understanding of the semiconductor structure, FIG. 1 illustrates an X-Y-Z coordinate reference that is used in later figures. The X-axis and Y-axis are generally orientated along the lateral directions that are parallel to the main surface of the substrate 102. The Y-axis is transverse (e.g., substantially perpendicular) to the X-axis. The Z-axis is generally oriented along the vertical direction that is perpendicular to the main surface of the substrate 102 (or the X-Y plane).

The first fin structure 118 includes a lower fin element 103 formed from a portion of the substrate 102 and an upper fin element formed from an epitaxial stack including semiconductor layers 104, 110 and 112, in accordance with some embodiments. The second fin structure 120 includes a lower fin element 103 formed from a portion of the substrate 102 and an upper fin element formed from an epitaxial stack including semiconductor layers 104 and 106, in accordance with some embodiments.

The fin structures 118 and 120 extend in the X direction, in accordance with some embodiments. That is, the fin structures 118 and 120 each have a longitudinal axis parallel to X direction, in accordance with some embodiments. The X direction may also be referred to as the channel-extending direction. Each of the fin structures 118 and 120 includes a channel region CH and source/drain regions SD, where the channel region CH is defined between the source/drain regions SD, in accordance with some embodiments. FIG. 1 shows one channel region CH and two source/drain regions SD for illustrative purpose and is not intended to be limiting. The number of the channel region CH and the source/drain region SD may be dependent on the semiconductor device design demand and/or performance consideration. Gate structures (not shown) will be formed with a longitudinal axis parallel to Y direction and extending across the channel regions CH of the fin structures 118 and 120. Y direction may also be referred to as a gate-extending direction.

FIGS. 2A to 2K-4 are diagrammatic views illustrating the formation of a semiconductor structure at various intermediate stages, in accordance with some embodiments of the disclosure.

Figure 2A:
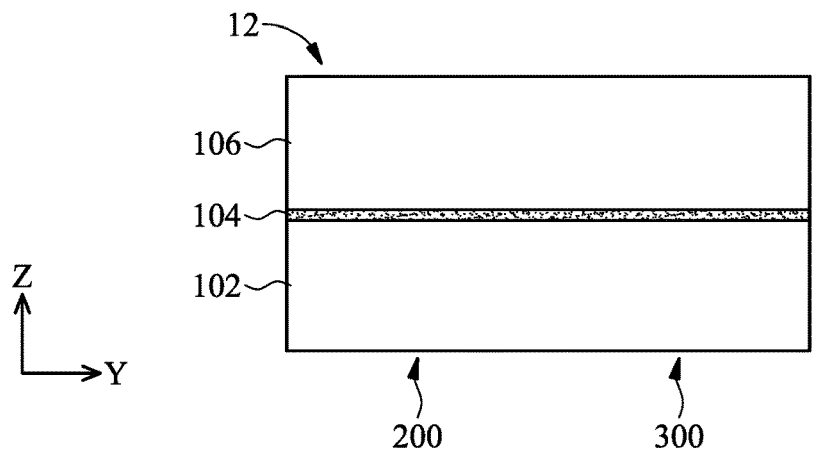
FIGS. 2A, 2B, 2C, 2D-2, 2E-2 to 2E-5, 2F-2 to 2F-5, 2G-2 to 2G-5, 2H-2 to 2H-6, 2I-2 to 2I-6, 2J-2 to 2J-4, and 2K-2 to 2K-4 are cross-sectional views illustrating the formation of a semiconductor structure at various intermediate stages, in accordance with some embodiments of the disclosure.

FIG. 2A is a cross-sectional view of a semiconductor structure 12 after the formation of a first epitaxial stack, in accordance with some embodiments.

The semiconductor structure 12 includes a substrate 102, as shown in FIG. 2A, in accordance with some embodiments. The substrate 102 includes a first region 200 where gate-all-around FET devices are to be formed and a second region 300 where the FinFET devices are to be formed, in accordance with some embodiments. In some embodiments, the first region 200 is located adjacent to the second region 300.

In some embodiments, the substrate 102 is a silicon substrate. In some embodiments, the substrate 102 includes an elementary semiconductor such as germanium; a compound semiconductor such as gallium nitride (GaN), silicon carbide (SiC), gallium arsenide (GaAs), gallium phosphide (GaP), indium phosphide (InP), indium arsenide (InAs), and/or indium antimonide (InSb); an alloy semiconductor such as SiGe, GaAsP, AlInAs, AlGaAs, GaInAs, GaInP, and/or GaInAsP; or a combination thereof. Furthermore, the substrate 102 may optionally include an epitaxial layer (epi-layer), may be strained for performance enhancement, may include a silicon-on-insulator (SOI) structure, and/or have other suitable enhancement features.

A first semiconductor layer 104 is formed over the substrate 102, and a second semiconductor layer 106 is formed over the first semiconductor layer 104, as shown in FIG. 2A, in accordance with some embodiments. In some embodiments, the first semiconductor layer 104 has a thickness in a range from about 1.5 nanometers (nm) to about 20 nm. In some embodiments, the second semiconductor layer 106 has a thickness in a range from about 5 nm to about 300 nm.

The first semiconductor layer 104 has a different lattice constant than the second semiconductor layer 106, in accordance with some embodiments. In some embodiments, the first semiconductor layer 104 and the second semiconductor layer 106 have different oxidation rates and/or etching selectivity. In some embodiments, the first semiconductor layer 104 is made of silicon germanium (SiGe), where the percentage of germanium (Ge) in the SiGe is in a range from about 20 atomic % to about 50 atomic %, and the second semiconductor layer 106 are made of silicon (Si). In some embodiments, the first semiconductor layer 104 and the second semiconductor layer 106 are formed using epitaxial growth processes such as molecular beam epitaxy (MBE), metal organic chemical vapor deposition (MOCVD), or vapor phase epitaxy (VPE), or another suitable technique. In some embodiments, the first semiconductor layer 104 and the second semiconductor layer 106 are collectively referred to as a first epitaxial stack.

Figure 2B:
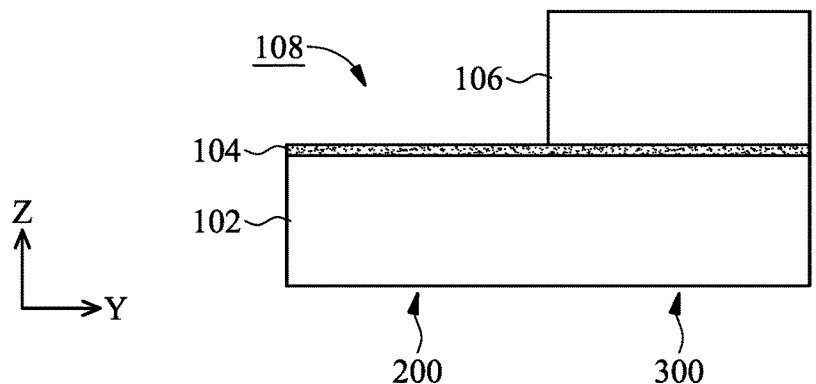

FIG. 2B is a cross-sectional view of a semiconductor structure 12 after the formation of a recess 108, in accordance with some embodiments.

An etching process is performed on the semiconductor structure 12 to recess the first epitaxial stack from the first region 200 of the substrate 102, in accordance with some embodiments. A portion of the second semiconductor layer 106 in the first region 200 is removed to form a recess 108, as shown in FIG. 2B, in accordance with some embodiments. In some embodiments, a patterned mask layer (not shown) is formed over the second semiconductor layer 106 prior to the etching process. The patterned mask layer may be a patterned photoresist layer and/or a patterned hard mask layer and is formed to cover the second region 300 of the substrate 102 while exposing the first region 200 of the substrate 102. The etching process may be a dry etching and/or a wet etching and the first semiconductor layer 104 is used as an etching stop layer in the etching process. In some embodiments, the etching process is performed until portion of the first semiconductor layer 104 in the first region 200 is exposed from the recess 108.

Figure 2C:
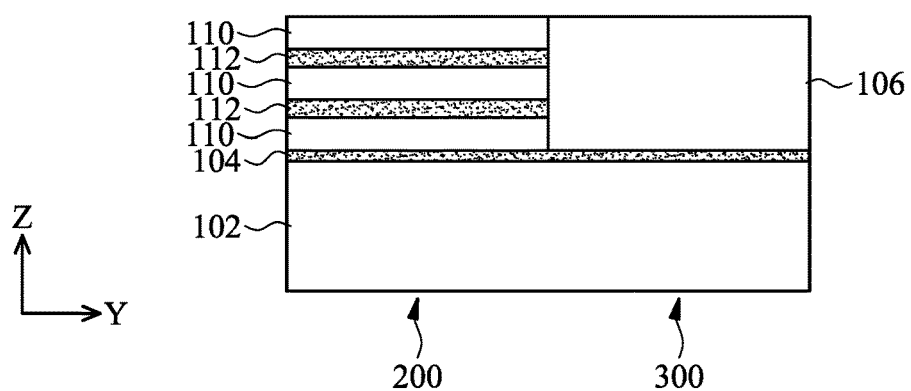

FIG. 2C is a cross-sectional view of a semiconductor structure 12 after the formation of a second epitaxial stack, in accordance with some embodiments.

Third semiconductor layers 110 and fourth semiconductor layers 112 are alternatingly formed over the first semiconductor layer 104 from the recess 108, as shown in FIG. 2C, in accordance with some embodiments. In some embodiments, the thickness of each of the third semiconductor layers 110 is in a range from about 1.5 nm to about 20 nm. In some embodiments, the thickness of each of the fourth semiconductor layers 112 is in a range from about 1.5 nm to about 20 nm. In some embodiments, the thicknesses of the third semiconductor layers 110 and the fourth semiconductor layers 112 are greater than the thickness of the first semiconductor layer 104.

The third semiconductor layers 110 have a different lattice constant than the fourth semiconductor layers 112 and the first semiconductor layer 104, in accordance with some embodiments. In some embodiments, the third semiconductor layers 110 has a different oxidation rate and/or etching selectivity than the fourth semiconductor layers 112 and the first semiconductor layer 104. In some embodiments, the third semiconductor layers 110 are made of silicon (Si), and the fourth semiconductor layers 112 are made of silicon germanium (SiGe), where the percentage of germanium (Ge) in the SiGe is in a range from about 20 atomic % to about 50 atomic %. In some embodiments, the composition of the third semiconductor layers 110 is substantially the same as the second semiconductor layer 106 and the composition of the fourth semiconductor layers 112 is substantially the same as the first semiconductor layer 104.

In some embodiments, the third semiconductor layers 110 and the fourth semiconductor layers 112 are formed using an epitaxial growth process such as MBE, MOCVD, or VPE, or another suitable technique. In some embodiments, the third semiconductor layers 110, the fourth semiconductor layers 112 and a portion of first semiconductor layer 104 in the first region 200 are collectively referred to as a second epitaxial stack. In some embodiments, the first epitaxial stack is located over the second region 300 of the substrate 102 and the second epitaxial stack is located over the first region 200 of the substrate 102.

A planarization process (e.g., chemical mechanical polish (CMP)) may be performed on the semiconductor structure 12 to remove portions of the third semiconductor layers 110 and the fourth semiconductor layers 112 formed over the upper surface of the second semiconductor layer 106. The planarization process may also remove the patterned mask layer over the second semiconductor layer 106 to expose the second semiconductor layer 106. After the planarization process, the upper surface of the uppermost third semiconductor layer 110 is substantially coplanar with the upper surface of the second semiconductor layer 106, in accordance with some embodiments.

Figures 1, 2D:
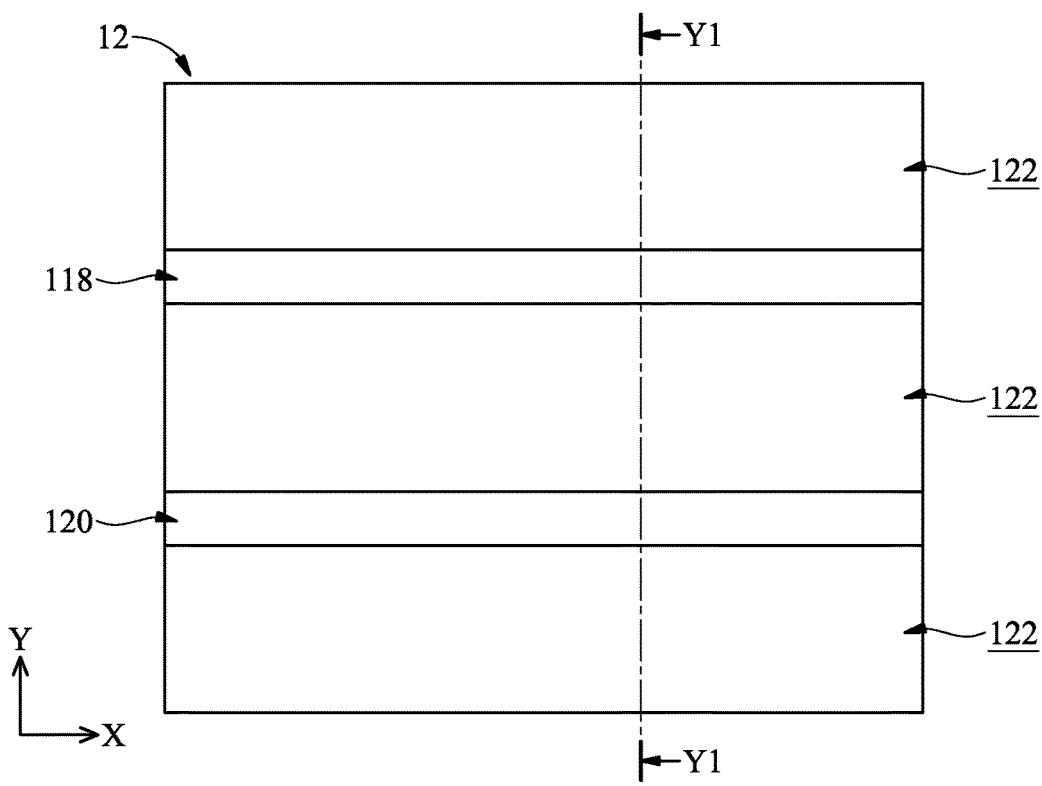
Figures 2, 2D:
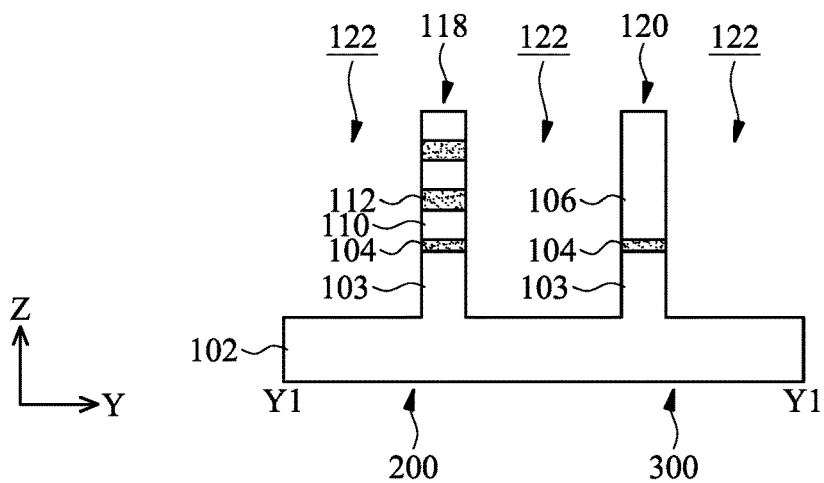

FIG. 2D-1 is a top view of a semiconductor structure 12 after the formation of a first fin structure 118 and a second fin structure 120, in accordance with some embodiments. FIG. 2D-2 is a cross-sectional view taken along line Y1-Y1 in FIG. 2D-1.

The second epitaxial stack in the first region 200, the first epitaxial stack in the second region 300 and the underlying substrate 102 are patterned to form a first fin structure 118 in the first region 200 and a second fin structure 120 in the second region 300, as shown in FIGS. 2D-1 and 2D-2, in accordance with some embodiments. The fin structures 118 and 120 are active regions of the semiconductor structure 12, which are to be formed into channel regions and source/drain regions of transistors, e.g., gate-all-around FETs and FinFETs, in accordance with some embodiments. The fin structures 118 and 120 extend in the X direction and are arranged substantially parallel with one another in the Y direction, in accordance with some embodiments. That is, the fin structures 118 and 120 have longitudinal axes parallel to the X direction, in accordance with some embodiments.

In some embodiments, the patterning process includes forming a patterned mask layer (not shown) over the semiconductor structure 12, and etching the semiconductor structure 12 uncovered by the patterned hard mask layer, thereby forming trenches 122 and the fin structures 118 and 120. The patterned mask layer may be a patterned photoresist layer and/or a patterned hard mask. The etching process may be an anisotropic etching process, e.g., dry etching.

In some embodiments, after the etching process, the substrate 102 has portions protruding from between the trenches 122 to form lower fin elements 103 of the fin structures 118 and 120. In some embodiments, a remainder of the second epitaxial stack (including the first semiconductor layer 104, the third semiconductor layers 110 and the fourth semiconductor layers 112 in the first region 200) forms an upper fin element of the first fin structure 118 over the lower fin element 103. In some embodiments, a remainder of the first epitaxial stack (including the first semiconductor layer 104 and the second semiconductor layer 106 in the second region 300) forms an upper fin element of the second fin structure 120 over the lower fin element 103.

Figures 1, 2E:
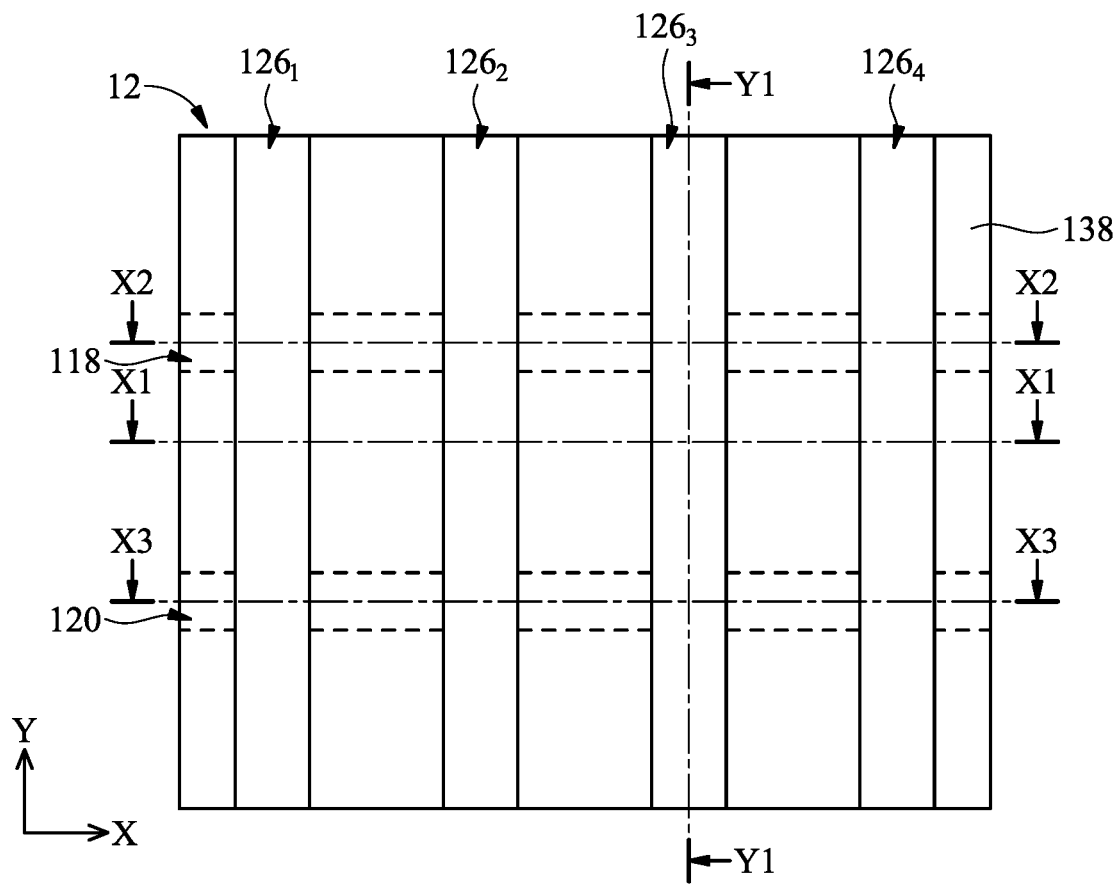
Figures 2, 2E:
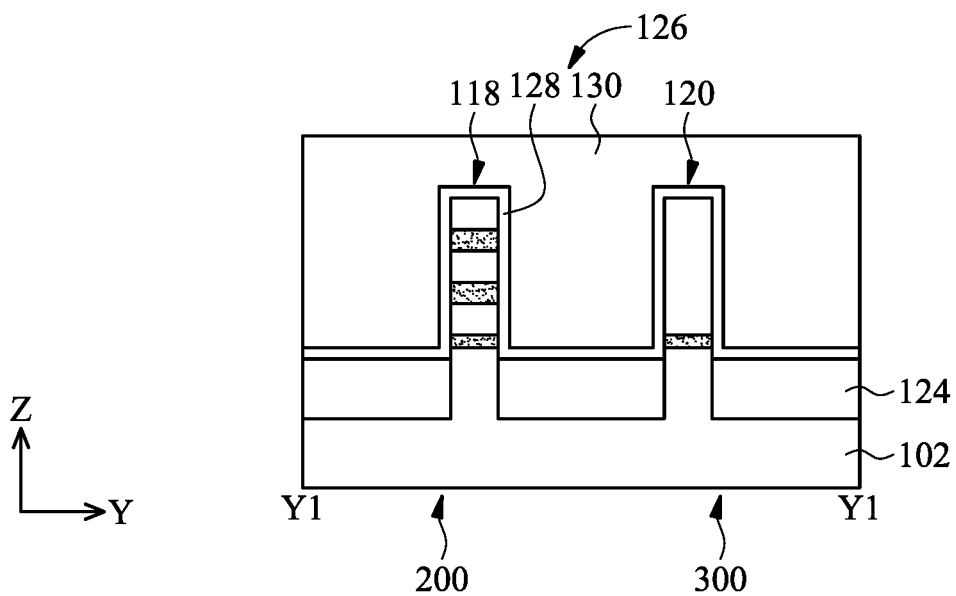

FIG. 2E-1 is a top view of a semiconductor structure 12 after the formation of an isolation structure 124, a plurality of dummy gate structures 126, source/drain features 134 and 136, and an interlayer dielectric (ILD) layer 138, in accordance with some embodiments. FIGS. 2E-2, 2E-3, 2E-4 and 2E-5 are cross-sectional views taken along line Y1-Y1, line X1-X1, line X2-X2 and line X3-X3 in FIG. 2E-1. The top view of FIG. 2E-1 merely illustrate the fin structures 118 and 120, dummy gate structures 126 and interlayer dielectric layer 138 for illustrative purpose, and other features may be illustrated in the cross-sectional views of FIGS. 2E-2 to 2E-5.

Figures 2, 2E, 3:
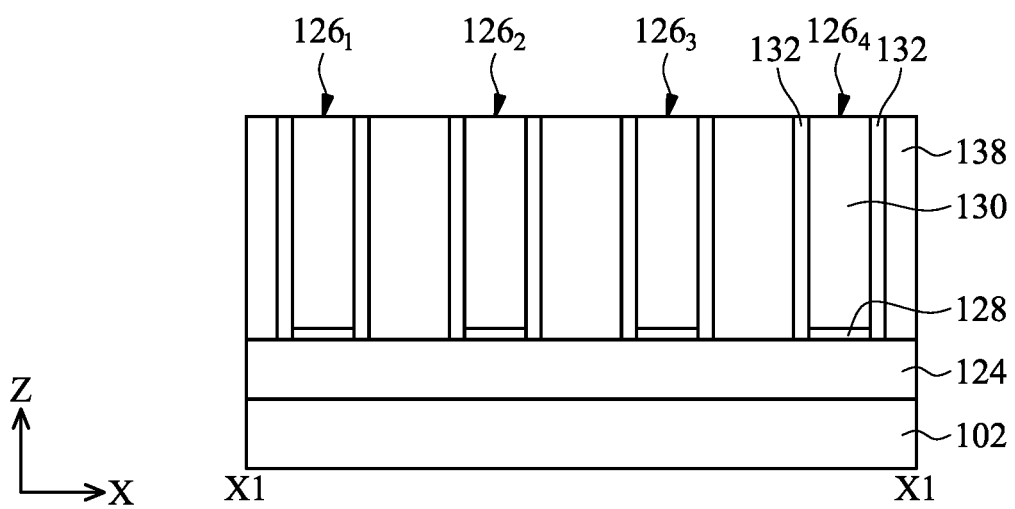

An isolation structure 124 is formed over the substrate 102 and surrounds the lower fin element 103 of the first fin structure 118 and the lower fin element 103 of the second fin structure 120, as shown in FIGS. 2E-2 and 2E-3, in accordance with some embodiments. The isolation structures 124 is configured to electrically isolate the active regions (e.g., the first fin structure 118 and the second fin structure 120) and is also referred to as shallow trench isolation (STI) feature, in accordance with some embodiments.

In some embodiments, the isolation structure 124 is made of an insulating material such as silicon oxide, silicon nitride, silicon oxynitride (SiON), another suitable insulating material, multilayers thereof, and/or a combination thereof. In some embodiments, the formation of the isolation structure 124 includes depositing an one or more insulating materials for the isolation structure 124 over the semiconductor structure 12 to fill the trenches 122 (FIG. 2D-2), and planarizing the insulating material to remove portions of the insulating material above the upper surfaces of the fin structures 118 and 120. In some embodiments, the deposition process includes CVD (such as LPCVD, plasma enhanced CVD (PECVD), high density plasma CVD (HDP-CVD), high aspect ratio process (HARP), flowable CVD (FCVD)), atomic layer deposition (ALD), another suitable technique, and/or a combination. The planarization may be CMP.

Afterward, the insulating material is recessed using an etching process to form the isolation structure 124 and expose portions of the sidewalls of the fin structures 118 and 120. A recessing depth may be controlled (e.g., by controlling an etching time) so as to result in a desired height of the exposed portion of the fin structures 118 and 120. In some embodiments, the first semiconductor layers 104 of the first fin structure 118 and the first semiconductor layer 104 of the second fin structure 120 are exposed from the isolation structure 124.

A plurality of dummy gate structures 126 is formed over the semiconductor structure 12, as shown in FIGS. 2E-1 to 2E-5, in accordance with some embodiments. In some embodiments, the plurality of dummy gate structures 126 includes dummy gate structures $126_1$, $126_2$, $126_3$ and $126_4$. In some embodiments, the dummy gate structures 126 extend in Y direction and are arranged substantially parallel with one another along X direction. That is, the dummy gate structures 126 have longitudinal axes parallel to Y direction, in accordance with some embodiments. The dummy gate structures 126 extend across and wrap the channel regions of the fin structures 118 and 120, in accordance with some embodiments.

The dummy gate structures 126 each includes a dummy gate dielectric layer 128 and a dummy gate electrode layer 130 formed over the dummy gate dielectric layer 128, as shown in FIGS. 2E-2 to 2E-5, in accordance with some embodiments. In some embodiments, the dummy gate dielectric layers 128 are made of one or more dielectric materials, such as silicon oxide (SiO), silicon nitride (SiN), silicon oxynitride (SiON), $HfO_2$, HfZrO, HfSiO, HfTiO, HfAlO, and/or a combination thereof. In some embodiments, the dielectric material is formed using ALD, CVD, thermal oxidation, physical vapor deposition (PVD), another suitable technique, and/or a combination thereof. In some embodiments, the dummy gate electrode layers 130 are made of a conductive material, such as polysilicon, polysilicon germanium, and/or a combination thereof. In some embodiments, the conductive material is formed using CVD, another suitable technique, and/or a combination thereof.

In some embodiments, the formation of the dummy gate structures 126 includes conformally depositing a dielectric material for the dummy gate dielectric layer 128 over the semiconductor structure 12, depositing a conductive material for the dummy gate electrode layer 130 over the dielectric material, planarizing the conductive material, and patterning the conductive material and dielectric material into the dummy gate structures 126. The patterning process may include forming etching masks (not shown) over the conductive material to cover the channel regions of the fin structures 118 and 120. The conductive material and dielectric material, uncovered by the etching masks, may be etched away to expose the source/drain region of the fin structures 118 and 120.

Gate spacer layers 132 are formed along and cover opposite sidewalls of the dummy gate structures 126, as shown in FIGS. 2E-3 to 2E-5, in accordance with some embodiments. The gate spacer layers 132 are configured to offset the subsequently formed source/drain features and separate the source/drain features from the gate structure.

In some embodiments, the gate spacer layers 132 are made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), and/or a combination thereof. In some embodiments, the formation of the gate spacer layers 132 includes conformally depositing a dielectric material for the gate spacer layers 132 over the semiconductor structure 12 followed by an anisotropic etching process such as dry etching. The etching process is performed to remove horizontal portions of the dielectric material for the gate spacer layers 132, while leaving vertical portions of the dielectric material on sidewalls of the dummy gate structure 126 to act as the gate spacer layers 132.

Source/drain features 134 are formed over the first fin structure 118, and source/drain features 136 are formed over the second fin structures 120, as shown in FIGS. 2E-4 and 2E-5, in accordance with some embodiments. The source/drain features 134 and 136 are formed on opposite sides of the dummy gate structure 126, in accordance with some embodiments.

The formation of the source/drain features 134 and 136 includes recessing the fin structures 118 and 120 to form source/drain recesses (not shown) at the source/drain regions, in accordance with some embodiments. A recessing depth may be dependent on a desired height of the source/drain features 134 and 136 for performance consideration. Afterward, one or more semiconductor material for the source/drain features 134 and 136 are grown on the fin structures 118 and 120 from the source/drain recesses using epitaxial growth processes, in accordance with some embodiments. The epitaxial growth process may be MBE, MOCVD, or VPE, another suitable technique, or a combination thereof.

In some embodiments, the source/drain features 134 and 136 are made of any suitable material for n-type semiconductor devices and p-type semiconductor devices, such as Ge, Si, GaAs, AlGaAs, SiGe, GaAsP, SiP, SiC, SiCP, or a combination thereof. In some embodiments, the source/drain features 134 and 136 are doped in-situ during the epitaxial growth process. For example, the source/drain features 134 and 136 may be the epitaxially grown SiGe doped with boron (B). For example, the source/drain features 134 and 136 may be the epitaxially grown Si doped with carbon to form silicon:carbon (Si:C) source/drain features, phosphorous to form silicon:phosphor (Si:P) source/drain features, or both carbon and phosphorous to form silicon carbon phosphor (SiCP) source/drain features. In some embodiments, the growth of the source/drain features 134 and the growth of the source/drain features 136 are performed in different steps.

An interlayer dielectric layer 138 is formed over the semiconductor structure 12, as shown in FIGS. 2E-1 and 2E-3 to 2E-5, in accordance with some embodiments. The interlayer dielectric layer 138 fills the space between dummy gate structures 126 to cover the source/drain features 134 and 136, in accordance with some embodiments.

In some embodiments, the interlayer dielectric layer 138 is made of a dielectric material, such as un-doped silicate glass (USG), or doped silicon oxide such as borophosphosilicate glass (BPSG), fluoride-doped silicate glass (FSG), phosphosilicate glass (PSG), borosilicate glass (BSG), and/or another suitable dielectric material. In some embodiments, a dielectric material for the interlayer dielectric layer 138 is deposited using such as CVD (such as HDP-CVD, PECVD, or HARP), another suitable technique, and/or a combination thereof. Afterward, the dielectric materials for the interlayer dielectric layer 138 above the upper surfaces of the dummy gate electrode layers 130 are removed using such as CMP until the upper surfaces of the dummy gate structures 126 are exposed. In some embodiments, the upper surface of the interlayer dielectric layer 138 is substantially coplanar with the upper surfaces of the dummy gate electrode layers 130.

Figures 2, 2E, 3, 4:
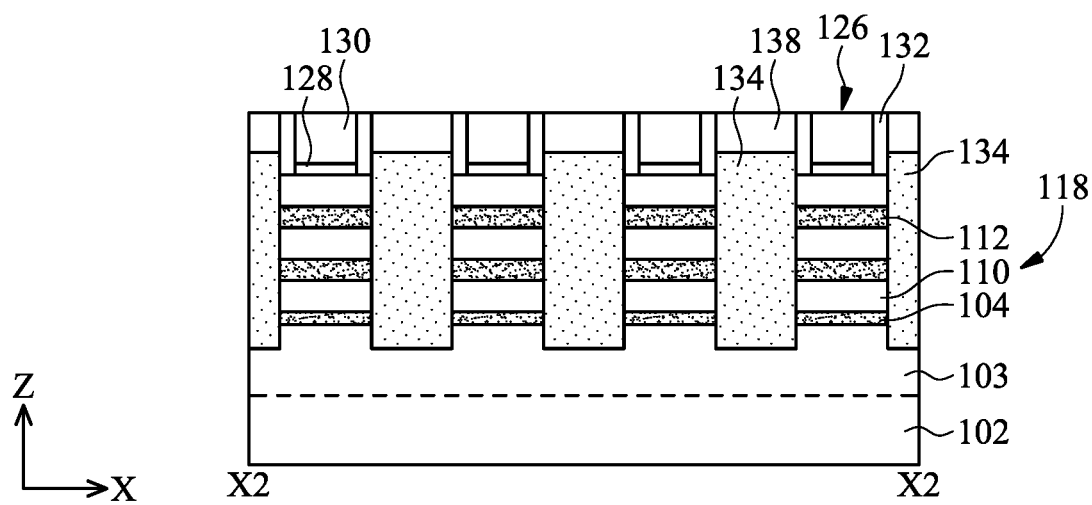
Figures 2, 2E, 3, 4, 5:
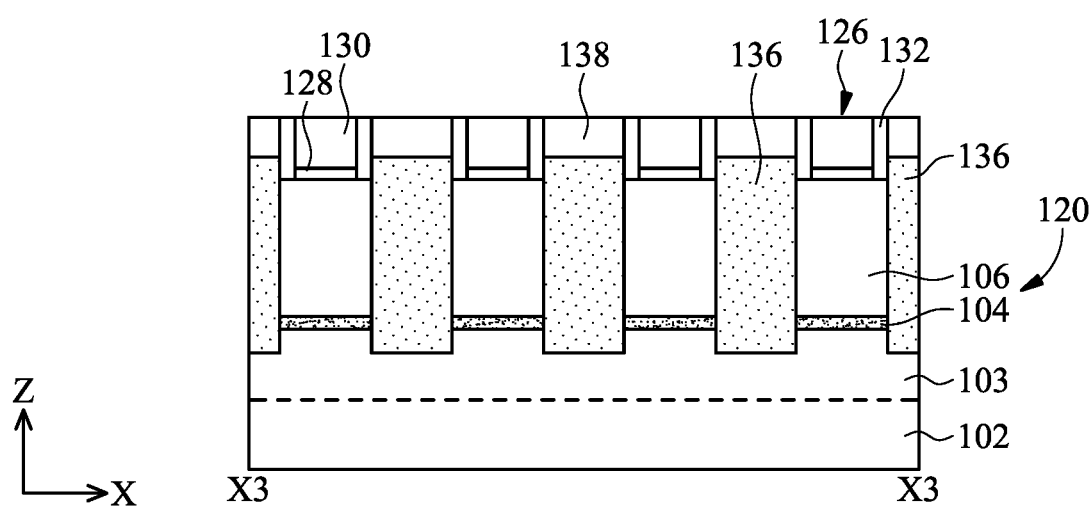
Figures 1, 2F:
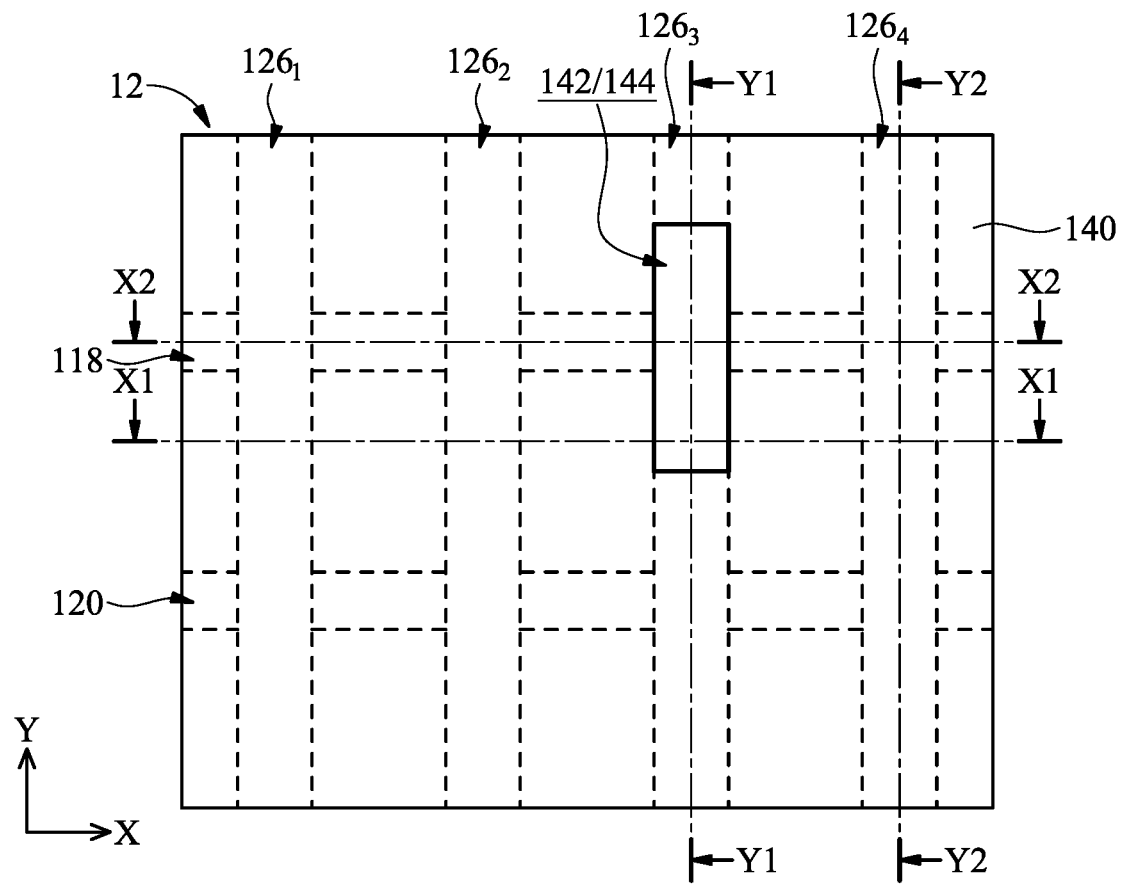
Figures 2, 2F:
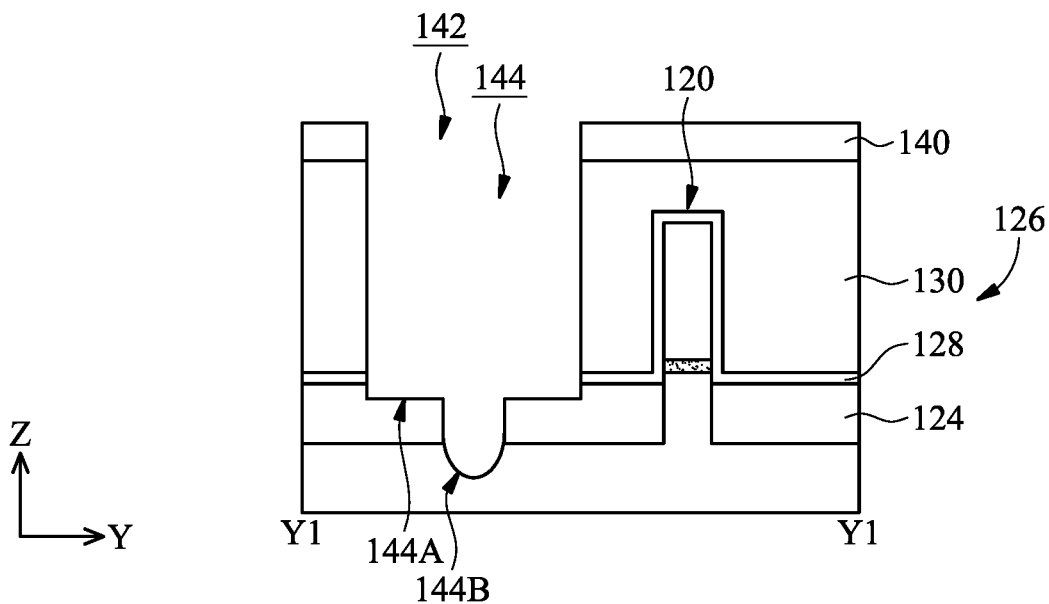
Figures 2, 2F, 3:
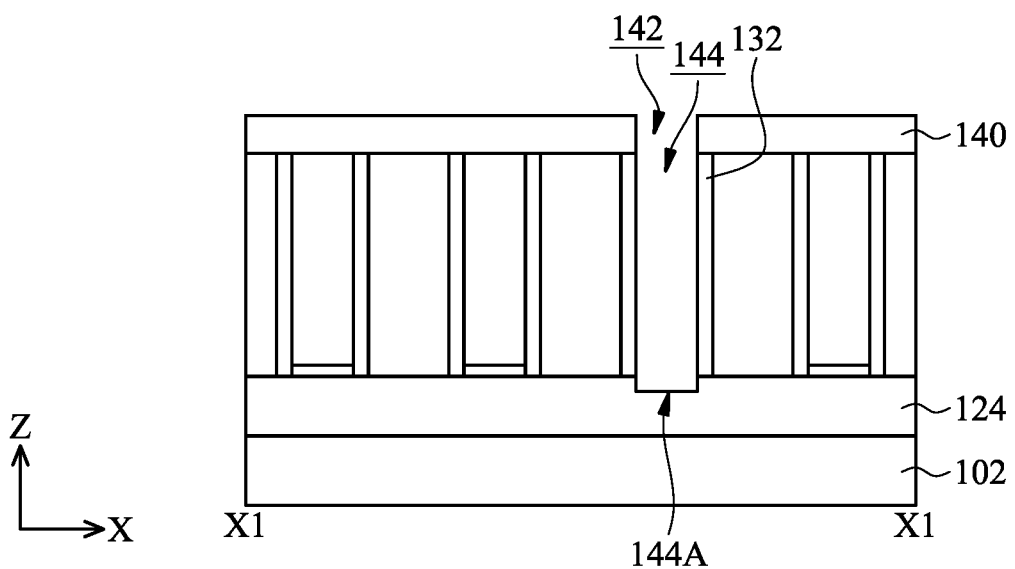
Figures 2, 2F, 3, 4:
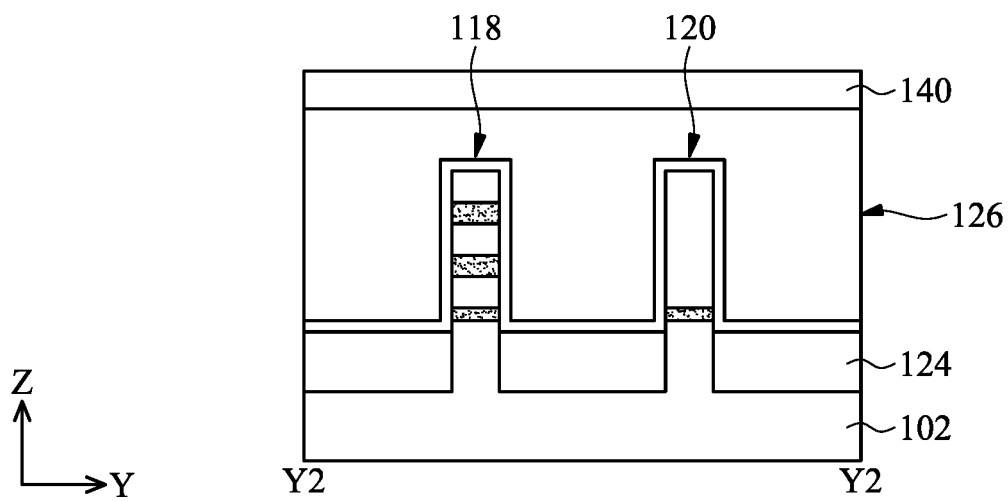
Figures 2, 2F, 3, 4, 5:
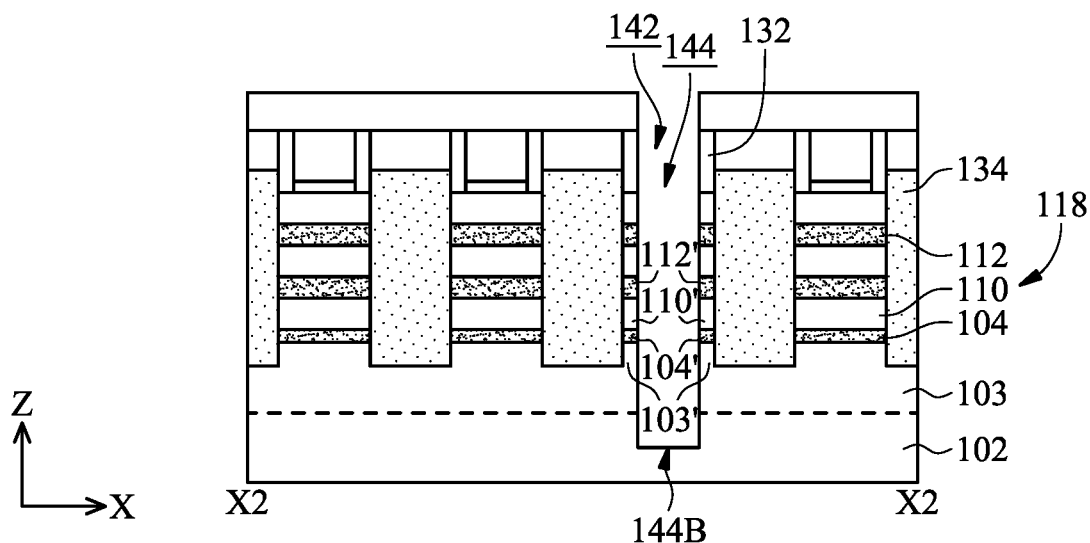

FIG. 2F-1 is a top view of a semiconductor structure 12 after the formation of a cut trench 144, in accordance with some embodiments. FIGS. 2F-2, 2F-3, 2F-4 and 2F-5 are cross-sectional views taken along line Y1-Y1, line X1-X1, line Y2-Y2 and line X2-X2 in FIG. 2F-1.

A cut trench 144 is formed through the dummy gate structure $126_3$ and the first fin structure 118, as shown in FIGS. 2F-1 to 2F-3 and 2F-5, in accordance with some embodiments. The cut trench 144 may be also referred to cut polysilicon on oxide definition edge (CPODE) pattern. The cut trench 144 corresponds to a cross point of the dummy gate structure $126_3$ and the first fin structure 118 so as to cut the dummy gate structure $126_3$ into two segments (or referred to as sub-gate structures) and the first fin structure 118 into two segments (or referred to as sub-active regions), in accordance with some embodiments. The cut trench 144 extends in Y direction, in accordance with some embodiments. That is, the cut trench 144 has a longitudinal axis parallel to Y direction, in accordance with some embodiments.

In some embodiments, the formation of the cut trench 144 includes forming a patterned mask layer 140 over the semiconductor structure 12. In some embodiments, the patterned mask layer 140 has an opening 142 corresponding to the cut trench 144. Afterword, an etching process is performed to removes portions of the dummy gate structure $126_3$ and the first fin structure 118 uncovered by the patterned mask layer 140 to form cut trench 144. The etching process will be described in detail later with respect to FIGS. 4A-4D.

The etching process removes the dummy gate structure $126_3$ and the first fin structure 118, such that the gate spacer layers 132 are exposed from the cut trench 144, as shown in FIG. 2F-3, in accordance with some embodiments. After the dummy gate structure $126_3$ and the first fin structure 118 are removed, the cut trench 144 extends into the isolation structure 124 and the substrate 102. Because of the difference in etching selectivity between the isolation structure 124 and the substrate 102, the cut trench 144 has a first bottom surface 144A exposing the isolation structure 124 (as shown in FIGS. 2F-2 and 2F-3) and a second bottom surface 144B exposing the substrate 102 (as shown in FIGS. 2F-2 and 2F-5), which is at a deeper position than the first bottom surface 144A, in accordance with some embodiments.

Portions of the first fin structure 118 adjacent to the cut trench 144 are covered by the gate spacer layers 132 during the etching process and therefore remain unetched, as shown in FIG. 2F-5, in accordance with some embodiments. The respective unetched portions of the third semiconductor layer 110, the fourth semiconductor layer 112, the first semiconductor layer 104 and the low fin element 103 of the first fin structure 118 are denoted as a third semiconductor layer 110', a fourth semiconductor layer 112', a first semiconductor layer 104' and a low fin element 103' respectively, which collectively form a semiconductor stack adjacent to the cut trench 144, as shown in FIG. 2F-5, in accordance with some embodiments.

Figures 1, 2G:
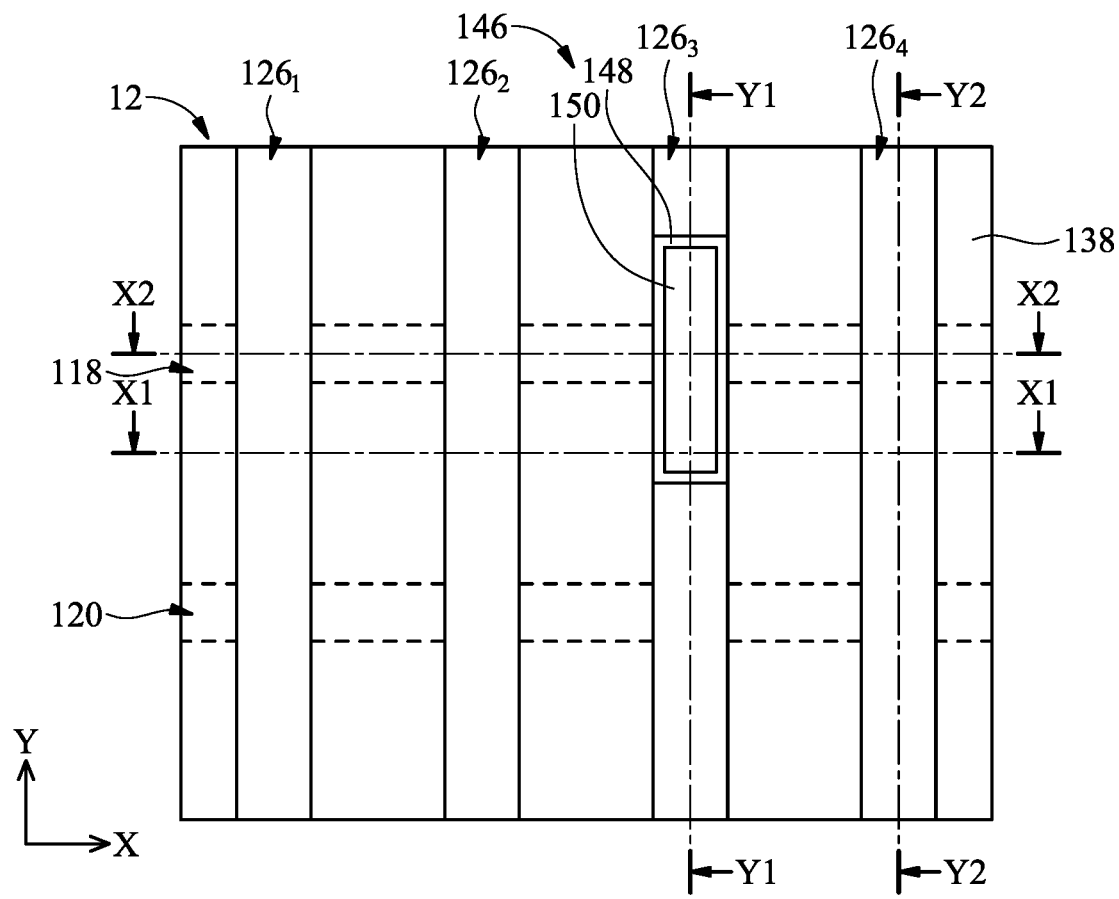
Figures 2, 2G:
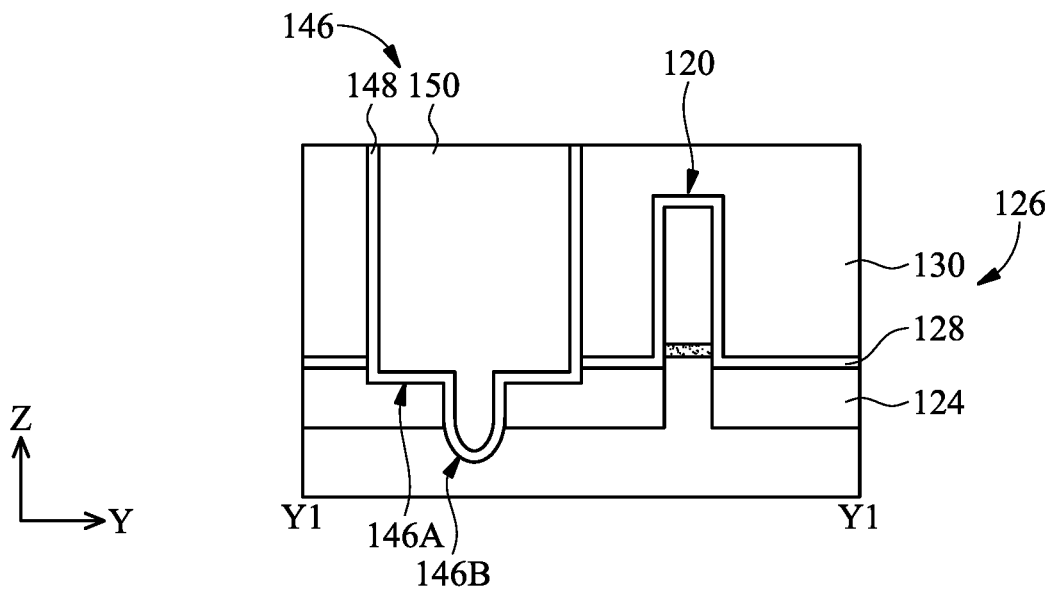
Figures 2, 2G, 3:
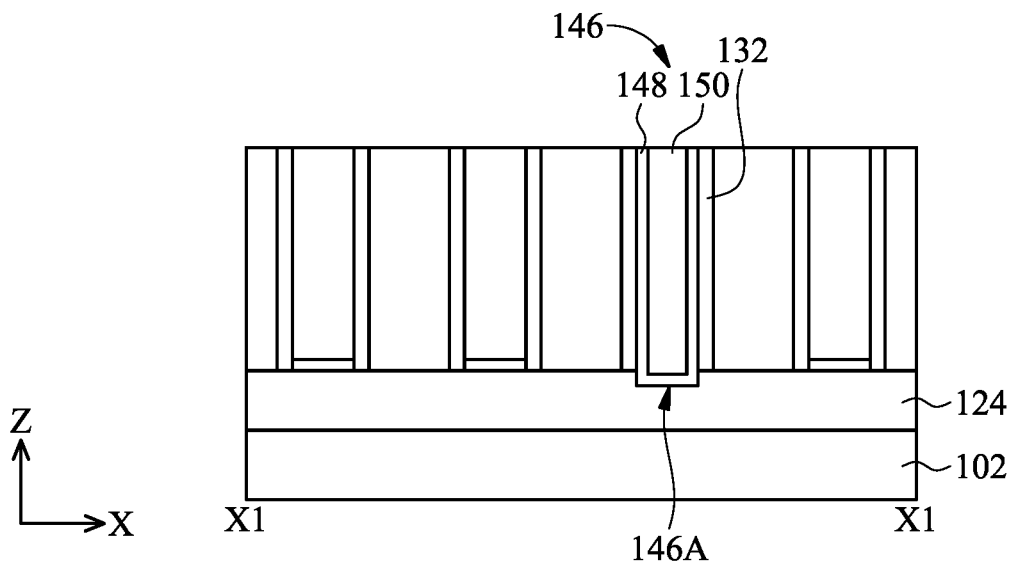
Figures 2, 2G, 3, 4:
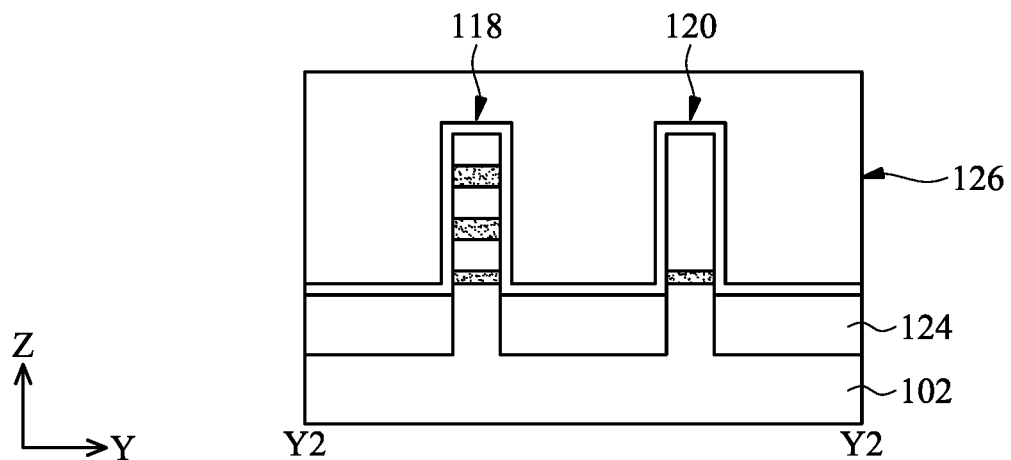
Figures 2, 2G, 3, 4, 5:
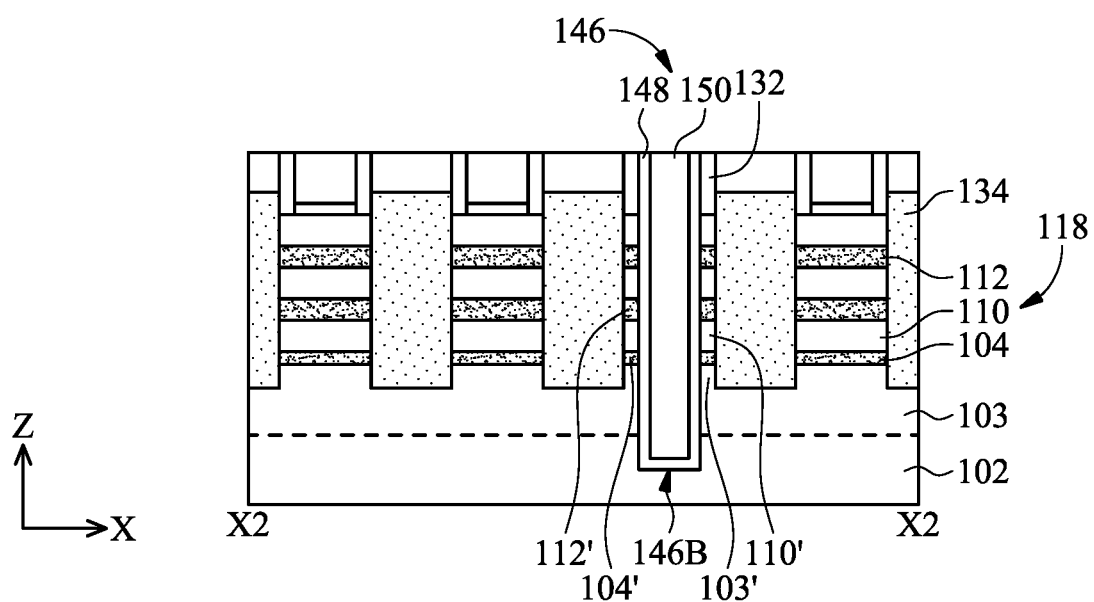

FIG. 2G-1 is a top view of a semiconductor structure 12 after the formation of an isolation feature 146, in accordance with some embodiments. FIGS. 2G-2, 2G-3, 2G-4 and 2G-5 are cross-sectional views taken along line Y1-Y1, line X1-X1, line Y2-Y2 and line X2-X2 in FIG. 2G-1.

An isolation feature 146 is formed in the cut trench 144, as shown in FIGS. 2G-1 to 2G-4 and 2G-5, in accordance with some embodiments. The isolation feature 146 includes a dielectric lining layer 148 and a dielectric fill layer 150 over the dielectric lining layer 148, in accordance with some embodiments. The isolation feature 146 separates and electrically isolates neighboring segments of the dummy gate structure $126_3$ and neighboring segments of the first fin structure 118, in accordance with some embodiments.

In some embodiments, the dielectric lining layer 148 is made of a dielectric material such as silicon oxide, and the dielectric fill layer 150 is made of a dielectric material such as silicon nitride, silicon oxynitride, silicon oxycarbonitride, silicon carbonitride, silicon oxycarbide, or a combination thereof. The dielectric lining layer 148 functions as a liner as it attaches to the first fin structure 118 better than the dielectric fill layer 150 and isolates the dielectric fill layer 150 from the first fin structure 118 to prevent unintended surface charging or stress resulting from direct contact between the dielectric fill layer 150 and the first fin structure 118. In some embodiments, the dielectric lining layer 148 and the dielectric fill layer 150 are deposited using such as CVD (such as HDP-CVD, PECVD, or HARP), another suitable technique, and/or a combination thereof. Afterward, a planarization process, e.g., CMP, may be performed on the semiconductor structure 12 to removes the dielectric lining layer 148 and the dielectric fill layer 150 over the upper surface of the interlayer dielectric layer 138. The planarization process may also remove the patterned mask layer 140 (FIG. 2F-2). In some embodiments, the upper surface of the isolation feature 146 is substantially coplanar the upper surface of the interlayer dielectric layer 138.

Figures 1, 2H:
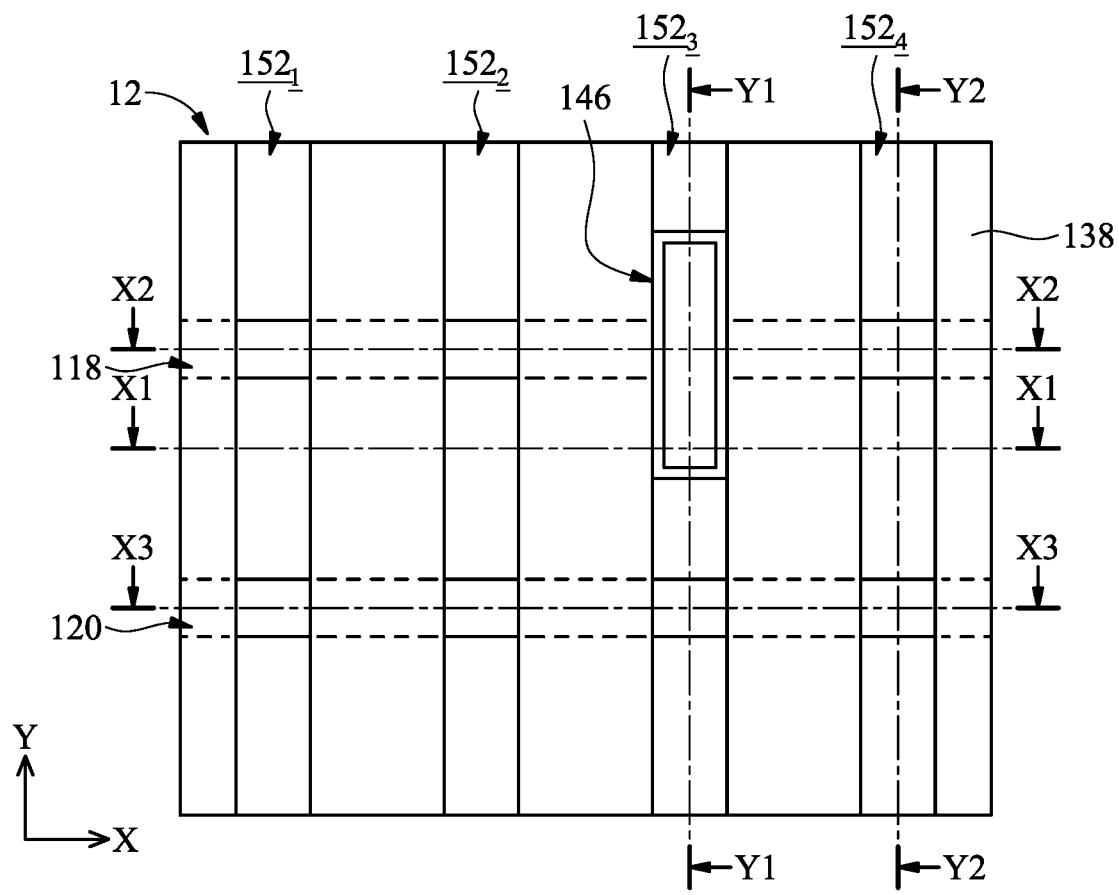
Figures 2, 2H:
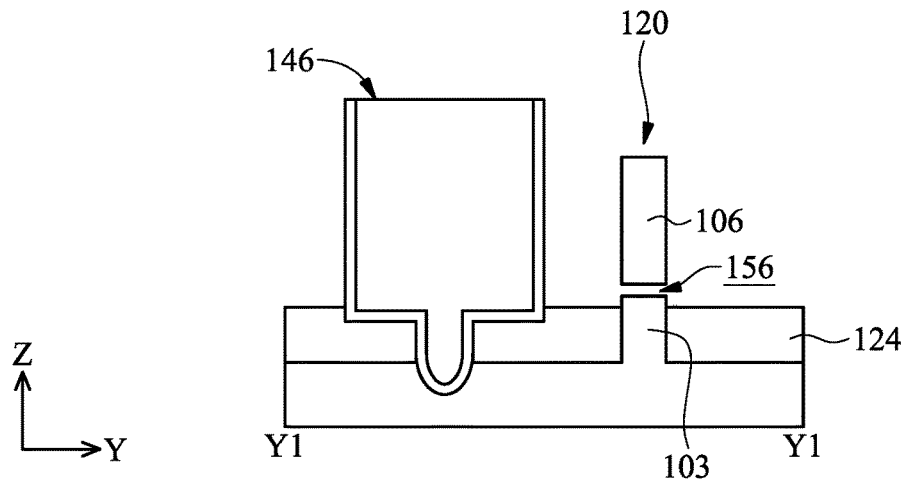
Figures 2, 2H, 3:
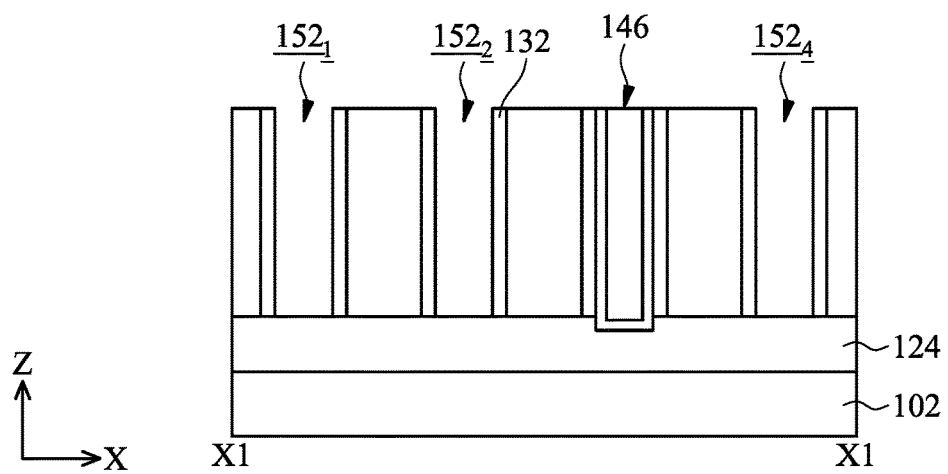
Figures 2, 2H, 3, 4:
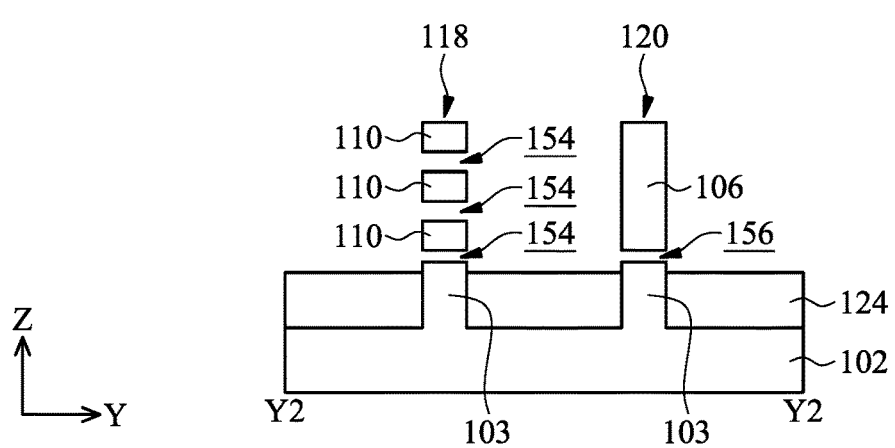
Figures 2, 2H, 3, 4, 5:
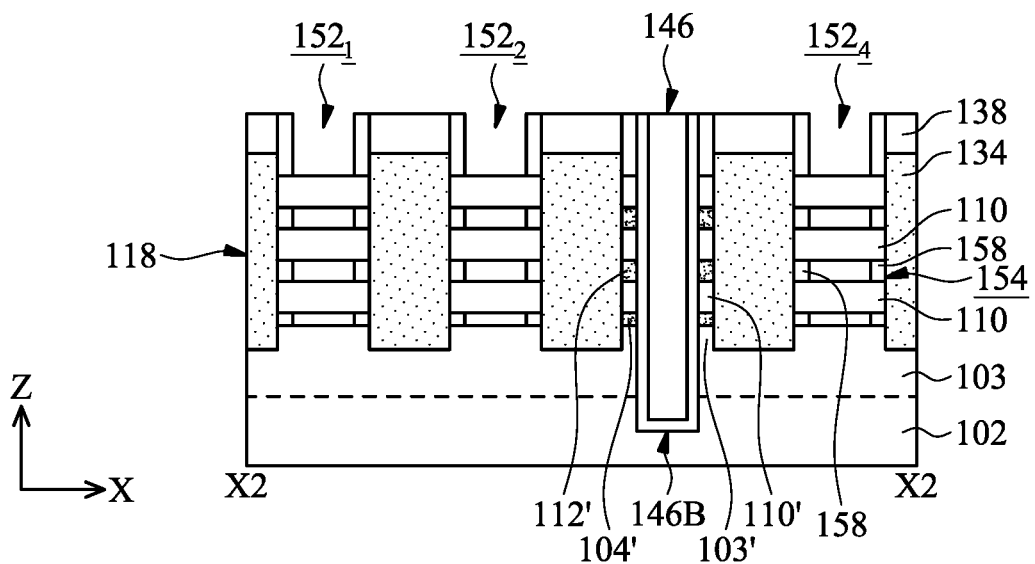

FIG. 2H-1 is a top view of a semiconductor structure 12 after a channel releasing process, in accordance with some embodiments. FIGS. 2G-2, 2G-3, 2G-4, 2G-5 and 2G-6 are cross-sectional views taken along line Y1-Y1, line X1-X1, line Y2-Y2, line X2-X2 and line X3-X3 in FIG. 2H-1.

A channel releasing process is performed on the semiconductor structure 12, in accordance with some embodiments. The dummy gate structures 126 are first removed using an etching process to form a plurality of gate trenches 152, as shown in FIGS. 2H-1 to 2H-5, in accordance with some embodiments. The plurality of gate trenches 152 includes gate trenches $152_1$, $152_2$, $152_3$ and $152_4$, in accordance with some embodiments. The gate trenches 152 expose the channel regions of the fin structures 118 and 120, in accordance with some embodiments. In some embodiments, the gate trenches 152 expose the inner sidewalls of the gate spacer layers 132 facing the channel regions, as shown in FIGS. 2H-3, 2H-5 and 2H-6, in accordance with some embodiments. In some embodiments, the gate trenches 152 expose the sidewalls of the isolation feature 146, as shown in FIGS. 2H-1 and 2H-2, in accordance with some embodiments.

In some embodiments, the etching process includes one or more etching processes. For example, when the dummy gate electrode layers 130 are made of polysilicon, a wet etchant such as a tetramethylammonium hydroxide (TMAH) solution may be used to selectively remove the dummy gate electrode layers 130. For example, the dummy gate dielectric layers 128 may be thereafter removed using a plasma dry etching, a dry chemical etching, and/or a wet etching.

The channel releasing process also includes removing the first semiconductor layer 104 and the fourth semiconductor layers 112 using an etching, in accordance with some embodiments. The first semiconductor layer 104 and the fourth semiconductor layers 112 of the first fin structure 118 are removed to form gaps 154, as shown in FIGS. 2H-4 to 2H-5, in accordance with some embodiments. The first semiconductor layer 104 of the second fin structure 120 is removed to form gaps 156, in accordance with some embodiments.

The gaps 154 are formed between the neighboring third semiconductor layers 110 and between the lowermost third semiconductor layer 110 and the lower fin element 103, in accordance with some embodiments. After the etching process, the four main surfaces of the third semiconductor layers 110 are exposed, as shown in FIG. 2H-4, in accordance with some embodiments. The exposed third semiconductor layers 110 form nanostructures that function as channel layers of the resulting semiconductor device s (e.g., gate-all-around FETs), in accordance with some embodiments. As the term is used herein, "nanostructures" refers to semiconductor layers that have cylindrical shape, bar shaped and/or sheet shape. The nanostructures (e.g., nanowire or nanosheet structures) laterally extend between source/drain features 134, in accordance with some embodiments.

The gaps 156 are formed between the second semiconductor layer 106 and the lower fin element 103, in accordance with some embodiments. After forming the gap 156, the second semiconductor layer 106 of the second fin structure 120 may also referred to as a floating fin element, which is floating over the lower fin element 103. The floating fin element 106 of the second fin structures 120 functions as a channel layer of the resulting semiconductor devices (e.g., FinFETs), in accordance with some embodiments.

In some embodiments, the upper surface of the uppermost nanostructure 110 is substantially level with the upper surface of the floating fin element 106. In some embodiments, the bottom surface of the lowermost nanostructure 110 is substantially level with the bottom surface of the floating fin element 106.

In some embodiments, the etching process includes a selective wet etching process, such as APM (e.g., ammonia hydroxide-hydrogen peroxide-water mixture) etching process. In some embodiments, the wet etching process uses etchants such as ammonium hydroxide ($NH_4OH$), TMAH, ethylenediamine pyrocatechol (EDP), and/or potassium hydroxide (KOH) solutions.

After the channel releasing process, inner spacer layers 158 are formed in the gaps 154 and 156, as shown in FIGS. 2H-5 and 2H-6, in accordance with some embodiments. The inner spacer layers 158 are formed on the surfaces of the source/drain features 134 and 136 exposed by the gaps 154 and 156, in accordance with some embodiments. The inner spacer layers 158 are aligned below the gate spacer layer 132, in accordance with some embodiments. The inner spacer layers 158, formed between the source/drain features 134 and 136 and a subsequently formed final gate stack, are configured to reduce the parasitic capacitance between the final gate stack and the source/drain features (i.e. Cgs and Cgd), in accordance with some embodiments.

In some embodiments, the inner spacer layers 158 are made of a dielectric material, such as silicon oxycarbide (SiOC), silicon oxide carbonitride (SiOCN), silicon carbon nitride (SiCN), and/or a combination thereof, in accordance with some embodiments. In some embodiments, the inner spacer layers 158 are formed using a deposition process followed by an etching process. In some embodiments, the deposition process includes CVD (such as PECVD or LPCVD), ALD, another suitable technique, and/or a combination thereof. In some embodiments, the etching process includes a plasma dry etching, a dry chemical etching, and/or a wet etching.

Figures 2, 2H, 3, 4, 5, 6:
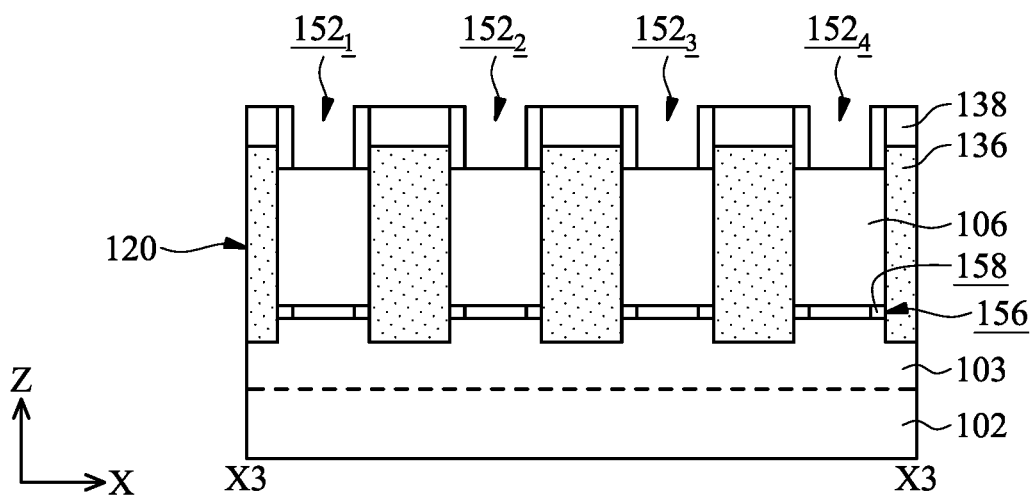
Figures 1, 2I:
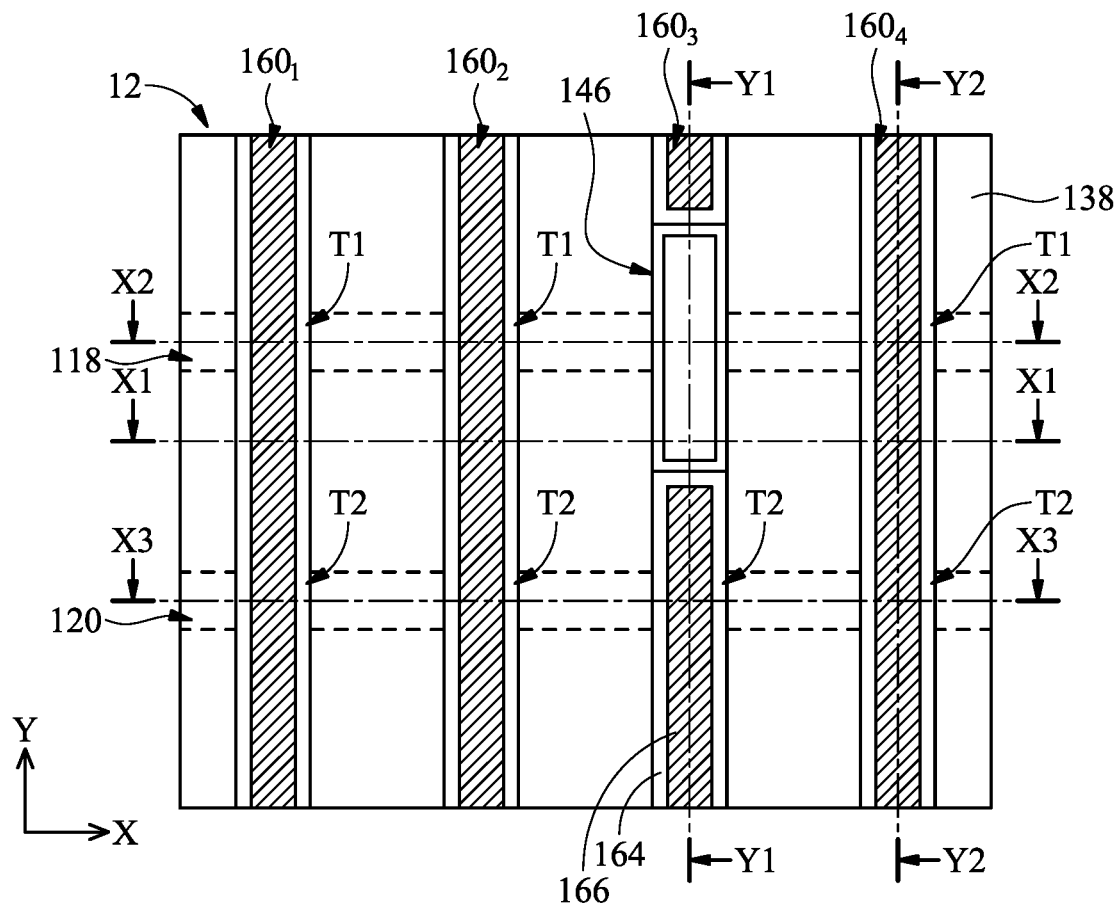
Figures 2, 2I:
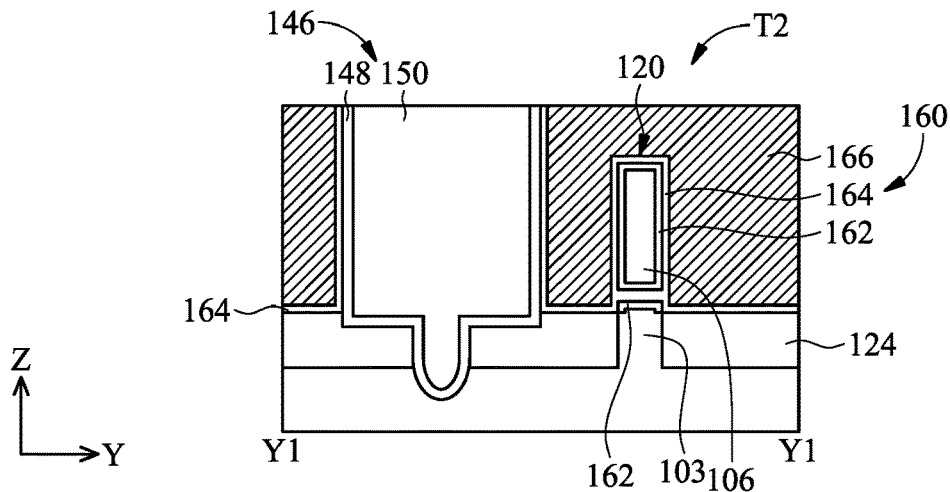
Figures 2, 2I, 3:
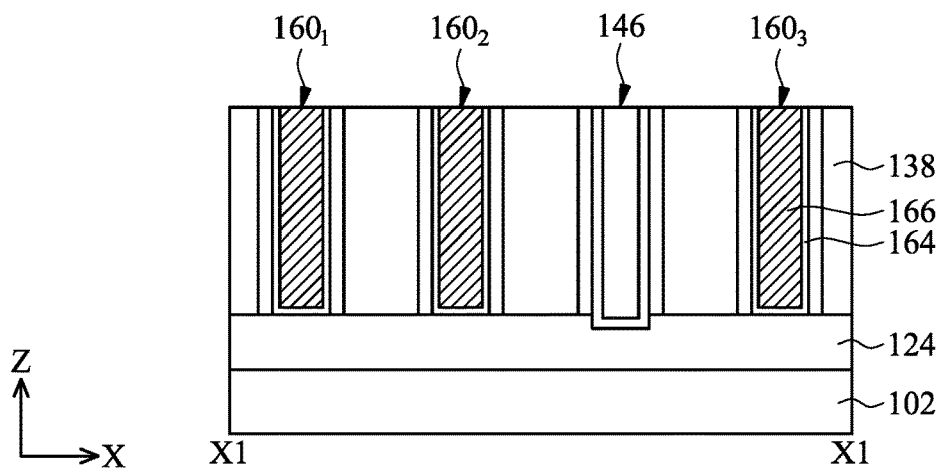
Figures 2, 2I, 3, 4:
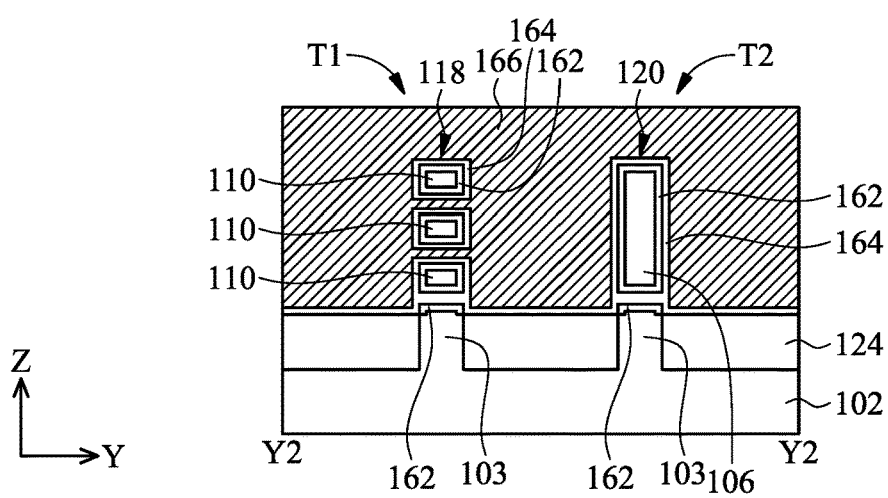
Figures 2, 2I, 3, 4, 5:
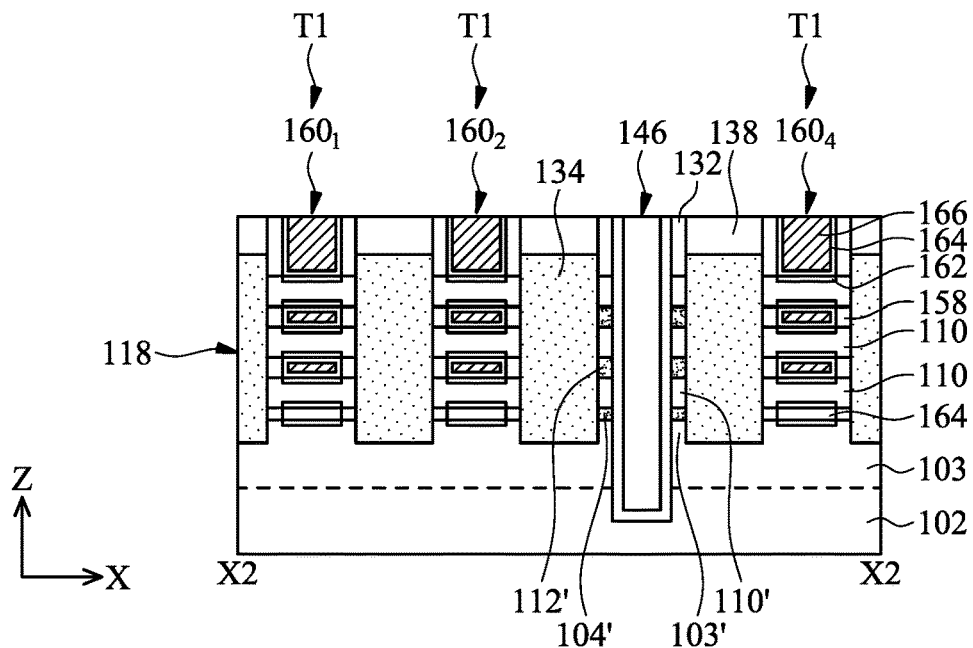
Figures 2, 2I, 3, 4, 5, 6:
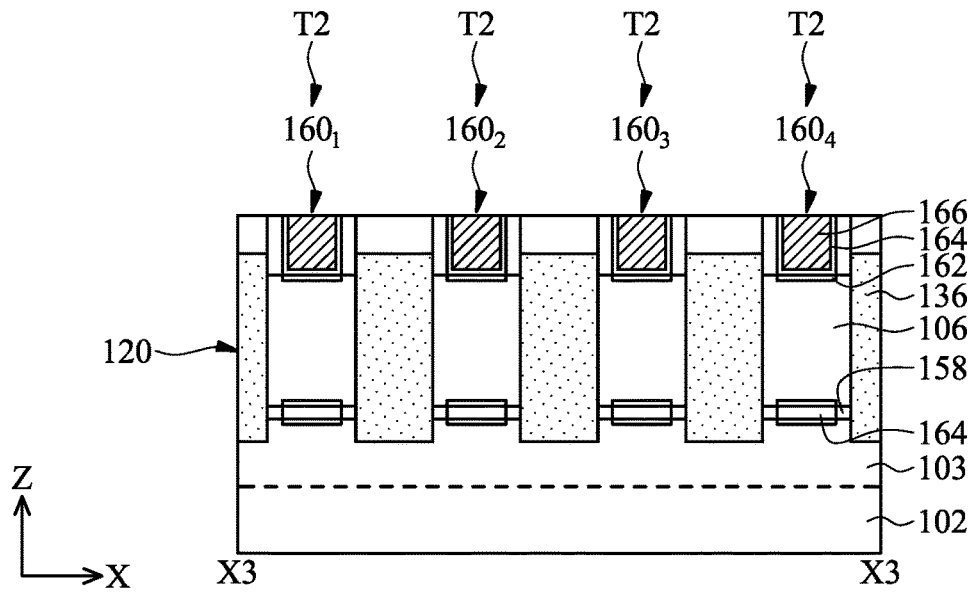

FIG. 2I-1 is a top view of a semiconductor structure 12 after the formation of a plurality of final gate stacks 160, in accordance with some embodiments. FIGS. 2I-2, 2I-3, 2I-4, 2I-5 and 2I-6 are cross-sectional views taken along line Y1-Y1, line X1-X1, line Y2-Y2, line X2-X2 and line X3-X3 in FIG. 2I-1.

A plurality of final gate stacks 160 is formed over the semiconductor structure 12, as shown in FIGS. 2I-1 to 2I-6, in accordance with some embodiments. The plurality of final gate stacks 160 includes final gate stacks $160_1$, $160_2$, $160_3$ and $160_4$, in accordance with some embodiments. The plurality of final gate stacks 160 is formed to fill the gate trenches 152 and the gaps 154 and 156, in accordance with some embodiments. The plurality of final gate stacks 160 extend across the nanostructures 110 of first fin structure 118 and the floating fin element 106 of the second fin structure 120, in accordance with some embodiments.

The final gate stacks $160_1$, $160_2$, $160_3$ and $160_4$ each include an interfacial layer 162, a high-k gate dielectric layer 164 and the metal gate electrode layer 166, as shown in FIGS. 2I-2 to 2I-6, in accordance with some embodiments. The interfacial layers 162 are formed on the exposed surfaces of the nanostructures 110, the floating fin element 106, and the lower fin elements 103, as shown in FIGS. 2I-2 to 2I-6, in accordance with some embodiments. The interfacial layers 162 wrap around the nanostructures 110 and the floating fin element 106, in accordance with some embodiments. In some embodiments, the interfacial layers 162 are made of a chemically formed silicon oxide. In some embodiments, the interfacial layers 162 are formed using one or more cleaning processes such as including ozone ($O_3$), ammonia hydroxide-hydrogen peroxide-water mixture, and/or hydrochloric acid-hydrogen peroxide-water mixture. Therefore, portions of semiconductor material from the nanostructures 110, the floating fin element 106 and the lower fin elements 103 are oxidized to form the interfacial layers 162, in accordance with some embodiments.

The high-k gate dielectric layer 164 is formed conformally along the interfacial layer 162 to wrap around the nanostructures 110 and the floating fin element 106, as shown in FIGS. 2I-2 to 2I-6, in accordance with some embodiments. The high-k gate dielectric layer 164 is also conformally formed along the inner sidewalls of the inner spacer layers 158 facing the channel region and the inner sidewalls of the gate spacer layers 124 facing the channel region, as shown in FIGS. 2I-5 and 2I-6, in accordance with some embodiments. A remainder of the lowermost gap 154 and a remainder of the gap 156 (FIGS. 2H-4 to 2H-6) are substantially filled by the high-k gate dielectric layers 164 while other gaps 154 are partially filled by the high-k gate dielectric layers 164 because the first semiconductor layer 104 is thinner than the fourth semiconductor layer 112, as shown in FIGS. 2I-4 to 2I-6, in accordance with some embodiments. The high-k gate dielectric layer 164 is also conformally formed along the sidewalls of the isolation features 146, as shown in FIGS. 2I-1 and 2I-2, in accordance with some embodiments. The high-k gate dielectric layer 164 is also conformally formed along the upper surface of the isolation structure 124, as shown in FIGS. 2I-2 and 2I-4, in accordance with some embodiments.

In some embodiments, the high-k gate dielectric layers 164 are made of a dielectric material with high dielectric constant (k value), for example, greater than 3.9. In some embodiments, the high-K dielectric material includes hafnium oxide ($HfO_2$), $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfSiO, $(Ba,Sr)TiO_3$ (BST), $Al_2O_3$, $Si_3N_4$, oxynitrides (SiON), a combination thereof, or another suitable material. The high-K gate dielectric layer 164 may be formed by ALD, PVD, CVD, and/or another suitable technique.

The metal gate electrode layer 166 is formed over the high-k gate dielectric layers 164 and fills remainders of gate trenches 152 and the gaps 154, as shown in FIGS. 2I-1 to 2I-6, in accordance with some embodiments. The metal gate electrode layer 166 wraps the nanostructures 110 and the floating fin element 106, in accordance with some embodiments. In some embodiments, the metal gate electrode layer 166 is made of more than one conductive material, such as a metal, metal alloy, conductive metal oxide and/or metal nitride, another suitable conductive material, and/or a combination thereof. The metal gate electrode layer 166 may be a multi-layer structure with various combinations of a diffusion barrier layer, a work function layer with a selected work function to enhance the device performance (e.g., threshold voltage) for n-channel transistor and p-channel transistor, a capping layer to prevent oxidation of a work function layer, a glue layer to adhere the work function layer to a next layer, and a metal fill layer to reduce the resistance of the gate stack, and/or another suitable layer.

The metal gate electrode layer 166 may be made of Ti, Ag, Al, TiAlN, TaC, TaCN, TaSiN, Mn, Zr, TiN, TaN, Ru, Mo, Al, WN, Cu, W, Re, Ir, Co, Ni, another suitable conductive material, or multilayers thereof. The metal gate electrode layer may be formed by ALD, PVD, CVD, e-beam evaporation, or another suitable process. Furthermore, the metal gate electrode layer 166 may be formed separately for N-FET and P-FET which may use different gate electrode materials and/or different work function materials.

A planarization process such as CMP may be performed on the semiconductor structure 12 to remove the materials of the high-k gate dielectric layer 164 and the metal gate electrode layer 166 formed above the upper surface of the interlayer dielectric layer 138, in accordance with some embodiments. After the planarization process, the upper surface of the metal gate electrode layer 166, the upper surface of the isolation feature 146 and the upper surface of the interlayer dielectric layer 138 are substantially coplanar, in accordance with some embodiments.

The interfacial layers 162, the high-k gate dielectric layers 164 and the metal gate electrode layers 166 combine to form the final gate stacks $160_1$, $160_2$, $160_3$ and $160_4$, in accordance with some embodiments. The final gate stacks 160 may engage the channel region (i.e., the nanostructures 110 of the first fin structure 118 and the floating fin element 106 of the second fin structure 120) of the transistors, such that current can flow between the source/drain features 134 and between the source/drain features 136 during operation. In some embodiments, the final gate stacks $160_1$, $160_2$, $160_3$ and $160_4$ extend in Y direction. That is, the final gate stacks $160_1$, $160_2$, $160_3$ and $160_4$ have longitudinal axes parallel to Y direction, in accordance with some embodiments. The final gate stacks 160 are arranged in the X direction. In addition, the final gate stack $160_3$ is separated into two segments (or referred to as sub-gate stacks) by the isolation feature 146, as shown in FIGS. 2I-1 and 2I-2, in accordance with some embodiments.

Portions of the final gate stacks 160 interposing the source/drain features 134 combine with the source/drain features 134 to form gate-all-around FETs Ti, as shown in FIGS. 2I-1 and 2I-5, in accordance with some embodiments. That is, the gate-all-around FETs T1 are formed at cross points of the first fin structures 118 and the final gate stack 160 except for the cross point of first fin structure 118 and the final gate stack $160_3$ where the isolation feature 146 occupies, in accordance with some embodiments. The isolation feature 146 is located between and electrically isolates two gate-all-around FETs T1, as shown in FIGS. 2I-1 and 2I-5, in accordance with some embodiments. In addition, the semiconductor stack including the fourth semiconductor layer 112', the third semiconductor layer 110', the first semiconductor layer 104' and the low fin element 103' is located between the source/drain features 134 of the gate-all-around FETs T1 and the isolation feature 146, as shown in FIG. 2I-5, in accordance with some embodiments.

Portions of the final gate stacks 160 interposing the source/drain features 136 combine with the source/drain features 136 to form FinFETs T2, as shown in FIGS. 2I-1 and 2I-6, in accordance with some embodiments. That is, the FinFETs T2 are formed at cross points of the second fin structure 120 and the final gate stacks 160, in accordance with some embodiments.

Figures 1, 2J:
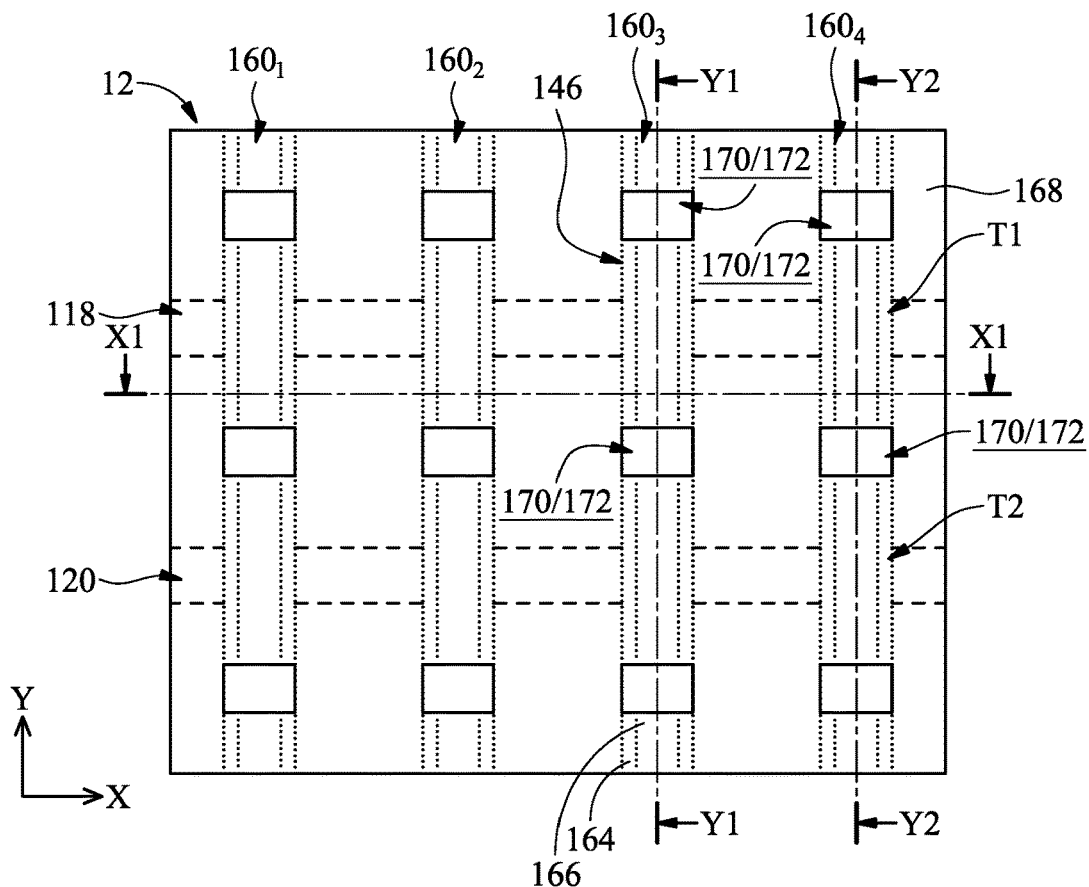
Figures 2, 2J:
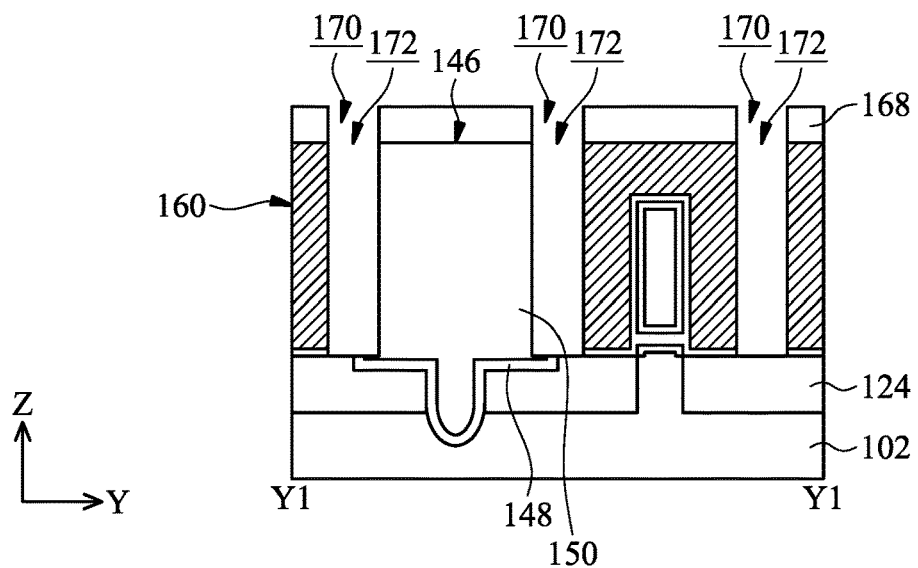
Figures 2, 2J, 3:
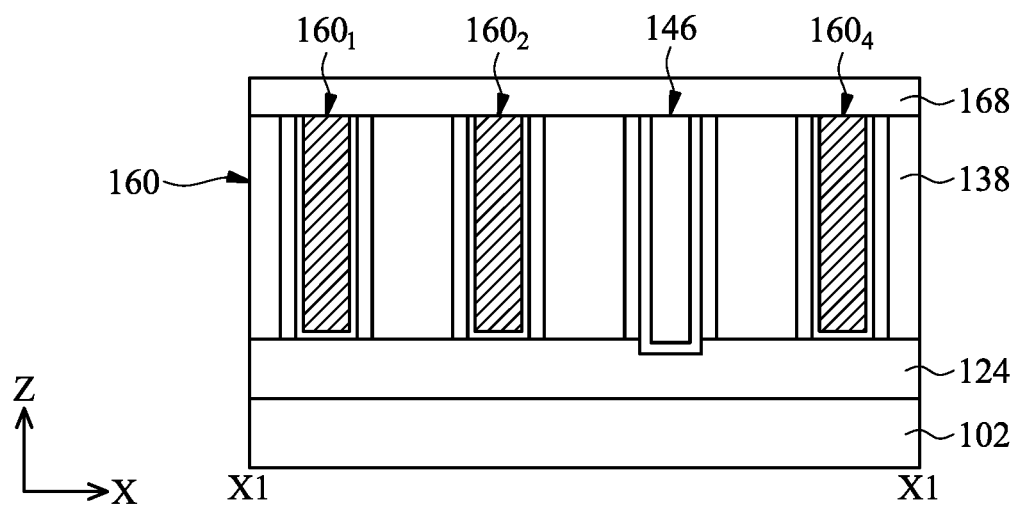
Figures 2, 2J, 3, 4:
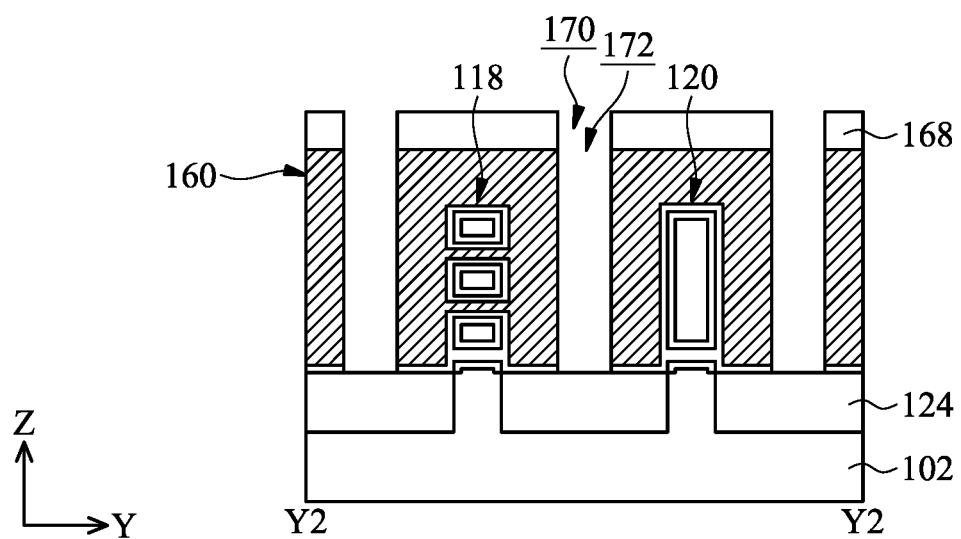

FIG. 2J-1 is a top view of a semiconductor structure 12 after the formation of gate-cut openings 172, in accordance with some embodiments. FIGS. 2J-2, 2J-3 and 2J-4 are cross-sectional views taken along line Y1-Y1, line X1-X1 and line Y2-Y2 in FIG. 2J-1.

A cutting process is performed on the plurality of the final gate stacks 160 to form gate-cut openings 172, as shown in FIGS. 2J-1, 2J-2 and 2J-4, in accordance with some embodiments. The gate-cut openings 172 cut each of the final gate stacks 160 into a plurality of segments, in accordance with some embodiments. The gate-cut openings 172 are formed through the final gate stacks 160 and expose the isolation structure 124, as shown in FIGS. 2J-2 and 2J-4, in accordance with some embodiments. In some embodiments, the gate-cut openings 172 are substantially equal in length along Y direction to each other.

The cutting process includes forming a patterned mask layer 168 over the semiconductor structure 12, as shown in FIGS. 2J-1 to 2J-4, in accordance with some embodiments. In some embodiments, the patterned mask layer 168 has openings 170 which correspond to the gate-cut openings 172 but stagger the fin structures 118 and 120, as shown in FIG. 2J-1. Afterword, an etching process is performed to removes portions of metal gate electrode layer 168 and high-k gate dielectric layers 166 until the isolation structure 124 is exposed, in accordance with some embodiments. The etching process will be described in detail later with respect to FIGS. 5A-5D.

In addition, the openings 170 of the patterned mask layer 168 partially overlap the isolation feature 146 such that two gate-cut openings 172 adjacent to the isolation feature 146 are formed through portions of the isolation feature 146 to remove portions of the dielectric lining layer 148 and the dielectric fill layer 150, as shown in FIG. 2J-2, in accordance with some embodiments.

Figures 1, 2K:
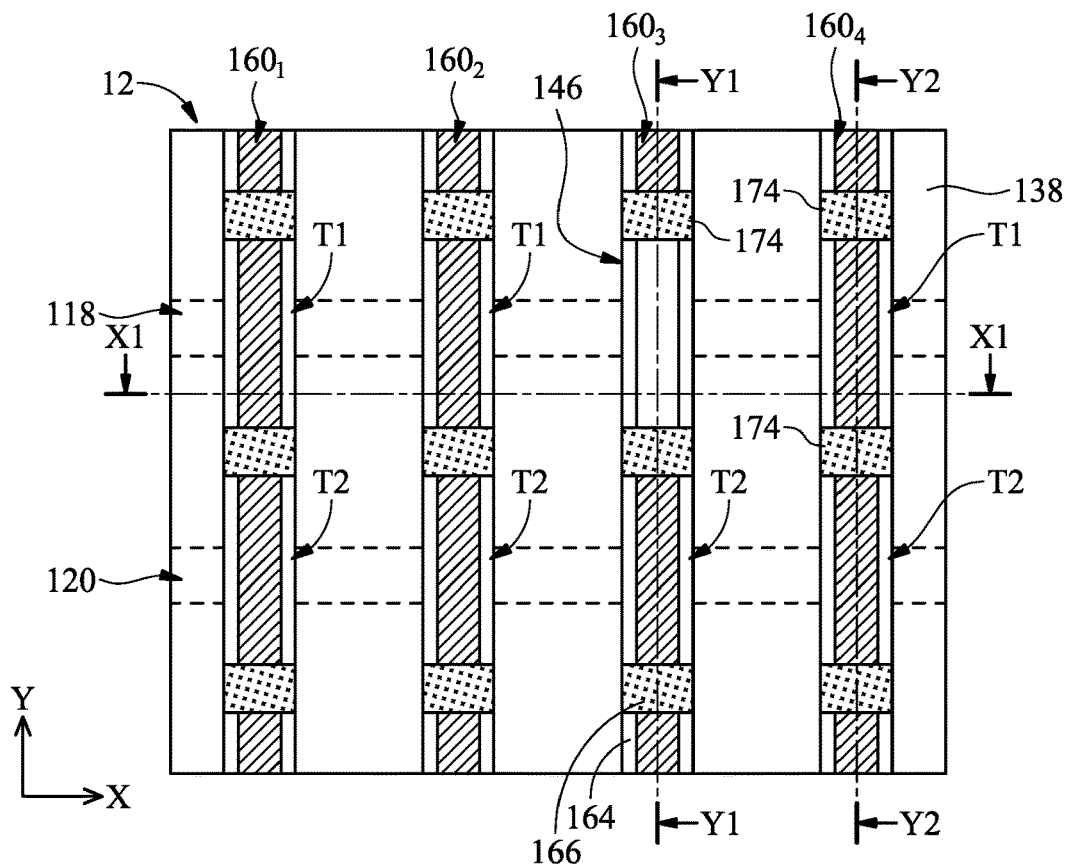
Figures 2, 2K:
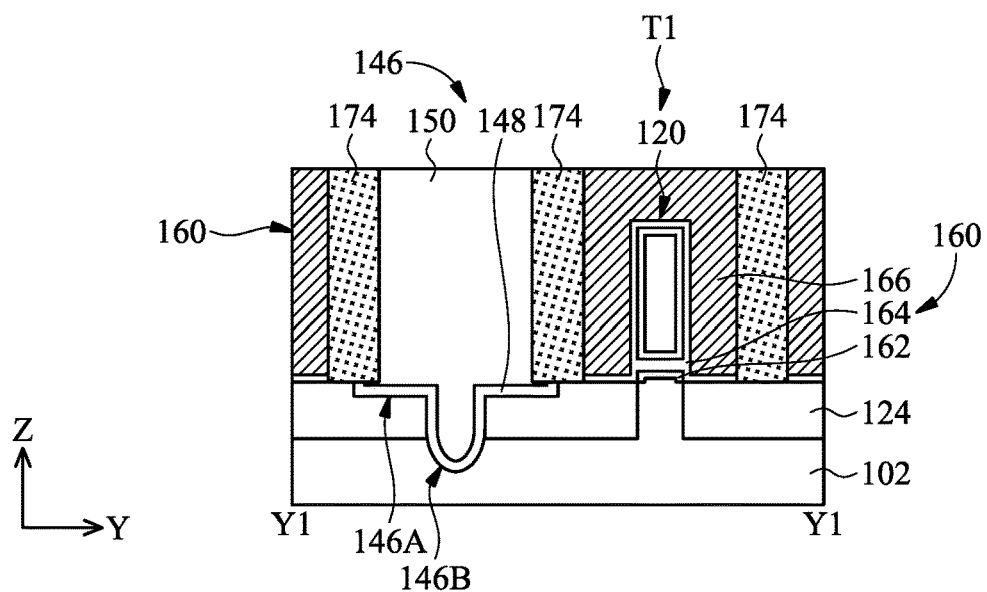
Figures 2, 2K, 3:
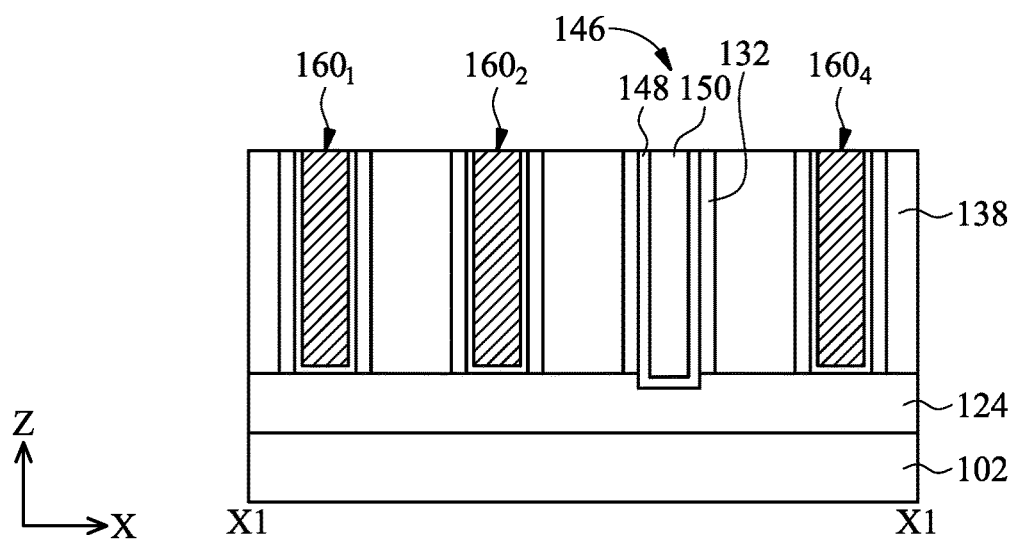
Figures 2, 2K, 3, 4:
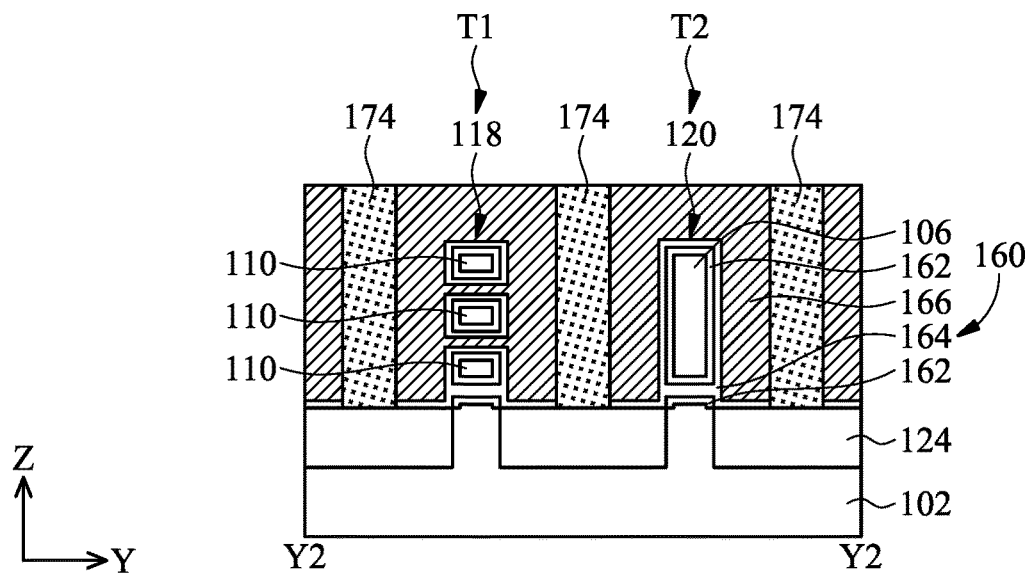
Figure 3:
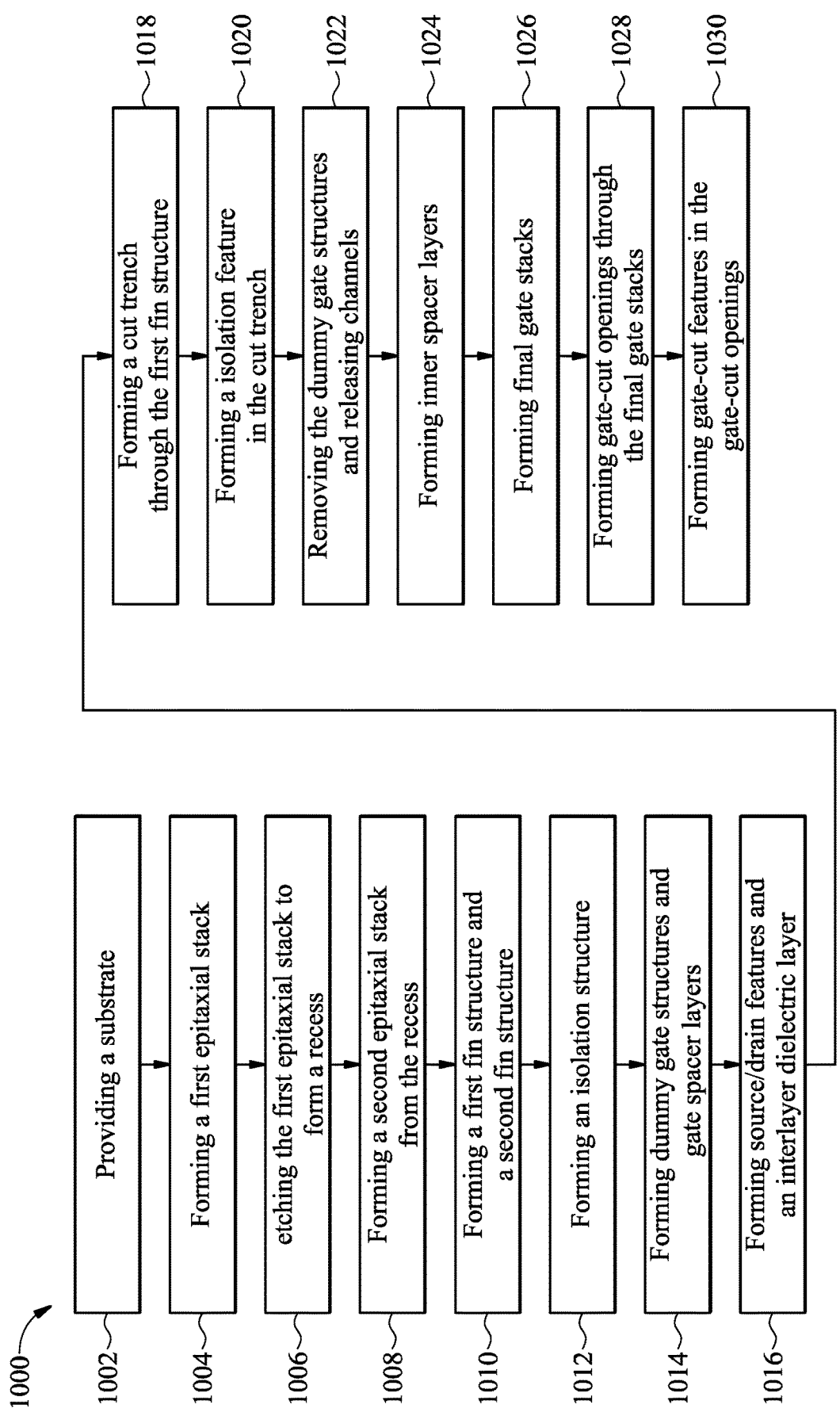

FIG. 2K-1 is a top view of a semiconductor structure 12 after the formation of gate-cut features 174, in accordance with some embodiments. FIGS. 2K-2, 2K-3 and 2K-4 are cross-sectional views taken along line Y1-Y1, line X1-X1 and line Y2-Y2 in FIG. 2K-1.

Gate-cut features 174 are formed in the gate-cut openings 172, as shown in FIGS. 2K-1 to 2K-4, in accordance with some embodiments. The gate-cut features 174 separate and electrically isolate neighboring segments of the final gate stacks 160 such that a gate-all-around FET T1 and neighboring FinFET T2, which have shared the same final gate stack 160, are electrically isolated from one another, in accordance with some embodiments. The gate-cut features 174 adjacent to the isolation feature 146 are in contact with both the dielectric lining layer 148 and the dielectric fill layer 150, as shown in FIGS. 2K-1 and 2K-2, in accordance with some embodiments. The dielectric lining layer 148 extends below the gate-cut features 174, as shown in FIG. 2K-2, in accordance with some embodiments.

In some embodiments, the gate-cut features 174 are made of a dielectric material such as silicon oxide, silicon nitride, silicon oxynitride, another suitable dielectric material, or a combination thereof. In some embodiments, the dielectric material for the gate-cut features 174 is deposited using such as CVD (such as HDP-CVD, PECVD, or HARP), another suitable technique, and/or a combination thereof. Afterward, a planarization process, e.g., CMP, may be performed on the semiconductor structure 12 to removes the dielectric material over the upper surface of the interlayer dielectric layer 138. The planarization process may also remove the patterned mask layer 168. In some embodiments, the upper surfaces of the gate-cut features 174, the upper surfaces of the isolation feature 146, the upper surface of the interlayer dielectric layer 138 and the upper surface of the metal gate electrode layer 166 are substantially coplanar.

The aspect of the embodiments of the present disclosure is direct to a formation method and structures that provide hybrid structures including gate-all-around FETs T1 and FinFETs T2 formed over the same semiconductor substrate. The hybrid structures also includes the isolation feature 146 interposing two neighboring gate-all-around FETs T1, and the gate-cut features 174 interposing a gate-all-around FETs T1 and a neighboring FinFET T2, in accordance with some embodiments.

In some instance in which gate-cut features are formed before the dummy gate structures are replaced with final gate stacks, the fill window for a high-k gate dielectric layer and a metal gate electrode layer between the active regions and the gate-cut features may be too small to form a reliable final gate stack, leading to low yield. In some other instances in which the isolation features are formed after the metal gate structures are formed, it can be difficult to etch through the final gate stacks along with the active regions to form the cut trench for isolation features due to etching selectivity difference between various materials (metals, dielectrics, and semiconductors).

The embodiments of the present disclosure provide a method where the isolation feature is formed before the replacement process of the final gate stacks and the gate-cut features are formed after the formation of the final gate stacks. As a result, the method of the embodiments may reduce the difficulty of the etching process for forming the cut trench and enlarge the fill window of metal gate structures thereby improving device performance and production yield. Therefore, the hybrid structure provided by the embodiments of the present disclosure may allow lower processing difficulty and greater design flexibility for integrated circuits including different type of devices, e.g., logic devices, memory devices, etc.

FIG. 3 is a flowchart of a method 1000 for forming a semiconductor structure, in accordance with some embodiments of the disclosure. The method 1000 is used to form the semiconductor structure 12 as described previously with respect to FIGS. 2A to 2K-4, in accordance with some embodiments.

In operation 1002, a substrate 102 is provided, as shown in FIG. 2A, in accordance with some embodiments. In operation 1004, a first epitaxial stack including a first semiconductor layer 104 and a second semiconductor layer 106 are formed over the substrate 102, as shown in FIG. 2A, in accordance with some embodiments. In operation 1006, the first epitaxial stack is etched to form a recess 108, as shown in FIG. 2B, in accordance with some embodiments. In operation 1008, a second epitaxial stack including third semiconductor layers 110 and fourth semiconductor layers 112 are formed from the recess 108, as shown in FIG. 2C, in accordance with some embodiments.

In operation 1010, a first fin structure 118 and a second fin structure 120 are formed, as shown in FIGS. 2D-1 and 2D-2, in accordance with some embodiments. In operation 1012, an isolation structure 124 are formed to surround lower fin elements 103 of the first fin structure 118 and the second fin structure 120, as shown in FIGS. 2E-1 to 2E-5, in accordance with some embodiments. In operation 1014, dummy gate structures 126 are formed across the first fin structure 118 and the second fin structure 120 and gate spacer layers 132 are formed along the dummy gate structure 126, as shown in FIGS. 2E-1 to 2E-5, in accordance with some embodiments. In operation 1016, source/drain features 134 and 136 are formed over the first fin structure 118 and the second fin structure 120 and an interlayer dielectric layer 138 are formed over the source/drain features 134 and 136, as shown in FIGS. 2E-1 to 2E-5, in accordance with some embodiments.

In operation 1018, a cut trench 144 is formed through the first fin structure 118, as shown in FIGS. 2F-1 to 2F-5, in accordance with some embodiments. In operation 1020, an isolation feature 146 is formed in the cut trench 144, as shown in FIGS. 2G-1 to 2G-5, in accordance with some embodiments.

In operation 1022, the dummy gate structures 126 are removed and a channel release process is performed to form nanostructures 110 of the first fin structure 118 and a floating fin element 106 of the second fin structure 120, as shown in FIGS. 2H-1 to 2H-6, in accordance with some embodiments. In operation 1024, inner spacer layers 158 are formed, as shown in FIGS. 2H-1 to 2H-6, in accordance with some embodiments. In operation 1026, final gate stacks 160 are formed across the nanostructures 110 and the floating fin element 106, as shown in FIGS. 2I-1 to 2I-5, in accordance with some embodiments.

In operation 1028, gate-cut openings 170 are formed through the final gate stacks 160, as shown in FIGS. 2J-1 to 2J-4, in accordance with some embodiments. In operation 1030, gate-cut features 174 are formed in the gate-cut openings 172, as shown in FIGS. 2K-1 to 2K-4, in accordance with some embodiments.

FIGS. 4A-4D are cross-sectional views illustrating the formation of a cut trench 414, in accordance with some embodiments of the disclosure. The cut trench 414 shown in FIG. 4D may be similar to the cut trench 144 shown in FIGS. 2F-1 to 2F-5.

Figure 4B:
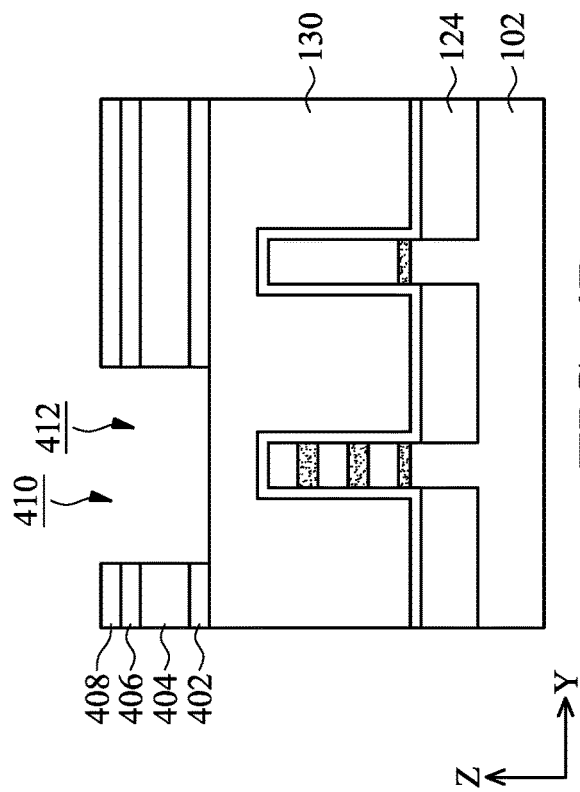
FIGS. 4A-4D are cross-sectional views illustrating the formation of a cut trench, in accordance with some embodiments of the disclosure.
Figure 4D:
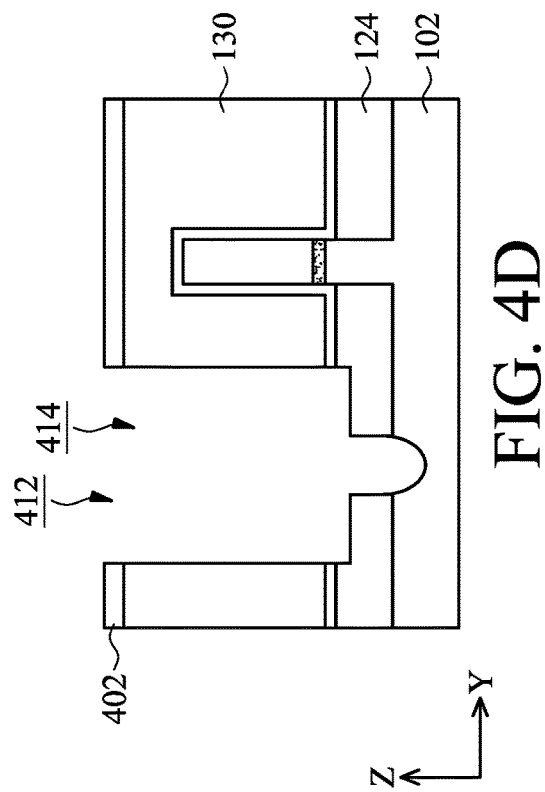
Figure 4A:
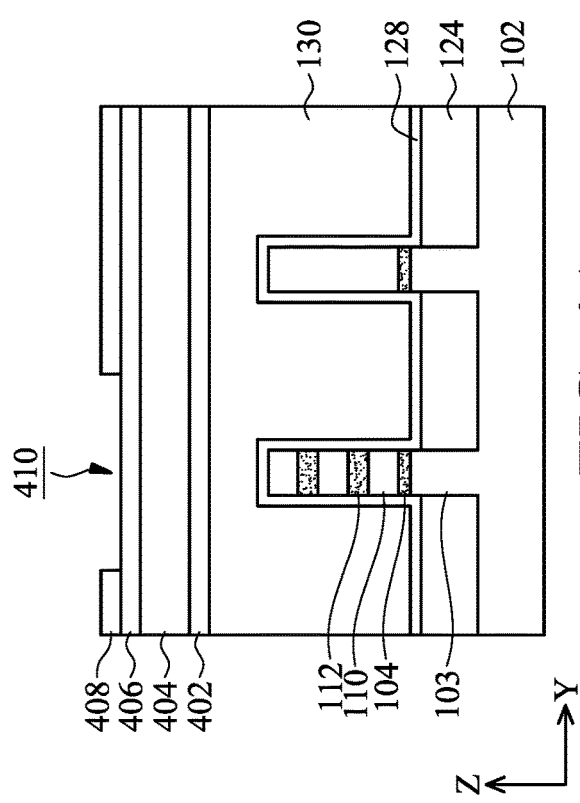

The formation of the cut trench 414 includes forming a hard mask layer 402 over the dummy gate electrode layer 130 and the interlayer dielectric layer (not shown), and forming a tri-layer mask structure over the hard mask layer 402, as shown in FIG. 4A, in accordance with some embodiments. In some embodiments, the hard mask layer 402 is made of silicon nitride, silicon oxide, silicon oxynitride and/or a combination thereof. The tri-layer mask includes a bottom layer 404, a middle layer 406 over the bottom layer 404, and a top layer 408 over the middle layer 406, in accordance with some embodiments. In some embodiments, the top layer 408 is made of a photoresist and patterned to have an opening 410 using a photolithography process. The photolithography process may include resist coating (for example, spin-on coating), soft baking, mask aligning, exposure, post-exposure baking, developing the resist, rinsing, drying (for example, hard baking), other suitable processes, or combinations thereof. In some embodiments, the middle layer 406 is made of an inorganic material, and the bottom layer 404 is a Si-doped bottom anti-reflective coating (BARC) layer.

Figure 4C:
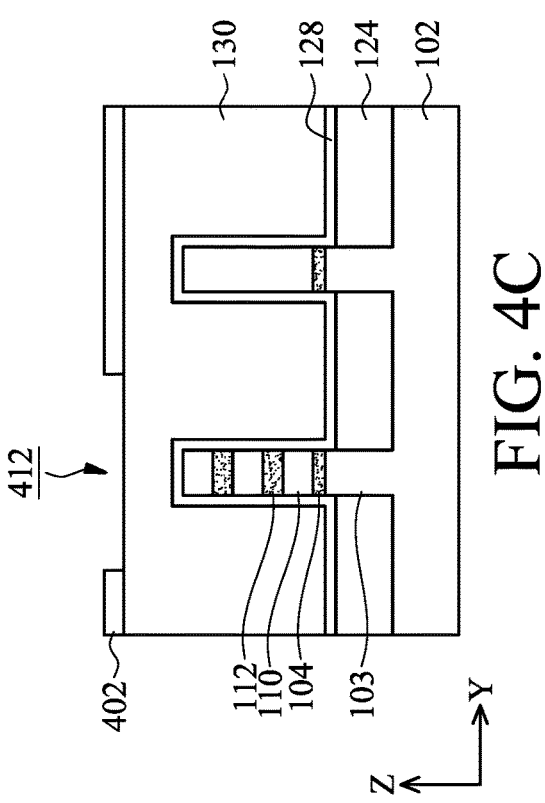
Figures 1, 6:
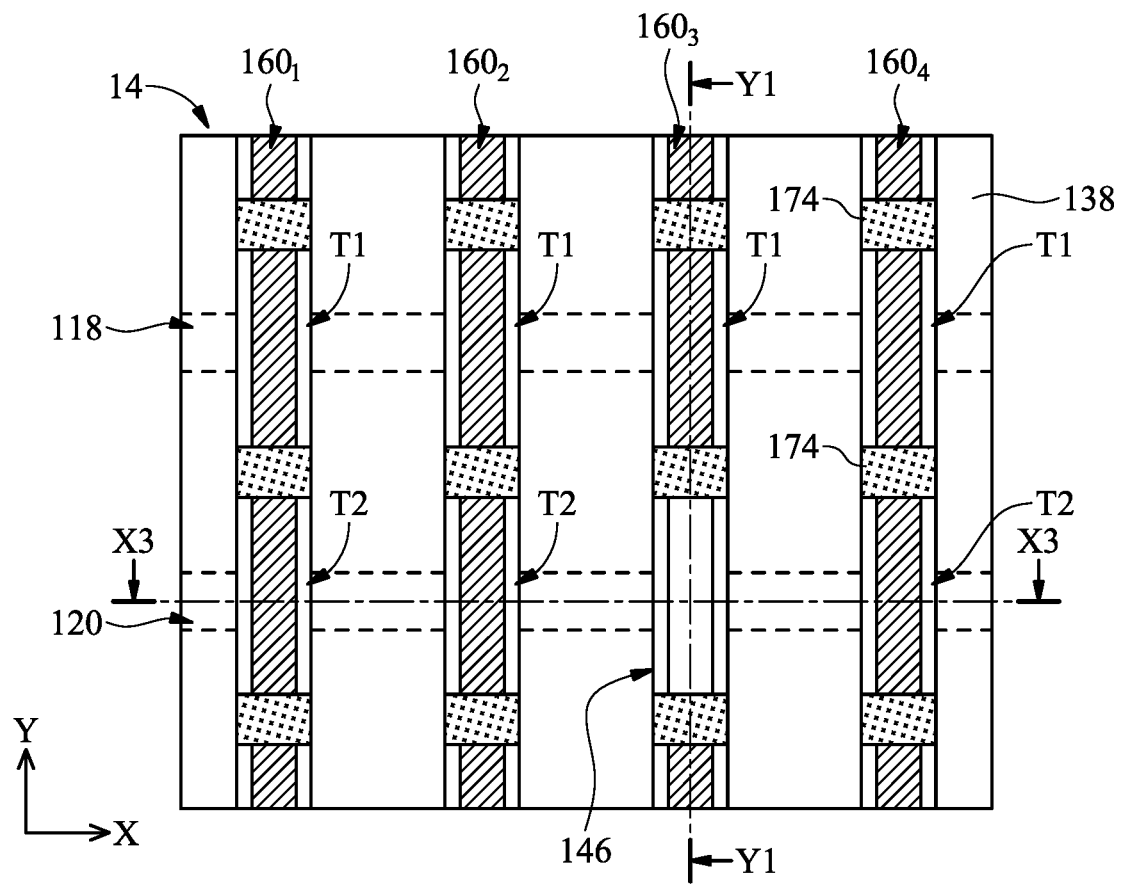
Figures 2, 6:
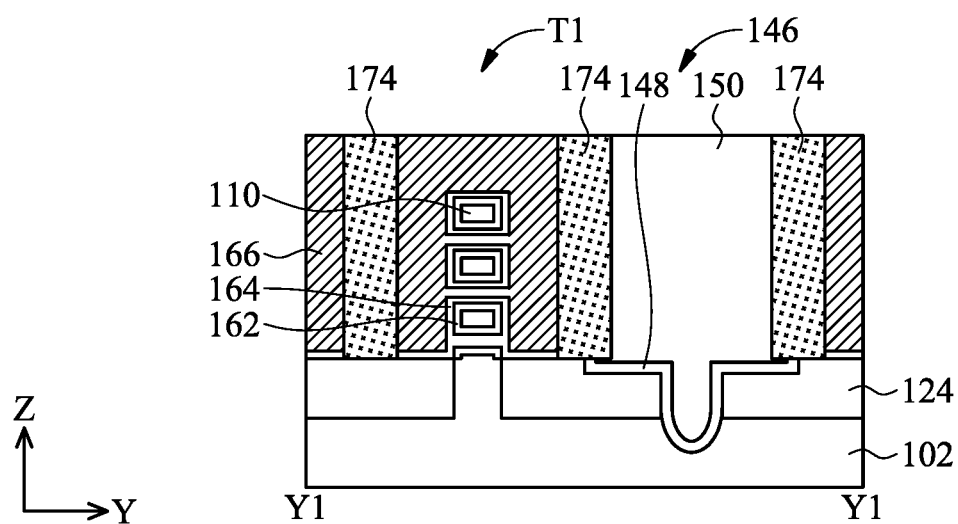
Figures 3, 6:
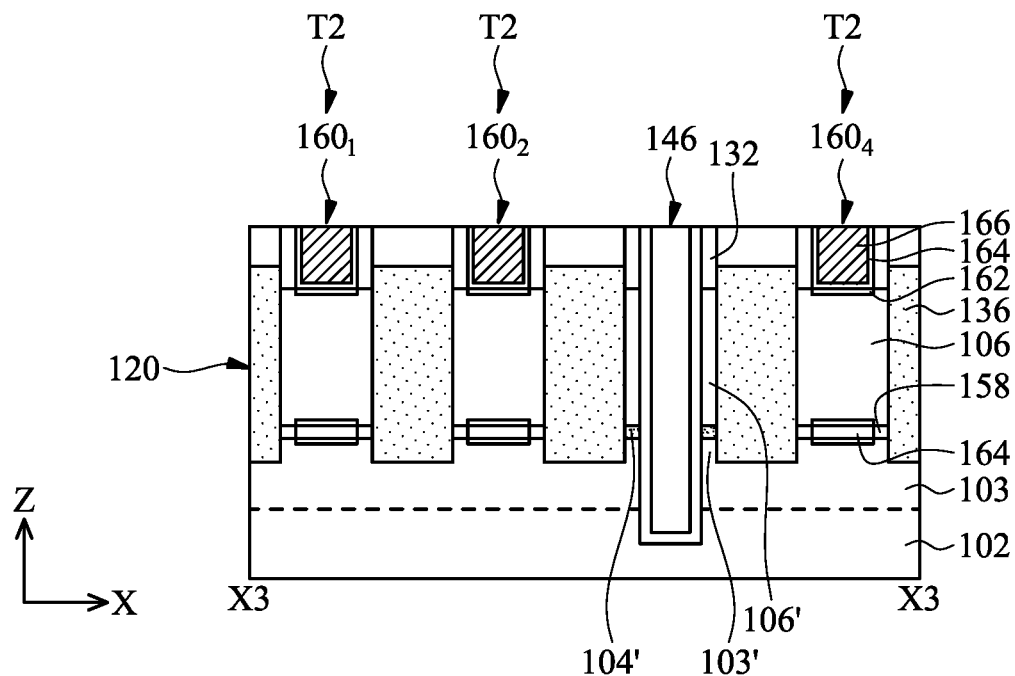

An etching process is performed to remove portions of the middle layer 406, the bottom layer 404 and the hard mask layer 402 below the opening 412 to form an opening 410, as shown in FIG. 4B; remove the tri-layer mask, as shown in FIG. 4C; and remove portions of the dummy gate electrode layer 130 and the dummy gate dielectric layer 128 uncovered by the patterned hard mask layer 402 to form a cut trench 414, as shown in FIG. 4D, in accordance with some embodiments.

The etching process may be performed in a plasma etch chamber such as a Kiyo etcher available from Lam Research Corp., Fremont, Calif. The plasma etch chamber may be performed with a pulsed plasma mode including a pulse-on and a pulse-off time period. The proportion of the pulse-on time period may be defined as a duty cycle. The steps of the etching process includes: (1) a de-scum step in which the photoresist material remaining in the opening 410 after the photolithography process performed on the top layer 408 is cleaned to completely expose the middle layer 406; (2) a middle-layer open step in which the middle layer 406 is etched; (3) a bottom-layer open step in which the bottom layer 404 is etched; (4) a hard-mask open step in which the hard mask layer 402 is etched; (5) a strip step in which the top layer 408, the middle layer 406 and the bottom layer 404 are removed to expose the hard mask layer 402; (6) an oxide break-through step in which a native oxide layer formed on the dummy gate electrode layer 130 is removed; (7) a main etching step in which the dummy gate electrode layer 130, the dummy gate dielectric layer 128 and the first fin structure 118 (including the third semiconductor layer 110, the fourth semiconductor layer 112 and the lower fin element 103) are etched; (8) an over-etching step in which the cut trench 414 is controlled to stop at a desired depth; (9) an ashing step in which residues, polymers and/or byproducts are removed from the semiconductor structure, in accordance with some embodiments.

During the de-scum step, the etching chamber provides a bias voltage in a range from about 60 volts (V) to about 360 V with a duty cycle in a range from 95% to about 100%, and an RF source power in a range from 100 watts (W) to about 600 W, in accordance with some embodiments. The de-scum step uses $CF_4$ with a flow rate in a range from about 50 standard cubic centimeter per minute (sccm) to about 300 sccm and Ar with a flow rate in a range from about 50 sccm to about 300 sccm as etching precursors, and is performed at a pressure of about 1.5 mTorr to about 9 mTorr for a duration of about 4 seconds to about 24 seconds.

During the middle-layer open step, the etching chamber provides a bias voltage in a range from about 200 V to about 1200 V with a duty cycle in a range from 95% to about 100%, and an RF source power in a range from about 400 W to about 2400 W, in accordance with some embodiments. The middle-layer open step uses $CH_2F_2$ with a flow rate in a range from about 12.5 sccm to about 75 sccm, $CF_4$ with a flow rate in a range from about 37.5 sccm to about 225 sccm, and $O_2$ with a flow rate in a range from about 1.5 sccm to about 9 sccm as etching precursors, and is performed at a pressure of about 5 mTorr to about 30 mTorr for a duration of about 15 seconds to about 90 seconds.

During the bottom-layer open step, the etching chamber provides a bias voltage in a range from about 100 V to about 600 V with a duty cycle in a range from 95% to about 100%, and an RF source power in a range from about 500 W to about 3000 W, in accordance with some embodiments. The bottom-layer open step uses $SO_2$ with a flow rate in a range from about 50 sccm to about 300 sccm, $O_2$ with a flow rate in a range from about 12.5 sccm to about 75 sccm and He with a flow rate in a range from about 100 sccm to about 600 sccm as etching precursors, and is performed at a pressure of about 3.5 mTorr to about 21 mTorr for a duration of about 22.5 seconds to about 135 seconds.

During the hard-mask open step, the etching chamber provides a bias voltage in a range from about 200 V to about 1200 V with a duty cycle in a range from 95% to about 100%, and an RF source power in a range from about 400 W to about 2400 W, in accordance with some embodiments. The hard-mask open step uses $CHF_3$ with a flow rate in a range from about 50 sccm to about 300 sccm, $O_2$ with a flow rate in a range from about 2.5 sccm to about 15 sccm and He with a flow rate in a range from about 100 sccm to about 600 sccm as etching precursors, and is performed at a pressure of about 2.5 mTorr to about 15 mTorr for a duration of about 10 seconds to about 60 seconds.

During the strip step, the etching chamber provides a bias voltage in a range from about 15 V to about 90 V with a duty cycle in a range from 95% to about 100%, and an RF source power in a range from about 500 W to about 3000 W, in accordance with some embodiments. The strip step uses $O_2$ with a flow rate in a range from about 10 sccm to about 60 sccm as etching precursors, and is performed at a pressure of about 5 mTorr to about 30 mTorr for a duration of about 15 seconds to about 90 seconds.

During the oxide break-through step, the etching chamber provides a bias voltage in a range from about 30 V to about 180 V with a duty cycle in a range from 95% to about 100%, and an RF source power in a range from about 150 W to about 900 W, in accordance with some embodiments. The oxide break-through step uses $CF_4$ with a flow rate in a range from about 10 sccm to about 60 sccm and Ar with a flow rate in a range from about 20 sccm to about 120 sccm as etching precursors, and is performed at a pressure of about 2.5 mTorr to about 15 mTorr for a duration of about 7.5 seconds to about 45 seconds.

During the main etching step, the etching chamber provides a bias voltage in a range from about 350 V to about 2100 V with a duty cycle in a range from 95% to about 100%, and an RF source power in a range from about 700 W to about 4200 W, in accordance with some embodiments. The main etching step uses HBr with a flow rate in a range from about 150 sccm to about 900 sccm, $O_2$ with a flow rate in a range from about 5 sccm to about 30 sccm and He with a flow rate in a range from about 400 sccm to about 2400 sccm as etching precursors, and is performed at a pressure of about 40 mTorr to about 240 mTorr for a duration of about 30 seconds to about 180 seconds.

During the over-etching step, the etching chamber provides a bias voltage in a range from about 700 V to about 4200 V with a duty cycle in a range from 5% to about 8%, and an RF source power in a range from about 200 W to about 1200 W, in accordance with some embodiments. The over-etching step uses $SiCH_4$ with a flow rate in a range from about 2.5 sccm to about 15 sccm, $N_2$ with a flow rate in a range from about 25 sccm to about 150 sccm, $O_2$ with a flow rate in a range from about 25 sccm to about 150 and $Cl_2$ with a flow rate in a range from about 150 sccm to about 900 sccm as etching precursors, and is performed at a pressure of about 40 mTorr to about 240 mTorr for a duration of about 30 seconds to about 180 seconds. The duty cycle of the over-etching step is much lower than the duty cycle of the main etching step such that the etching is precisely controlled to extend the cut trench 414 to the desired depth, e.g., into substrate 102.

During the ashing step, the etching chamber provides a bias voltage in a range from about 15 V to about 90 V with a duty cycle in a range from about 95% to about 100%, and an RF source power in a range from about 500 W to about 3000 W, in accordance with some embodiments. The ashing step uses $O_2$ with a flow rate in a range from about 10 sccm to about 60 sccm, and is performed at a pressure of about 5 mTorr to about 30 mTorr for a duration of about 15 seconds to about 90 seconds.

In some embodiments, the steps of the etching process are performed in situ in the same etching chamber to prevent the semiconductor structure from being exposed to an oxygen-containing ambient. After the etching process, the semiconductor structure may be cleaned using a sulfuric acid peroxide mixture (SPM, $H_2SO_4+H_2O_2$) and/or dilute hydrofluoric (dHf) acid.

FIGS. 5A-5D are cross-sectional views illustrating the formation of gate-cut openings 518, in accordance with some embodiments of the disclosure. The gate-cut openings 518 shown in FIG. 5D may be similar to the gate-cut openings 172 shown in FIGS. 2J-1 to 2J-4.

The formation of the gate-cut openings 518 includes forming a metal protection layer 502 over the metal gate electrode layer 166, the isolation feature 146 and the interlayer dielectric layer (not shown), forming a hard mask layer 504 over the metal protection layer 502, and forming a tri-layer mask structure over the hard mask layer 504, as shown in FIG. 5A, in accordance with some embodiments. In some embodiments, the metal protection layer 502 protects the metal gate electrode material from being oxidized and is made of TiN. In some embodiments, the hard mask layer 504 is made of silicon nitride, silicon oxide, silicon oxynitride and/or a combination thereof. The tri-layer mask includes a bottom layer 506, a middle layer 508 over the bottom layer 506, and a top layer 510 over the middle layer 508, in accordance with some embodiments. In some embodiments, the top layer 510 is made of a photoresist and patterned to have opening 512; the middle layer 508 includes an inorganic material; and the bottom layer 506 is a Si-doped bottom anti-reflective coating layer.

A first etching process is performed to remove portions of the middle layer 508, the bottom layer 506 and the hard mask layer 504 below the open 512 to form openings 514, as shown in FIG. 5B, in accordance with some embodiments.

The first etching process may be performed in a plasma etch chamber such as a Kiyo etcher. The steps of the first etching process includes: (1) a de-scum step in which the photoresist material remaining in the openings 512 after the photolithography process performed on the top layer 510 is cleaned to completely expose the middle layer 508; (2) a middle-layer open step in which the middle layer 508 is etched; (3) a bottom-layer open step in which the bottom layer 506 is etched; (4) a hard-mask open step in which the hard mask layer 504 is etched to expose the metal protection layer 502, in accordance with some embodiments.

During the de-scum step, the etching chamber provides a bias voltage in a range from about 60V to about 360 v with a duty cycle in a range from 95% to about 100%, and an RF source power in a range from 100 W to about 600 W, in accordance with some embodiments. The de-scum step uses $CF_4$ with a flow rate in a range from about 50 sccm to about 300 sccm and Ar with a flow rate in a range from about 50 sccm to about 300 sccm as etching precursors, and is performed at a pressure of about 1.5 mTorr to about 9 mTorr for a duration of about 4 seconds to about 24 seconds.

During the middle-layer open step, the etching chamber provides a bias voltage in a range from about 200 V to about 1200 V with a duty cycle in a range from 95% to about 100%, and an RF source power in a range from about 400 W to about 2400 W, in accordance with some embodiments. The middle-layer open step uses $CH_2F_2$ with a flow rate in a range from about 12.5 sccm to about 75 sccm, $CF_4$ with a flow rate in a range from about 37.5 sccm to about 225 sccm, and $O_2$ with a flow rate in a range from about 1.5 sccm to about 9 sccm as etching precursors, and is performed at a pressure of about 5 mTorr to about 30 mTorr for a duration of about 15 seconds to about 90 seconds.

During the bottom-layer open step, the etching chamber provides a bias voltage in a range from about 100 V to about 600 V with a duty cycle in a range from 95% to about 100%, and an RF source power in a range from about 500 W to about 3000 W, in accordance with some embodiments. The bottom-layer open step uses $SO_2$ with a flow rate in a range from about 50 sccm to about 300 sccm, $O_2$ with a flow rate in a range from about 12.5 sccm to about 75 sccm and He with a flow rate in a range from about 100 sccm to about 600 sccm as etching precursors, and is performed at a pressure of about 3.5 mTorr to about 21 mTorr for a duration of about 22.5 seconds to about 135 seconds.

During the hard-mask open step, the etching chamber provides a bias voltage in a range from about 200 V to about 1200 V with a duty cycle in a range from 95% to about 100%, and an RF source power in a range from about 400 W to about 2400 W, in accordance with some embodiments. The hard-mask open step uses $CHF_3$ with a flow rate in a range from about 50 sccm to about 300 sccm, $O_2$ with a flow rate in a range from about 2.5 sccm to about 15 sccm and He with a flow rate in a range from about 100 sccm to about 600 sccm as etching precursors, and is performed at a pressure of about 2.5 mTorr to about 15 mTorr for a duration of about 25 seconds to about 150 seconds.

In some embodiments, the first etching process further includes a strip step after the hard-mask open step to remove to the tri-layer mask. In some embodiments, the steps of the first etching process described above are performed in situ in the same etching chamber. After the first etching process, the semiconductor structure may be cleaned using a sulfuric acid peroxide mixture and/or dilute hydrofliuric (dHf).

Because the vertical etching and the lateral etching occur concurrently during the first etching process, the openings 514 may be enlarged to have a greater critical dimension (CD) than the target critical dimension. In some embodiments, a dielectric layer 516 is conformally formed over the semiconductor structure to partially fills the opening 514 to recover the enlarged critical dimension of the opening 514, as shown in FIG. 5C, in accordance with some embodiments. The openings 514 after partially filled with the dielectric layer 516 are denoted as openings 514'. In some embodiments, the dielectric layer 516 is made of the same material as the hard mask layer 504, e.g., SiN.

A second etching process is performed to remove portions of the dielectric layer 516, the metal gate electrode layer 166 and the high-k gate dielectric layer 164 below the opening 514' to form gate-cut openings 518, as shown in FIG. 5D, in accordance with some embodiments. In some embodiments, the second etching process may also remove portions of the isolation feature 146 below the opening 514'.

The second etching process may be performed in a plasma etch chamber such as a Kiyo etcher. The steps of the second etching process includes: (1) a hard-mask open step in which the dielectric layer 516 is etched; (2) a protection-layer open step in which the metal protection layer 502 is etched; (3)-(6) first, second, third, and fourth main etching steps in which the gate electrode layer 166 and the high-k gate dielectric layer 164 are etched and the gate-cut openings 518 is controlled to stop at a desired depth. The first, second, third, and fourth main etching steps may be used to remove different materials of the final gate stack (such as metals, metal nitrides, high-k dielectrics, etc.) and may be repeated several times.

During the hard-mask open step, the etching chamber provides a bias voltage in a range from about 200 V to about 1200 V with a duty cycle in a range from 95% to about 100%, and an RF source power in a range from about 400 W to about 2400 W, in accordance with some embodiments. The hard-mask open step uses $CHF_3$ with a flow rate in a range from about 50 sccm to about 300 sccm, $O_2$ with a flow rate in a range from about 2.5 sccm to about 15 sccm and He with a flow rate in a range from about 100 sccm to about 600 sccm as etching precursors, and is performed at a pressure of about 2.5 mTorr to about 15 mTorr for a duration of about 7.5 seconds to about 45 seconds.

During the protection-layer open step, the etching chamber provides a bias voltage in a range from about 100 V to about 600 V with a duty cycle in a range from 95% to about 100%, and an RF source power in a range from about 400 W to about 2400 W, in accordance with some embodiments. The protection-layer open step uses $Cl_2$ with a flow rate in a range from about 50 sccm to about 300 sccm, $BCl_3$ with a flow rate in a range from about 10 sccm to about 60 sccm and Ar with a flow rate in a range from about 10 sccm to about 10000 sccm as etching precursors, and is performed at a pressure of about 1.5 mTorr to about 9 mTorr for a duration of about 7.5 seconds to about 45 seconds.

During the first main etching step, the etching chamber provides a bias voltage in a range from about 150 V to about 900 V with a duty cycle in a range from 45% to about 55%, and an RF source power in a range from about 600 W to about 3600 W, in accordance with some embodiments. The first main etching step uses $Cl_2$ with a flow rate in a range from about 50 sccm to about 300 sccm, $BCl_3$ with a flow rate in a range from about 10 sccm to about 60 sccm and Ar with a flow rate in a range from about 10 sccm to about 10000 sccm as etching precursors, and is performed at a pressure of about 15 mTorr to about 90 mTorr for a duration of about 5 seconds to about 30 seconds.

During the second main etching step, the etching chamber provides a bias voltage in a range from about 300 V to about 1800 V with a duty cycle in a range from 45% to about 55%, and an RF source power in a range from about 600 W to about 3600 W, in accordance with some embodiments. The second main etching step uses $Cl_2$ with a flow rate in a range from about 50 sccm to about 300 sccm, $BCl_3$ with a flow rate in a range from about 10 sccm to about 60 sccm and Ar with a flow rate in a range from about 10 sccm to about 10000 sccm as etching precursors, and is performed at a pressure of about 30 mTorr to about 180 mTorr for a duration of about 7.5 seconds to about 45 seconds.

During the third main etching step, the etching chamber provides a bias voltage in a range from about 150 V to about 900 V with a duty cycle in a range from 45% to about 55%, and an RF source power in a range from about 600 W to about 3600 W, in accordance with some embodiments. The third main etching step uses $Cl_2$ with a flow rate in a range from about 50 sccm to about 300 sccm, $BCl_3$ with a flow rate in a range from about 10 sccm to about 60 sccm and Ar with a flow rate in a range from about 10 sccm to about 10000 sccm as etching precursors, and is performed at a pressure of about 15 mTorr to about 90 mTorr for a duration of about 5 seconds to about 30 seconds.

During the fourth main etching step, the etching chamber provides a bias voltage in a range from about 300 V to about 1800 V with a duty cycle in a range from 5% to about 20%, and an RF source power in a range from about 600 W to about 3600 W, in accordance with some embodiments. The fourth main etching step uses $Cl_2$ with a flow rate in a range from about 50 sccm to about 300 sccm, $BCl_3$ with a flow rate in a range from about 10 sccm to about 60 sccm and Ar with a flow rate in a range from about 10 sccm to about 10000 sccm as etching precursors, and is performed at a pressure of about 30 mTorr to about 180 mTorr for a duration of about 7.5 seconds to about 45 seconds. The duty cycle of the fourth main etching step is much lower than the duty cycle of the first, second and third etching steps such that the etching is precisely controlled to extend the gate-cut openings 518 to the desired depth.

The second etching process may further include an ashing step after the fourth main etching step of the last cycle to remove residues, polymers and/or byproducts from the semiconductor structure. In some embodiments, the steps of the second etching are performed in situ in the same etching chamber. After the second etching process, the semiconductor structure may be cleaned using dilute hydrofluoric acid and/or ammonia hydroxide-hydrogen peroxide-water mixture (standard clean 1).

FIG. 6-1 is a top view of a semiconductor structure 14 which is a modification of the semiconductor structure 12 of FIG. 2K-1, in accordance with some embodiments of the disclosure. FIGS. 6-2 and 6-3 are cross-sectional views taken along line Y1-Y1 and line X3-X3 in FIG. 6-1. The semiconductor structure 14 is similar to the semiconductor structure 12 except that an isolation feature 146 is formed through the second fin structure 120, in accordance with some embodiments.

After operation 1016, a cut trench (not shown) is formed through the dummy gate structure $126_3$ and the second fin structure 120, and an isolation feature 146 is formed in the cut trench, in accordance with some embodiments. The cut trench (or isolation feature 146) corresponds to a cross point of the dummy gate structure $126_3$ and the second fin structure 120 so as to cut the dummy gate structure (not shown) into two segments and the second fin structure 120 into two segments, in accordance with some embodiments. The cut trench may be formed using the steps as described with respect to FIGS. 4A to 4D. After operations 1022-1030 are performed, the isolation feature 146 is located between and electrically isolates two FinFETs T2, as shown in FIGS. 6-1 and 6-3, in accordance with some embodiments.

In addition, portions of the second fin structure 120 adjacent to the isolation feature 146 are covered by the gate spacer layers 132 during the etching process for forming the cut trench and remain unetched, in accordance with some embodiments. The respective unetched portions of the second semiconductor layer 106, the first semiconductor layer 104 and the low fin element 103 of the second fin structure 120 are denoted as a second semiconductor layer 106', a first semiconductor layer 104' and a low fin element 103' respectively, which collectively form a semiconductor stack adjacent to the isolation feature 146, as shown in FIG. 6-3, in accordance with some embodiments. The semiconductor stack including the second semiconductor layer 106', the first semiconductor layer 104' and the low fin element 103' is located between the source/drain features 136 of the FinFETs T2 and the isolation feature 146, as shown in FIG. 6-3, in accordance with some embodiments.

Figures 1, 7:
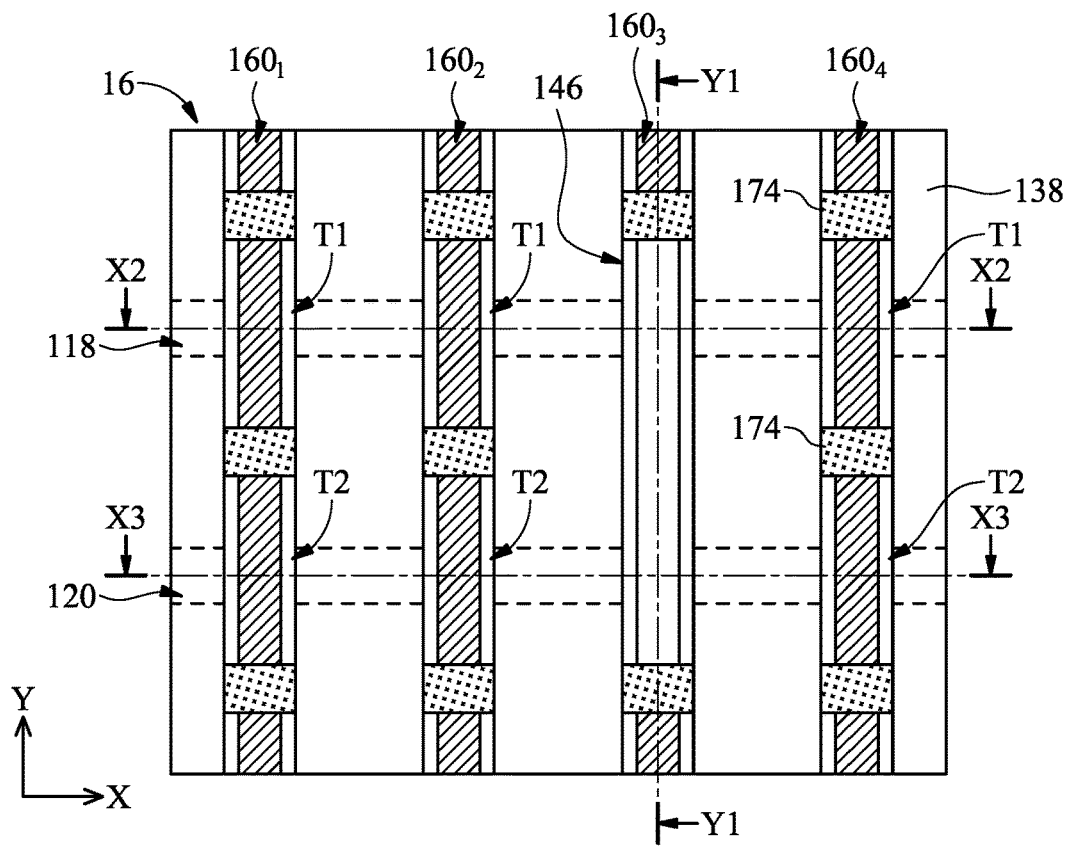
Figures 2, 7:
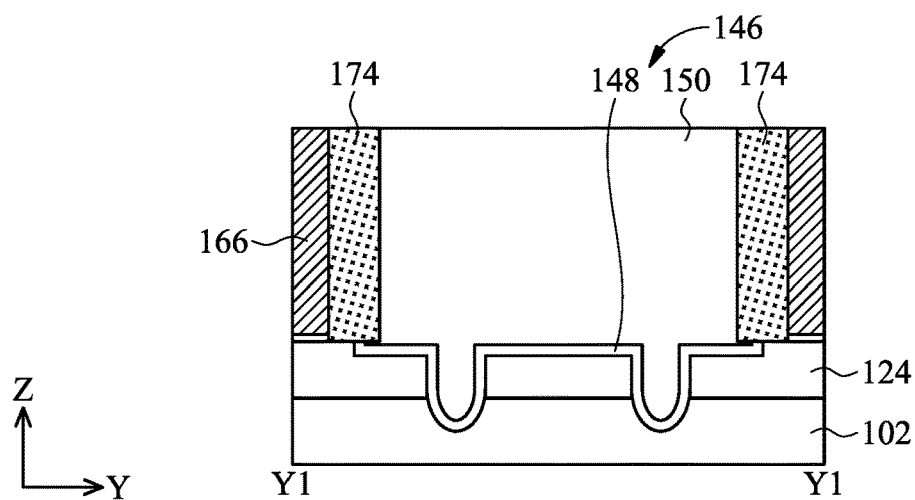
Figures 3, 7:
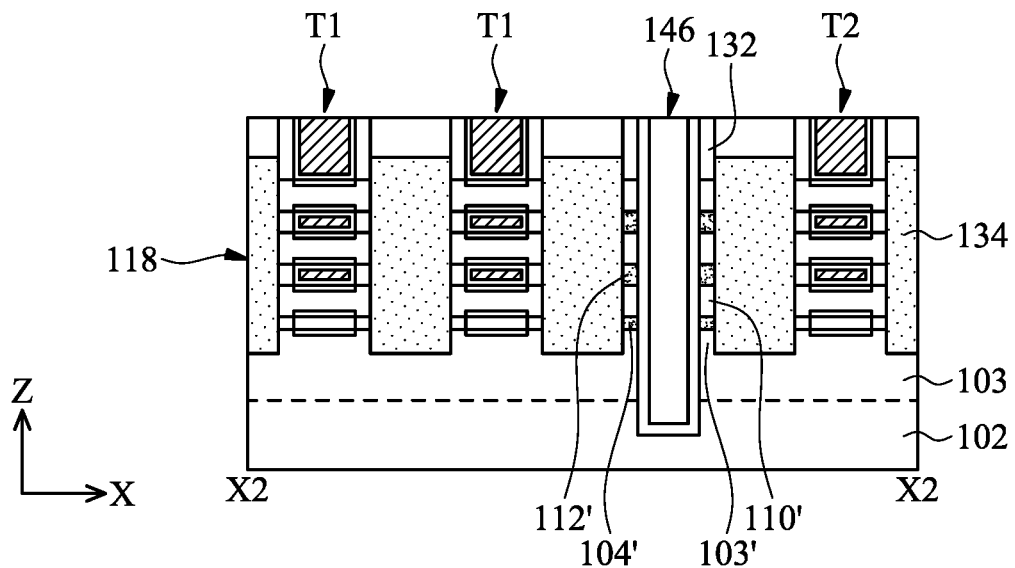
Figures 4, 7:
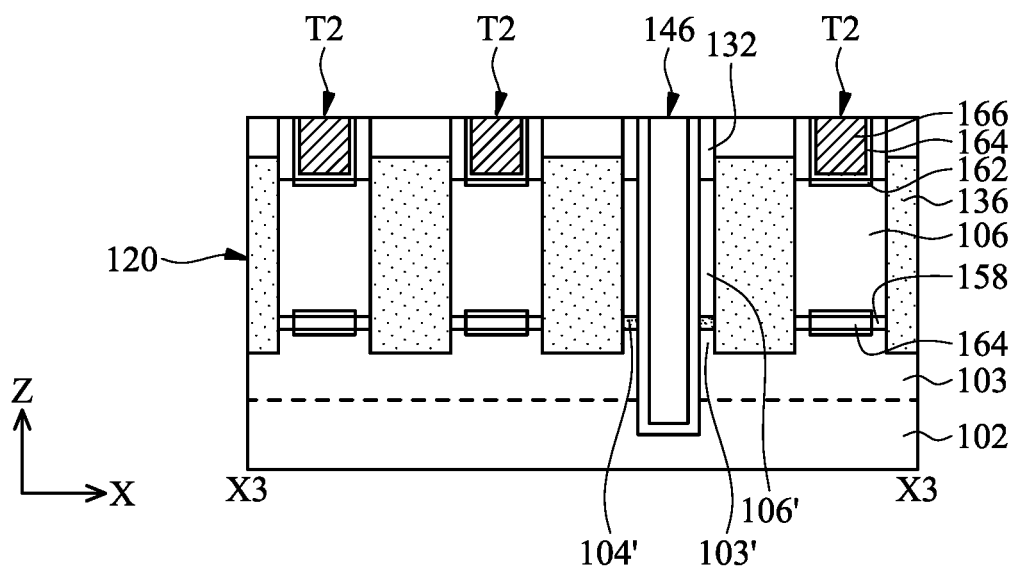
Figures 1, 8:
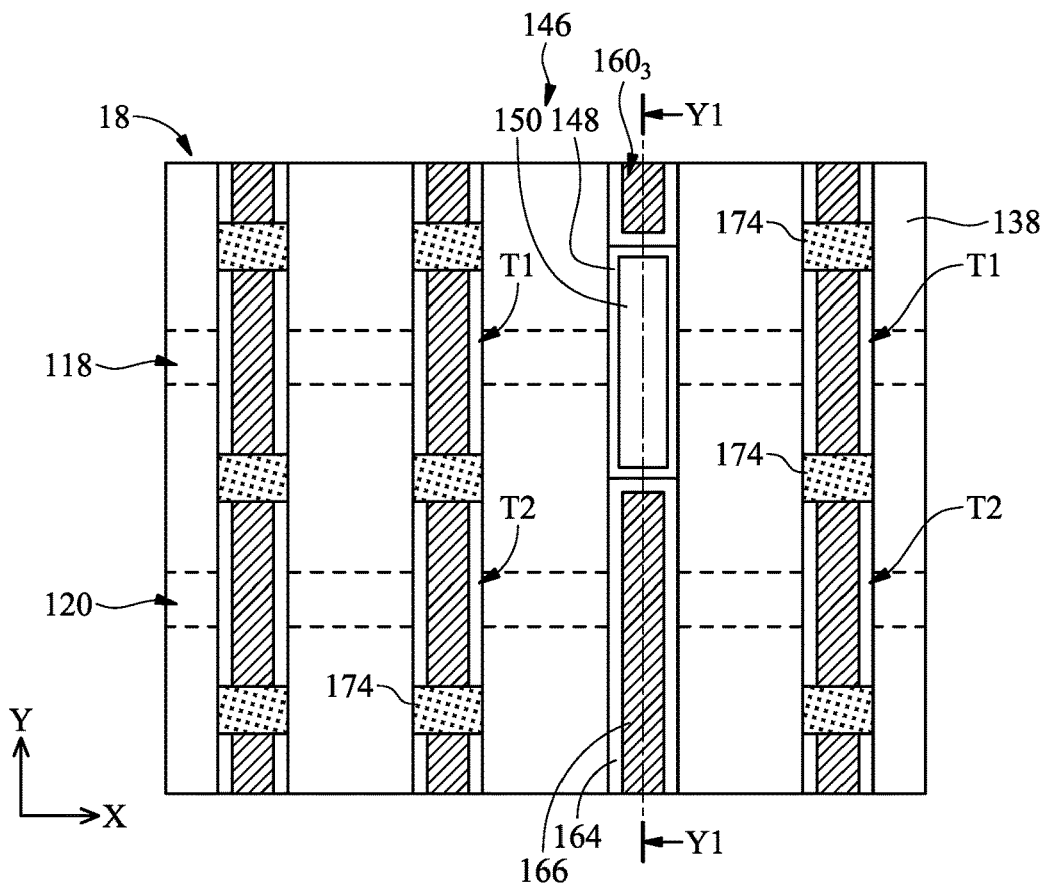
Figures 2, 8:
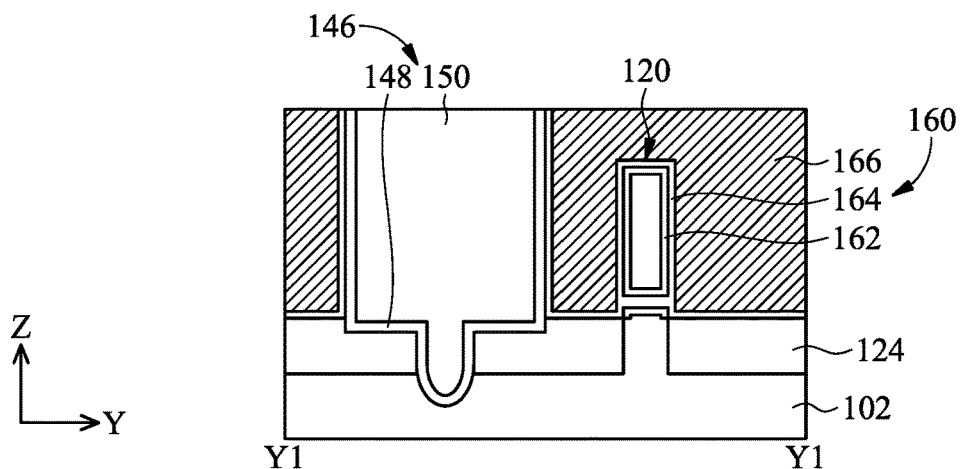
Figures 1, 9:
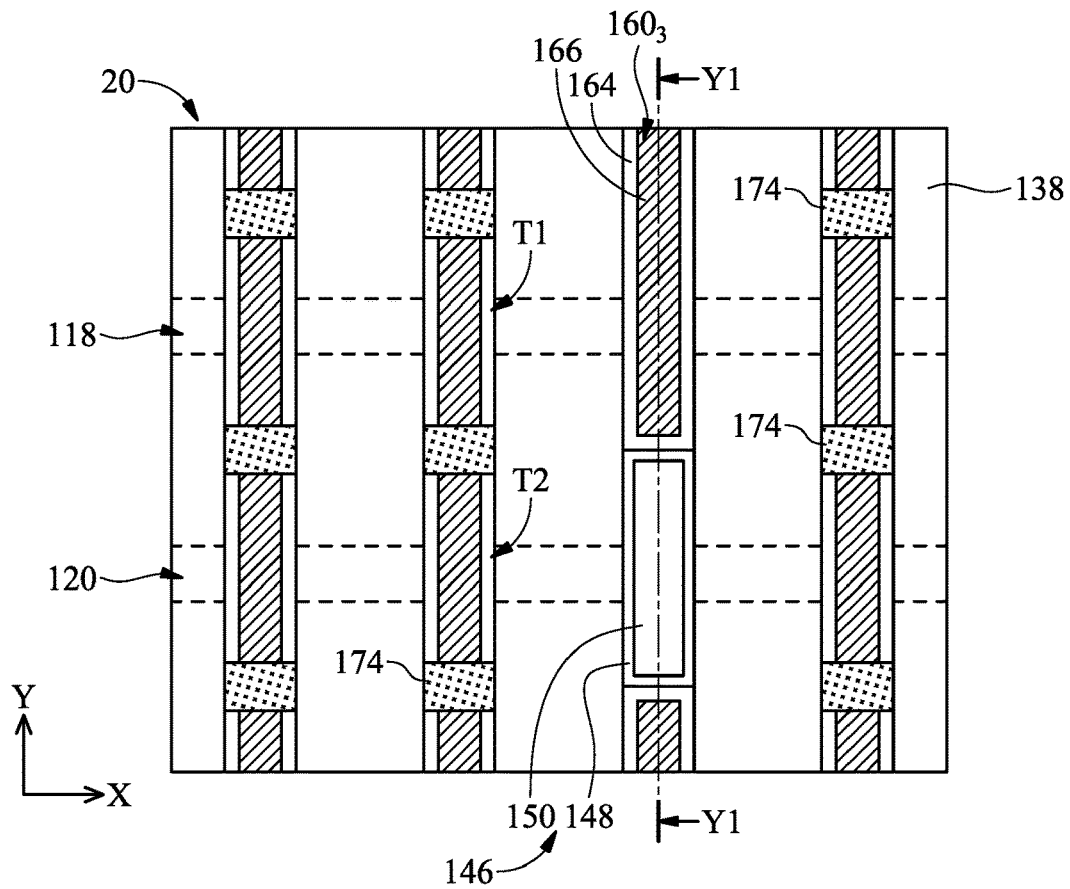
Figures 2, 9:
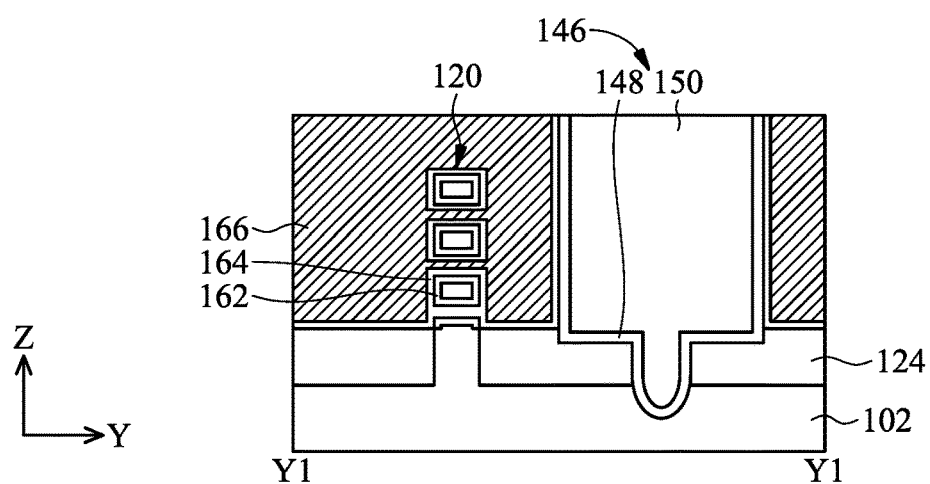
Figures 1, 10:
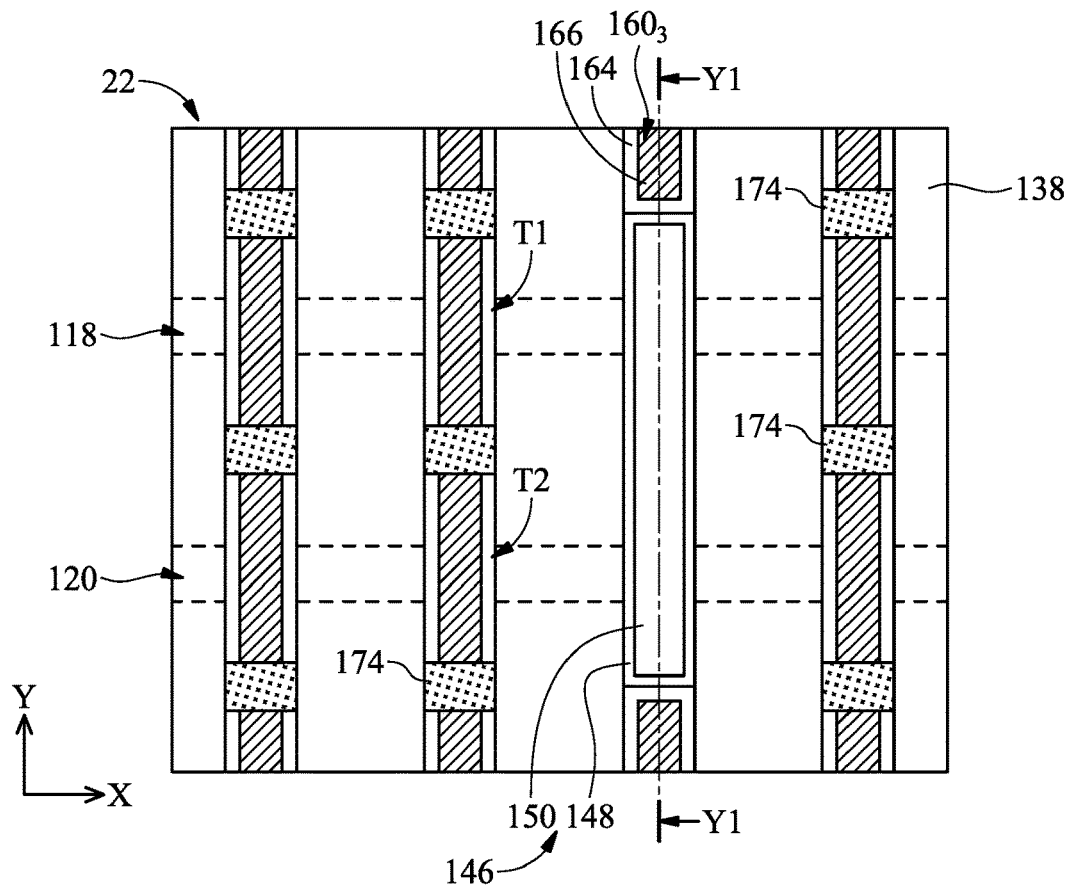
Figures 2, 10:
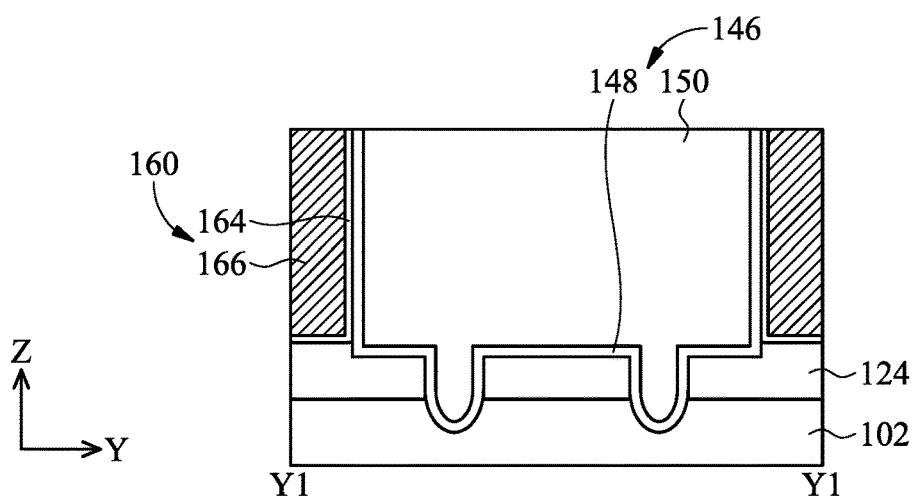
Figures 1, 11:
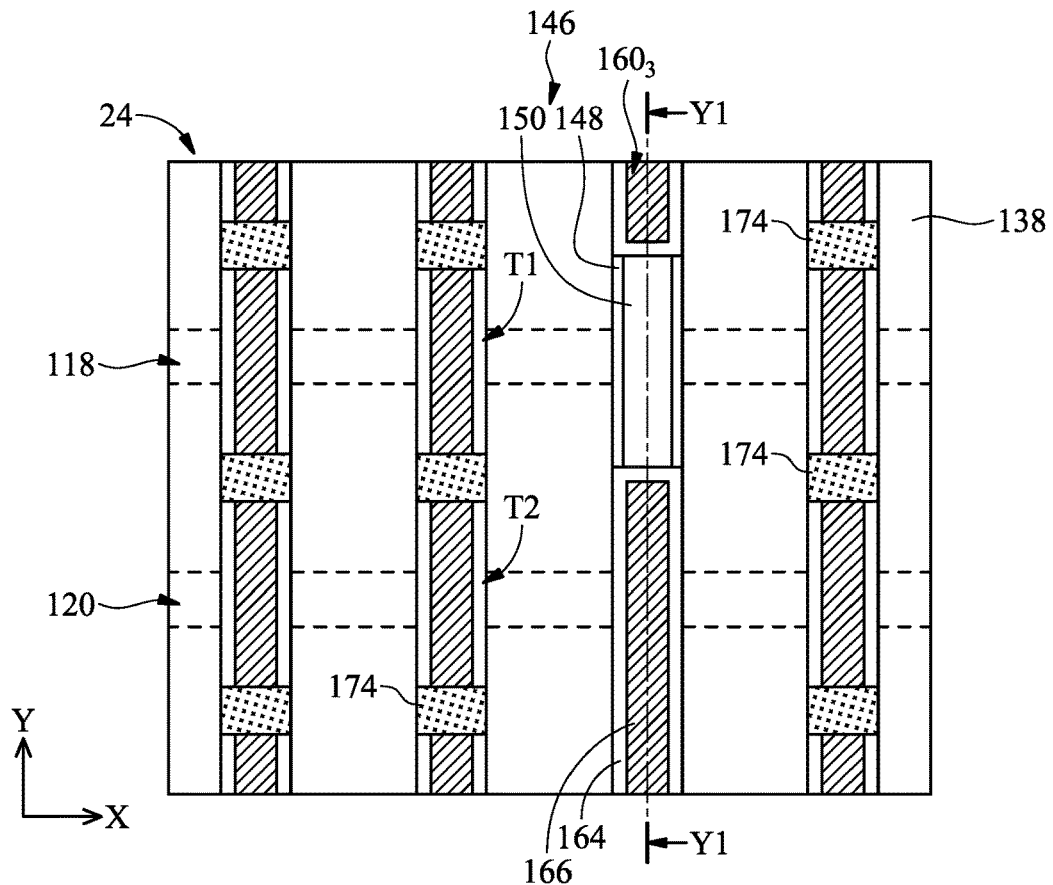
Figures 2, 11:
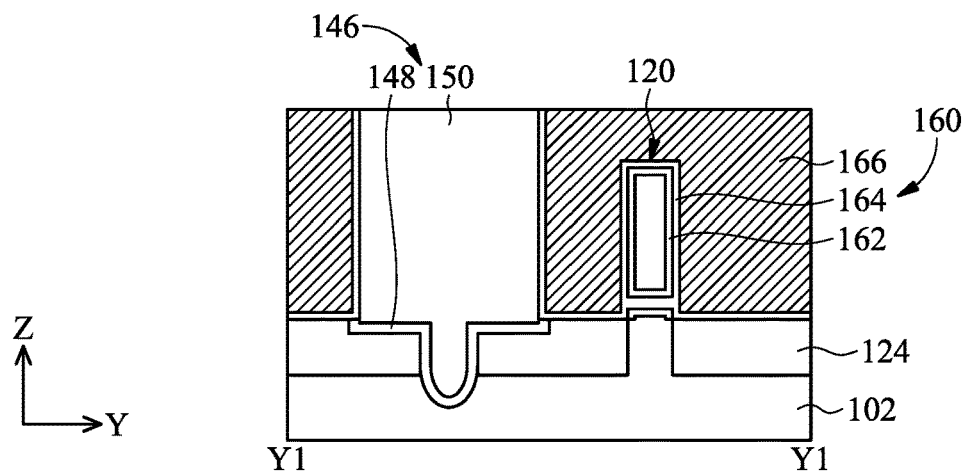
Figures 1, 12:
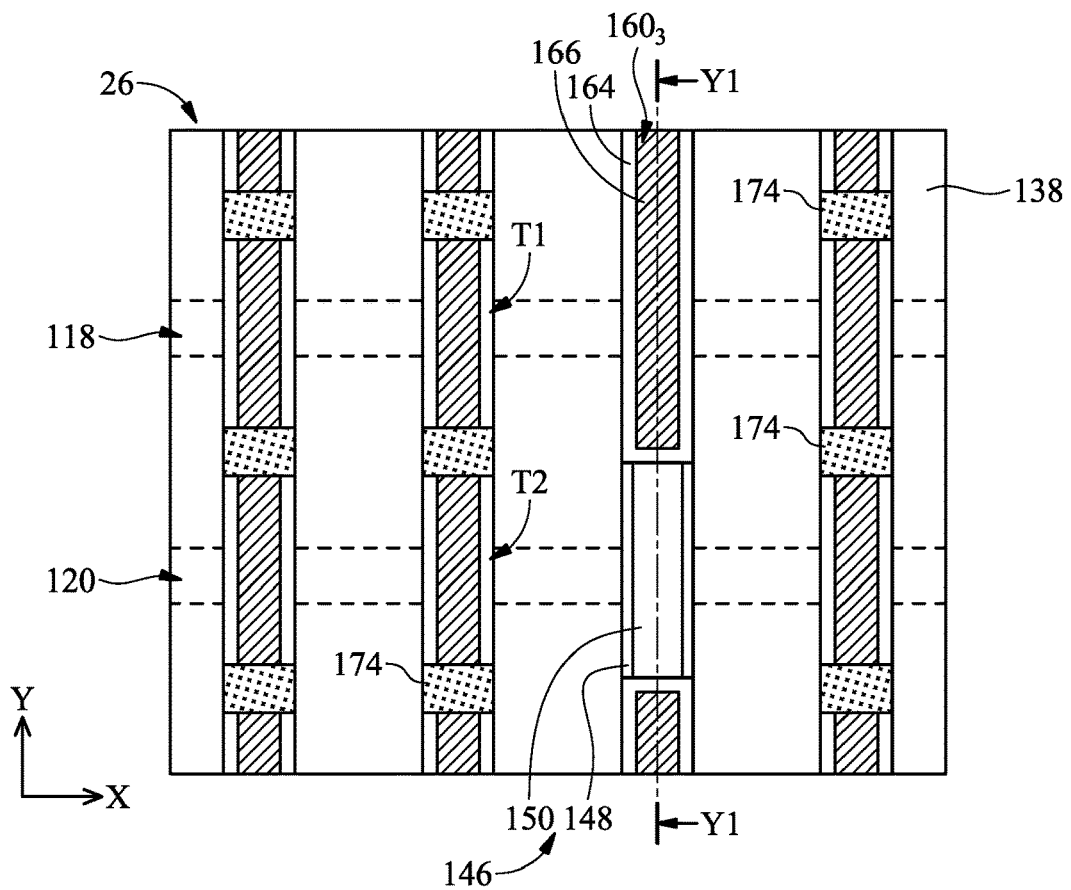
Figures 2, 12:
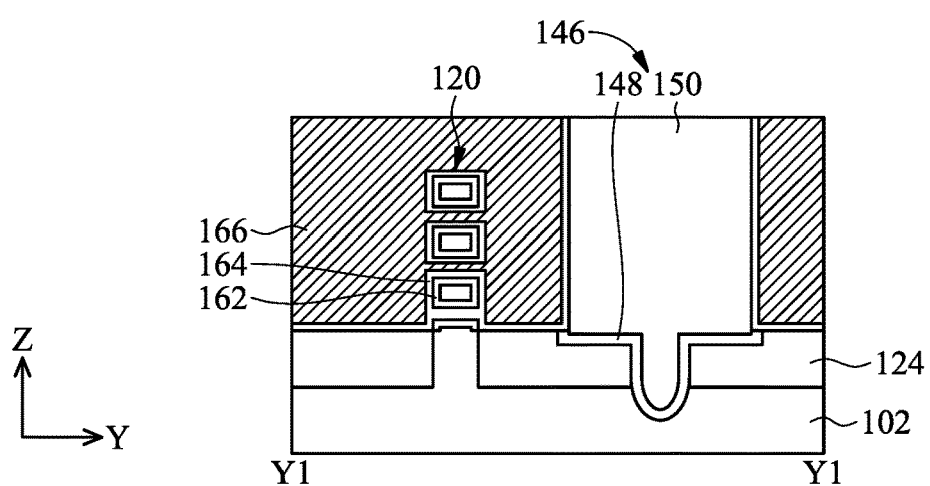
Figures 1, 13:
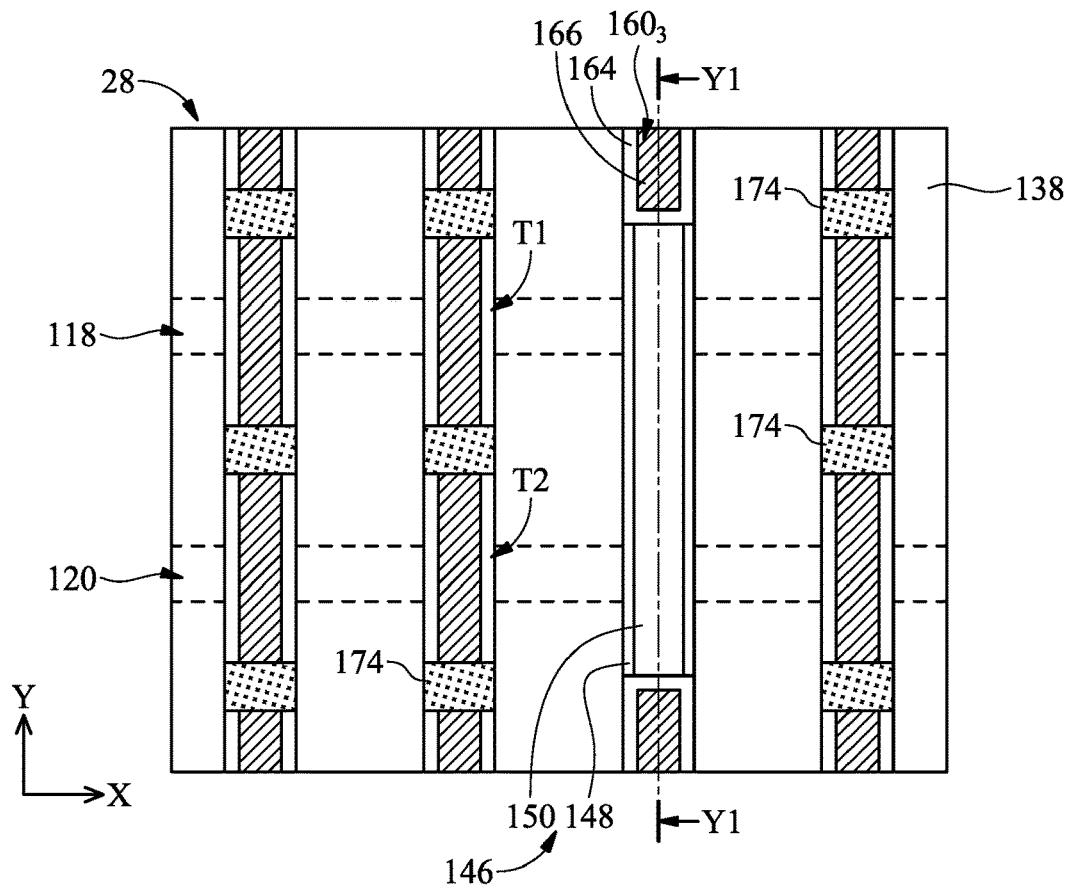
Figures 2, 13:
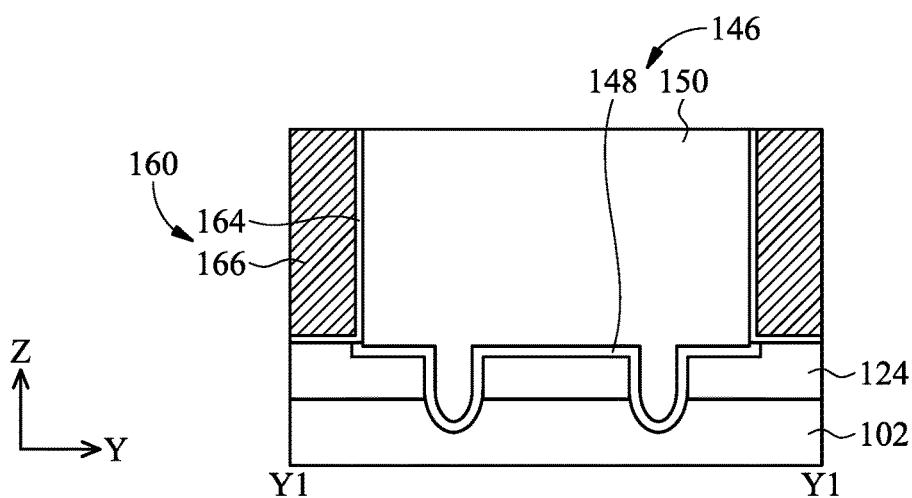

FIG. 7-1 is a top view of a semiconductor structure 16 which is a modification of the semiconductor structure 12 of FIG. 2K-1, in accordance with some embodiments of the disclosure. FIGS. 7-2 to 7-4 are cross-sectional views taken along line Y1-Y1, line X2-X2 and line X3-X3 in FIG. 6-1. The semiconductor structure 16 is similar to the semiconductor structure 12 except that an isolation feature 146 is formed through both the first fin structures 118 and the second fin structure 120, in accordance with some embodiments.

After operation 1016, a cut trench (not shown) is formed through the dummy gate structure $126_3$ and the fin structures 118 and 120, and an isolation feature 146 is formed in the cut trench, in accordance with some embodiments. The cut trench (or isolation feature 146) cut the dummy gate structure (not shown) into two segments, the first fin structure 118 into two segments, and the second fin structure 120 into two segments, in accordance with some embodiments. The cut trench may be formed using the steps as described with respect to FIGS. 4A to 4D. After operations 1022-1030 are performed, the isolation feature 146 is located between two gate-all-around FETs T1 and between two FinFETs T2, as shown in FIGS. 7-1, 7-3 and 7-4, in accordance with some embodiments.

FIGS. 8-1, 9-1 and 10-1 are top views of semiconductor structures 18, 20 and 22 which are modifications of the semiconductor structures 12, 14 and 16 of FIGS. 2K-1, 6-1 and 7-1 respectively, in accordance with some embodiments of the disclosure. FIGS. 8-2, 9-2 and 10-2 are cross-sectional views taken along lines Y1-Y1 in FIGS. 8-1, 9-1 and 10-1. The semiconductor structure 18, 20 and 22 are similar to the semiconductor structures 12, 14 and 16 respectively, except that no gate-cut openings formed adjacent to the isolation feature 146, in accordance with some embodiments. As a result, the high-k gate dielectric layer 164 of the final gate stack $160_3$ is formed along and contacts the dielectric lining layer 148 of the isolation feature 146, in accordance with some embodiments.

FIGS. 11-1, 12-1 and 13-1 are top views of semiconductor structures 24, 26 and 28 which are modifications of the semiconductor structures 18, 20 and 22 of FIGS. 8-1, 9-1 and 10-1 respectively, in accordance with some embodiments of the disclosure. FIGS. 11-2, 12-2 and 13-2 are cross-sectional views taken along lines Y1-Y1 in FIGS. 11-1, 12-1 and 13-1. The semiconductor structure 24, 26 and 28 are similar to the semiconductor structures 18, 20 and 22 respectively, except that the high-k gate dielectric layer 164 of the final gate stack $160_3$ is formed along and contacts both the dielectric lining layer 148 and the dielectric fill layer 150 of the isolation feature 146, in accordance with some embodiments. This is because during operation 1022, portions of the dielectric lining layer 148 contacting the dummy gate structure $126_3$ are also removed thereby exposing the dielectric fill layer 150 from the gate trench $152_3$, in accordance with some embodiments.

Figures 1, 14:
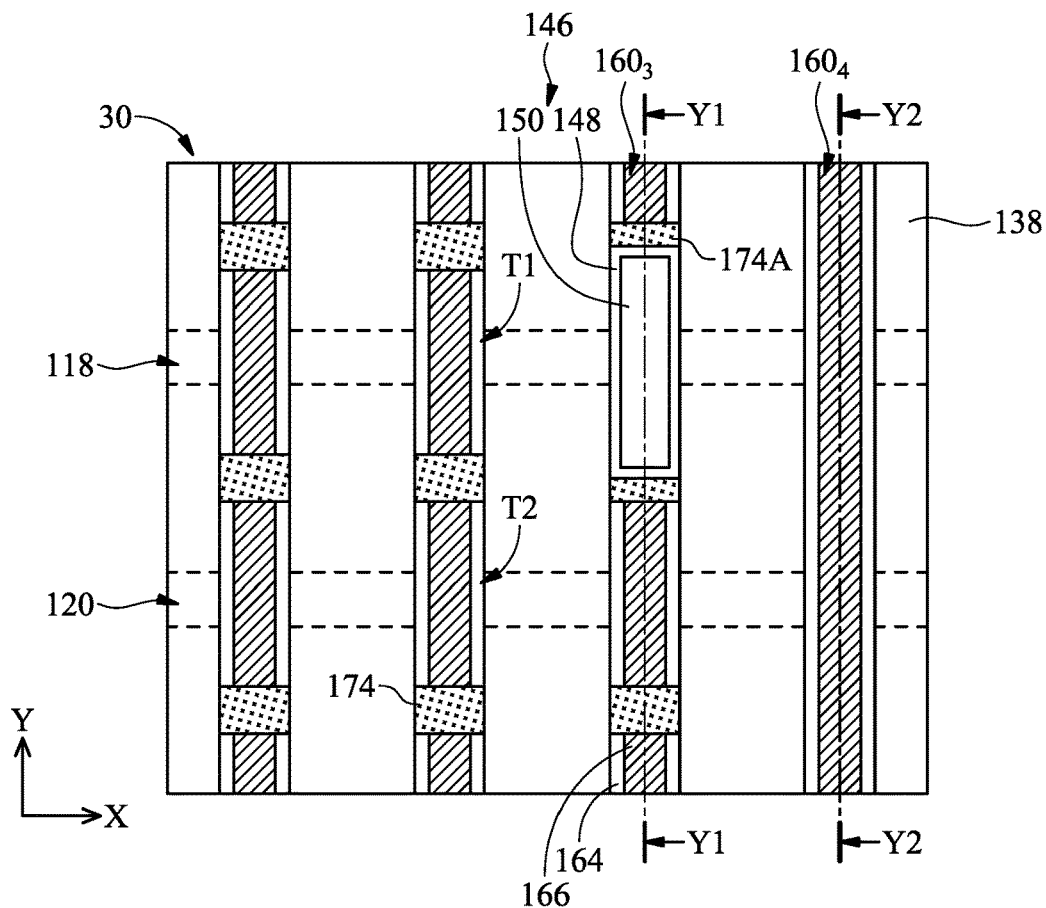
Figures 2, 14:
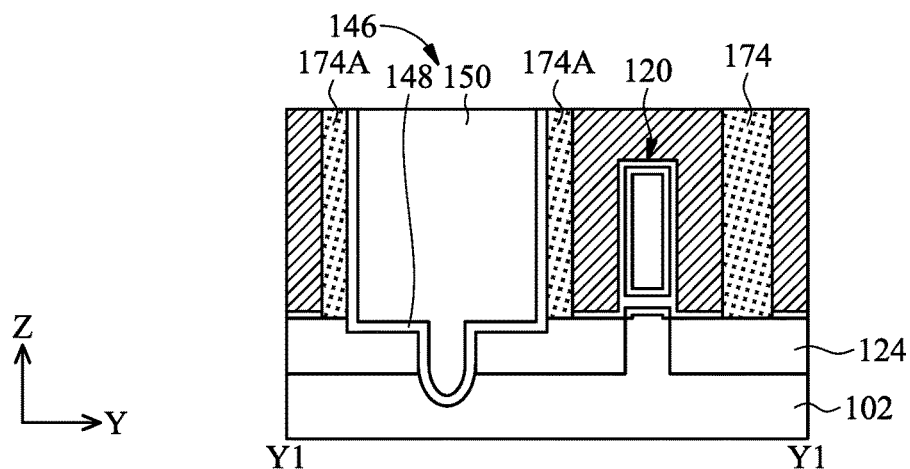
Figures 3, 14:
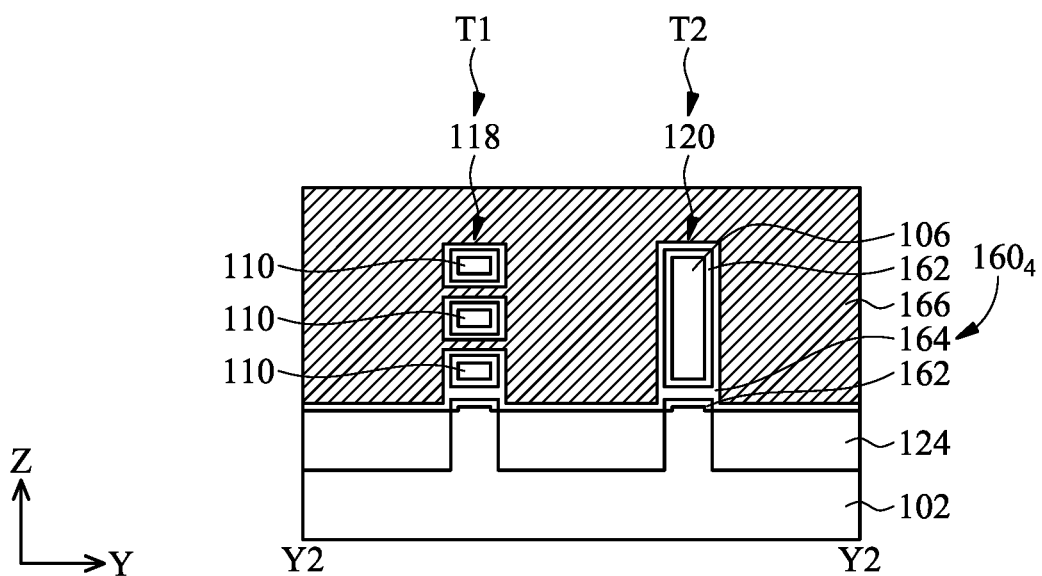
Figures 1, 15:
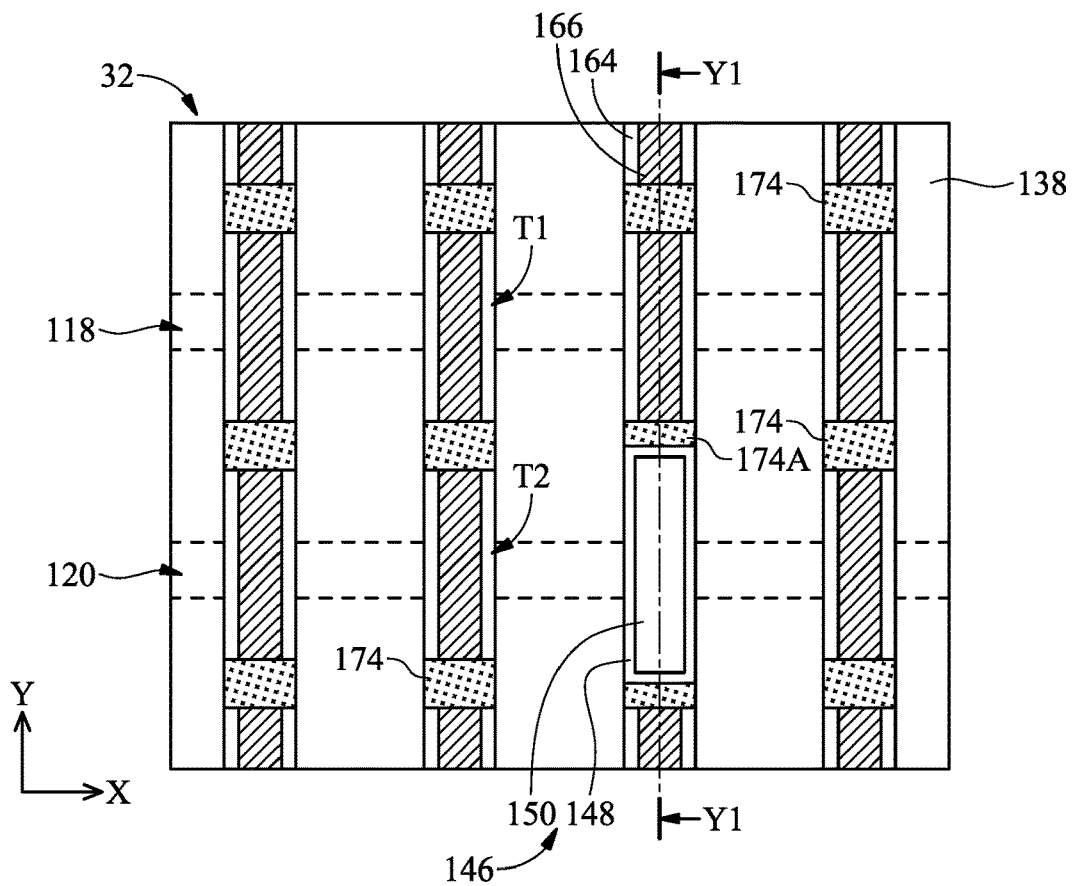
Figures 2, 15:
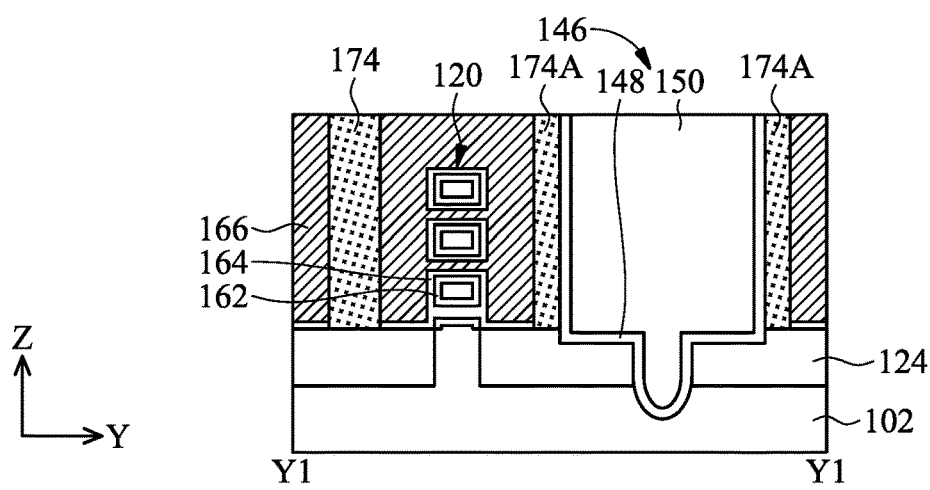
Figures 1, 16:
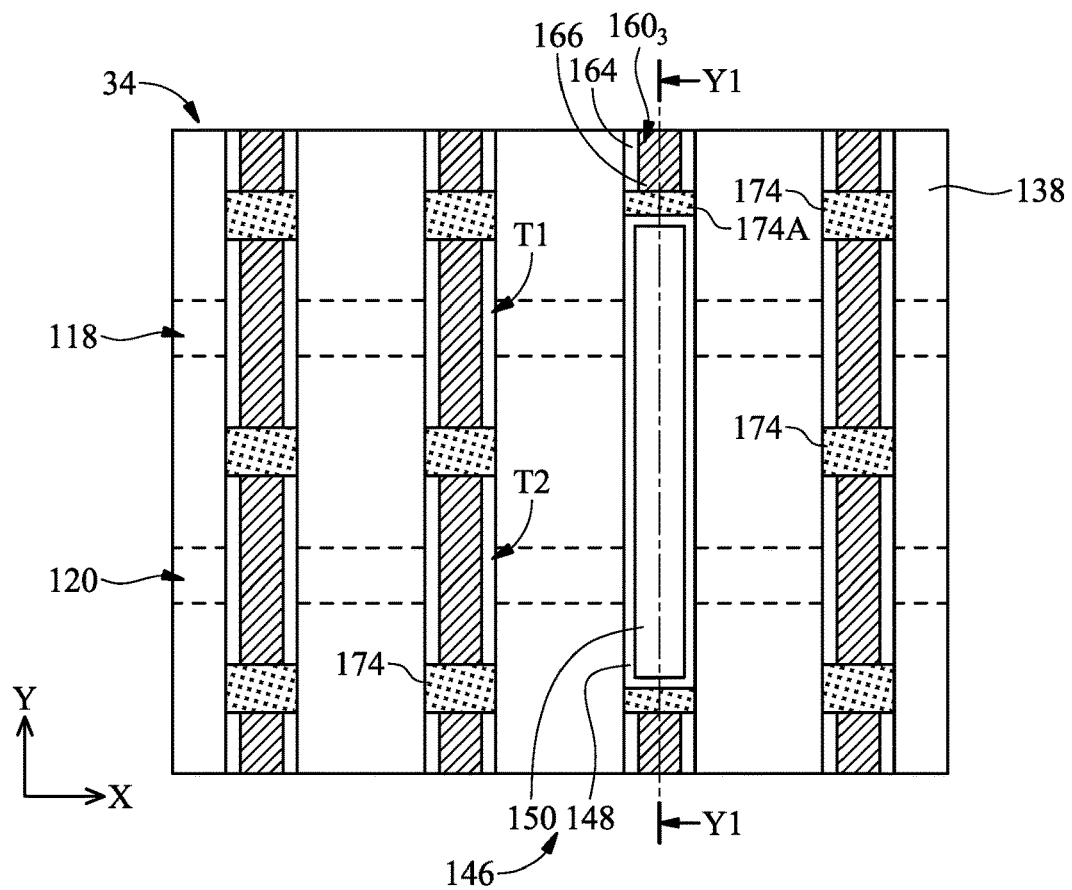
Figures 2, 16:
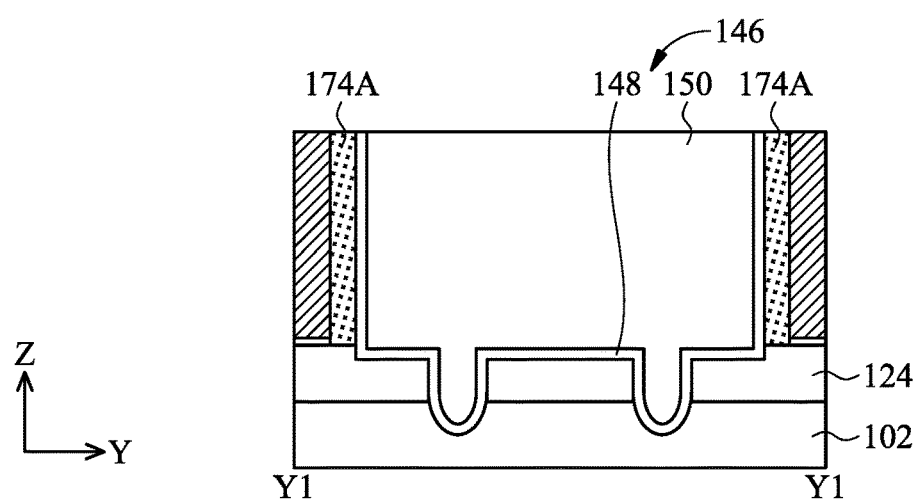
Figures 1, 17:
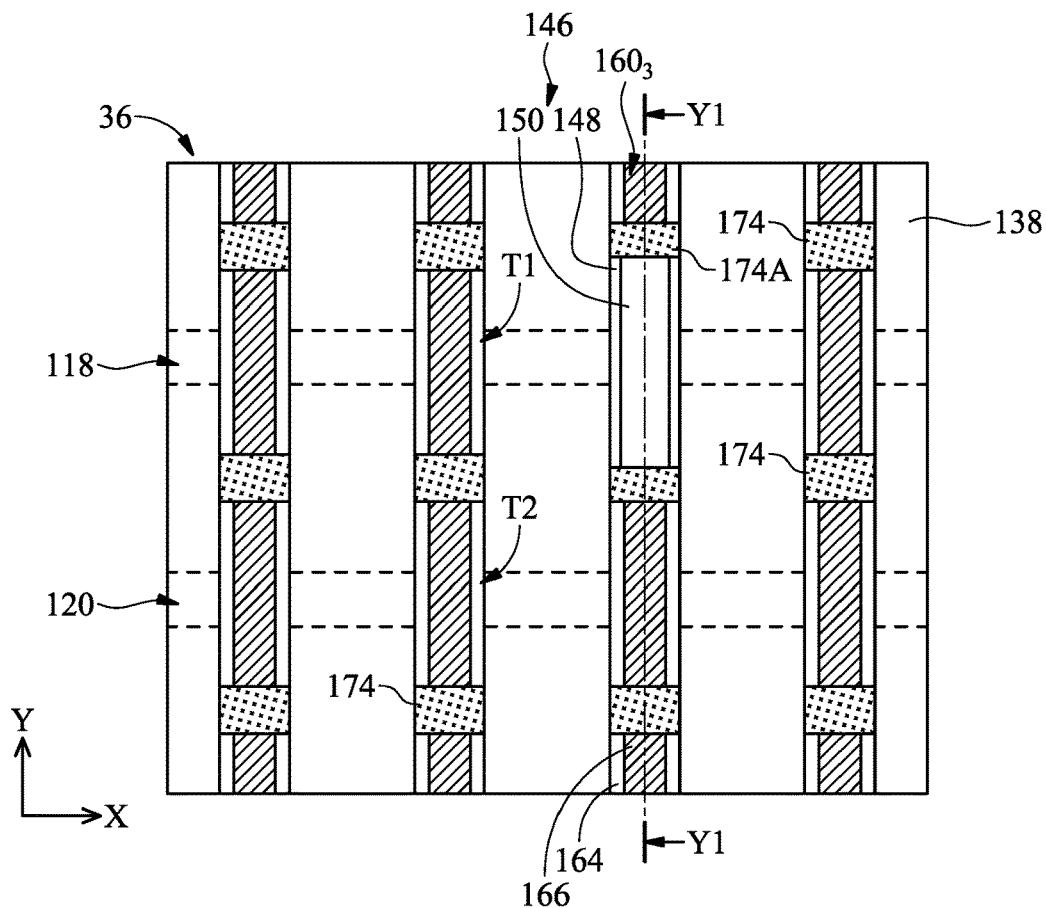
Figures 2, 17:
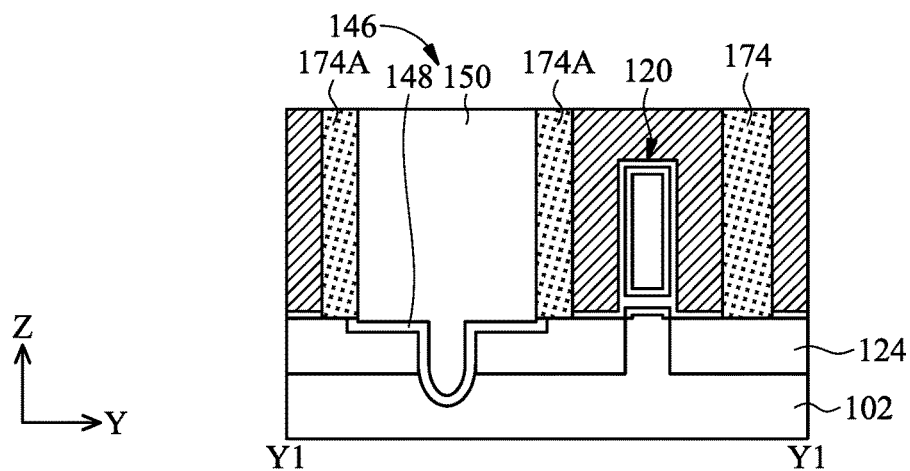
Figures 1, 18:
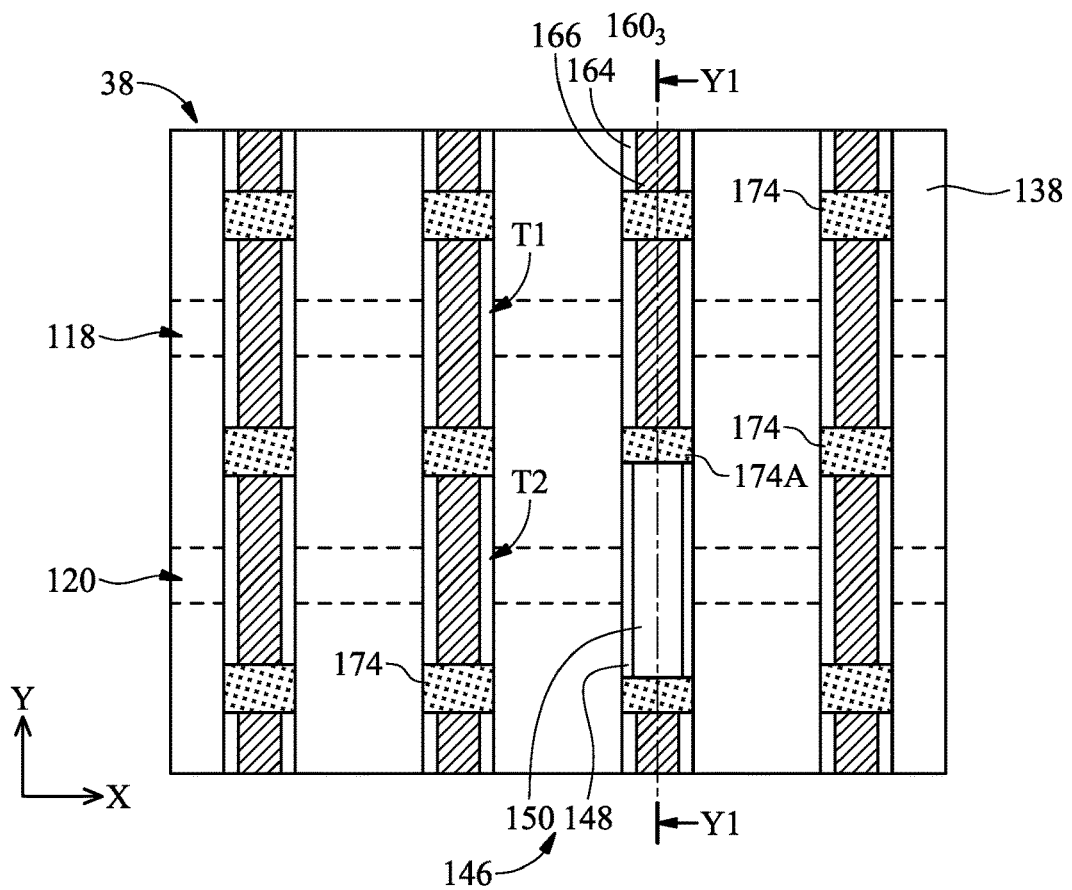
Figures 2, 18:
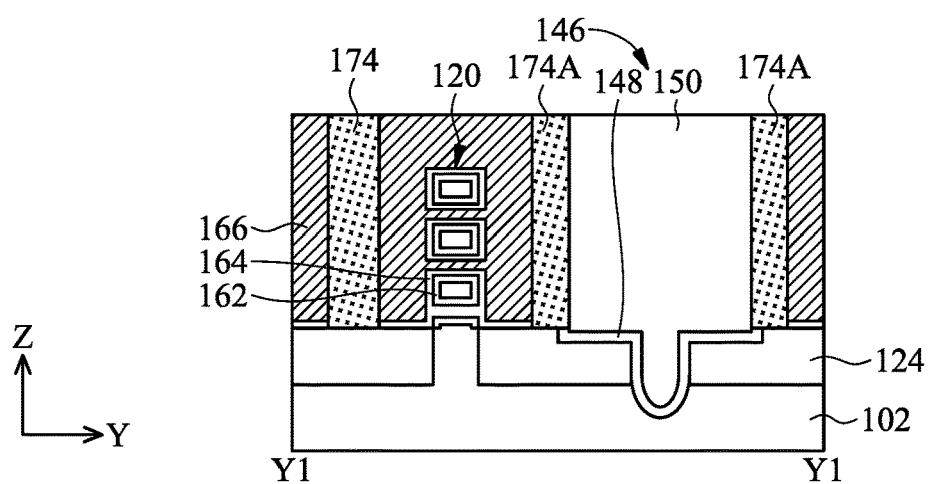
Figures 1, 19:
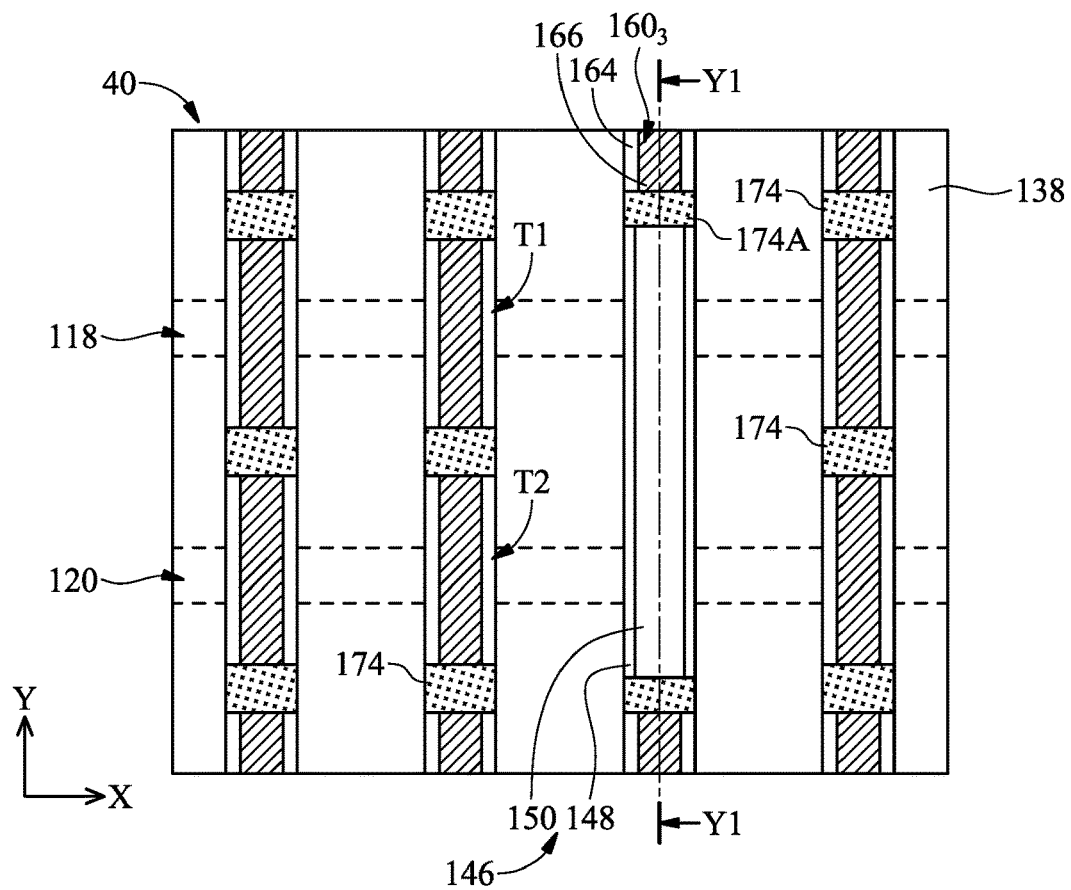
Figures 2, 19:
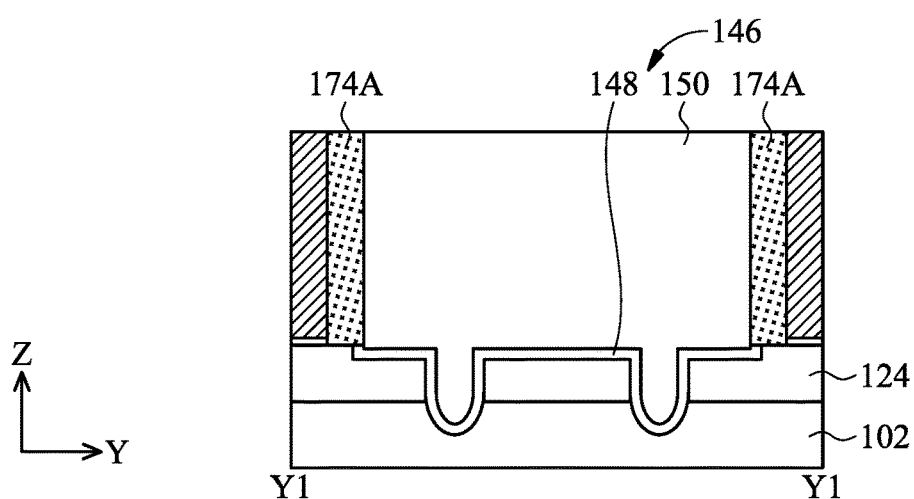
Figures 1, 20:
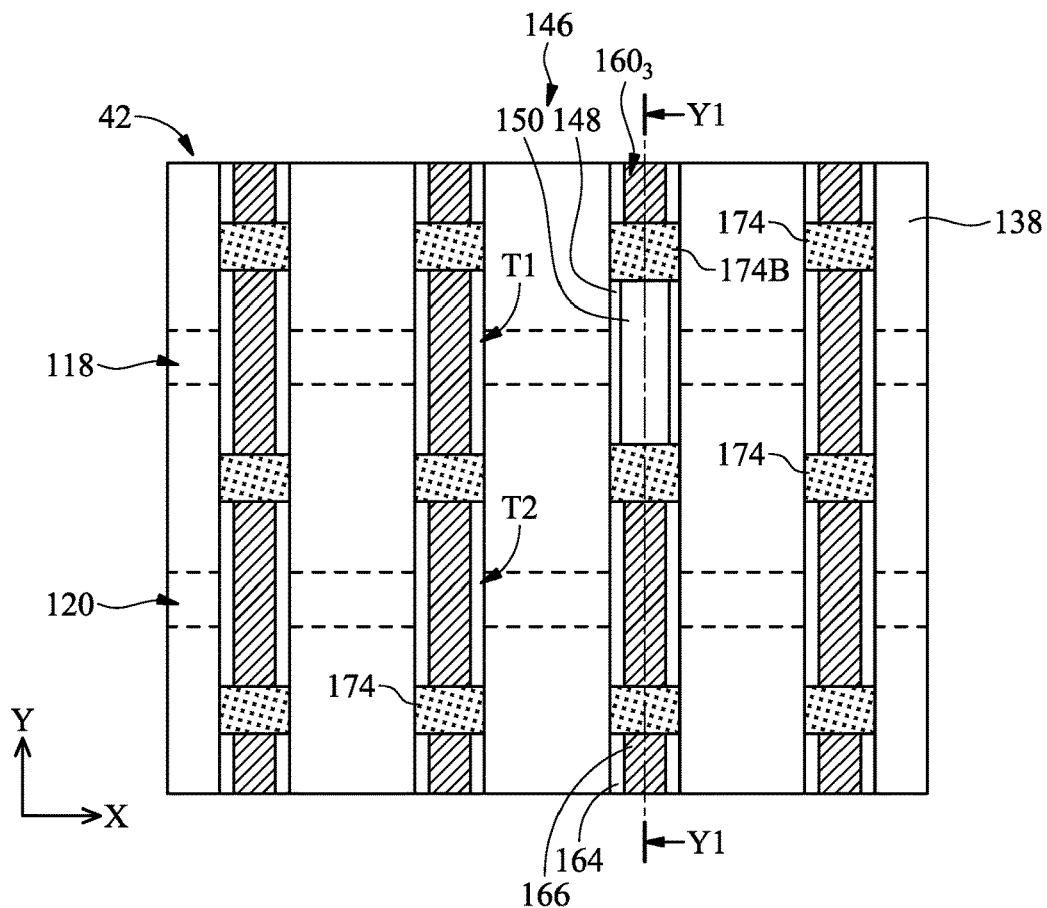
Figures 2, 20:
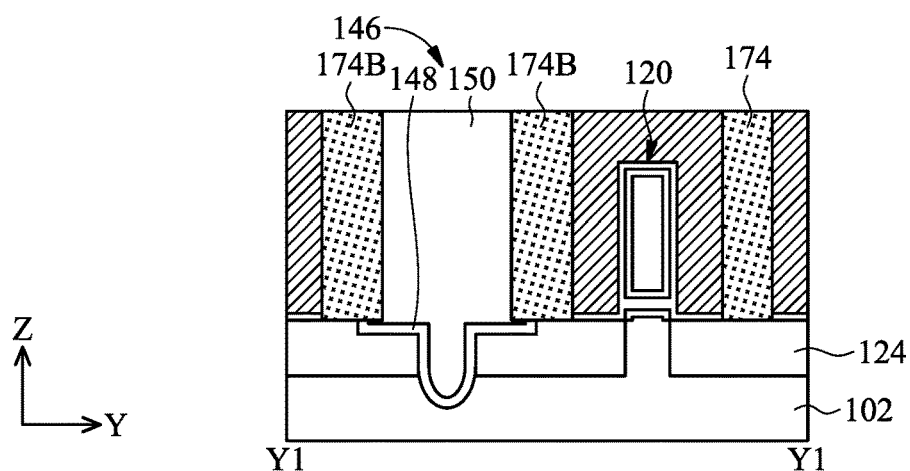
Figures 1, 21:
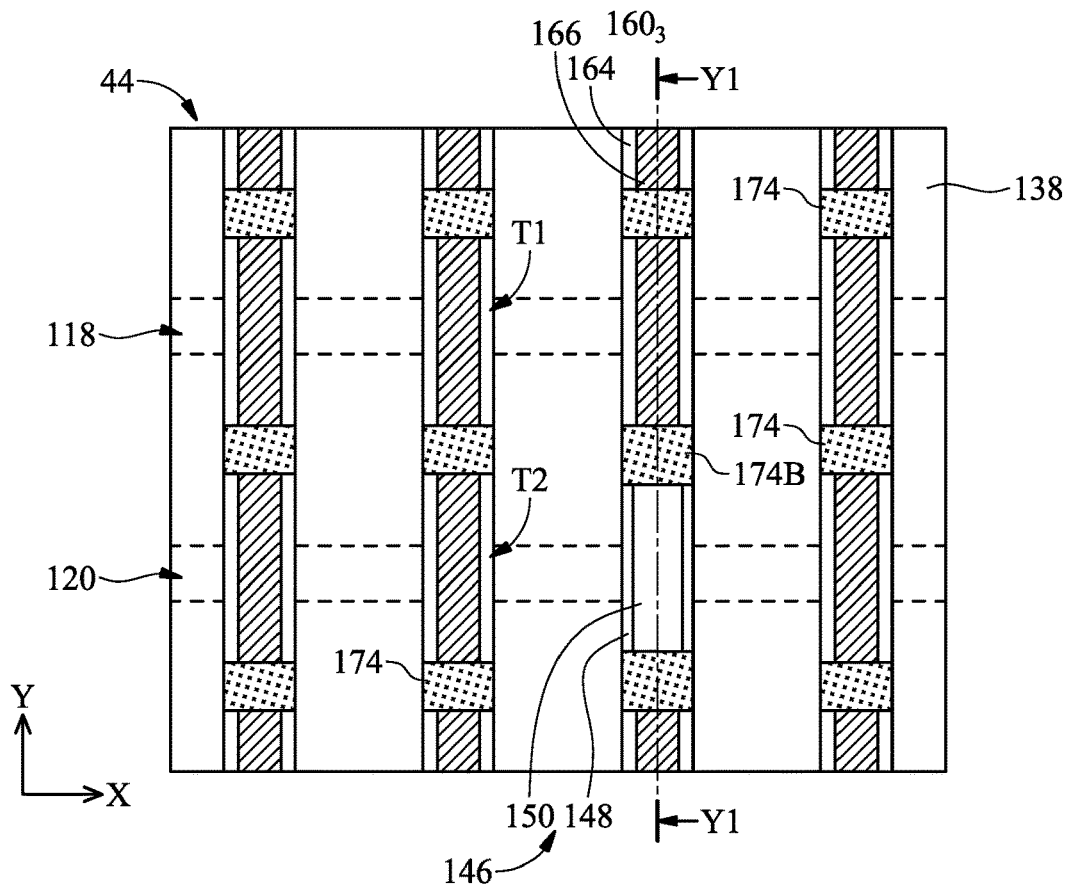
Figures 2, 21:
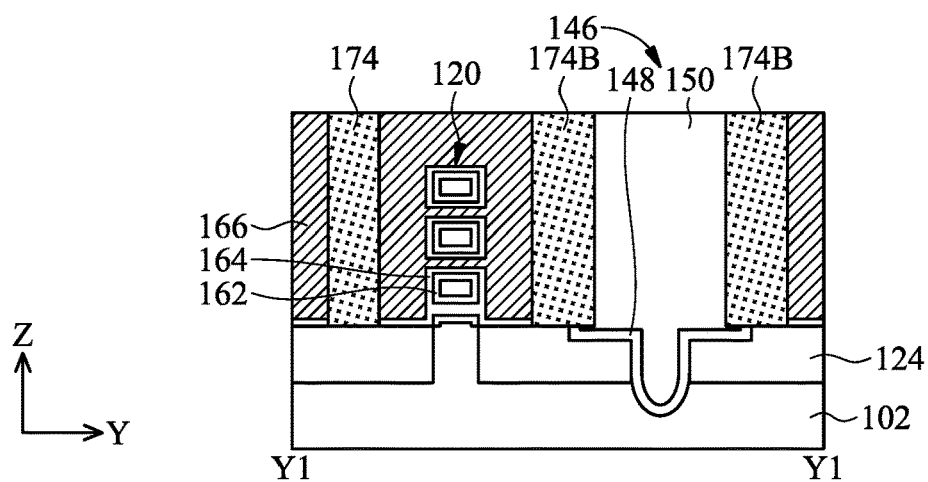
Figures 1, 22:
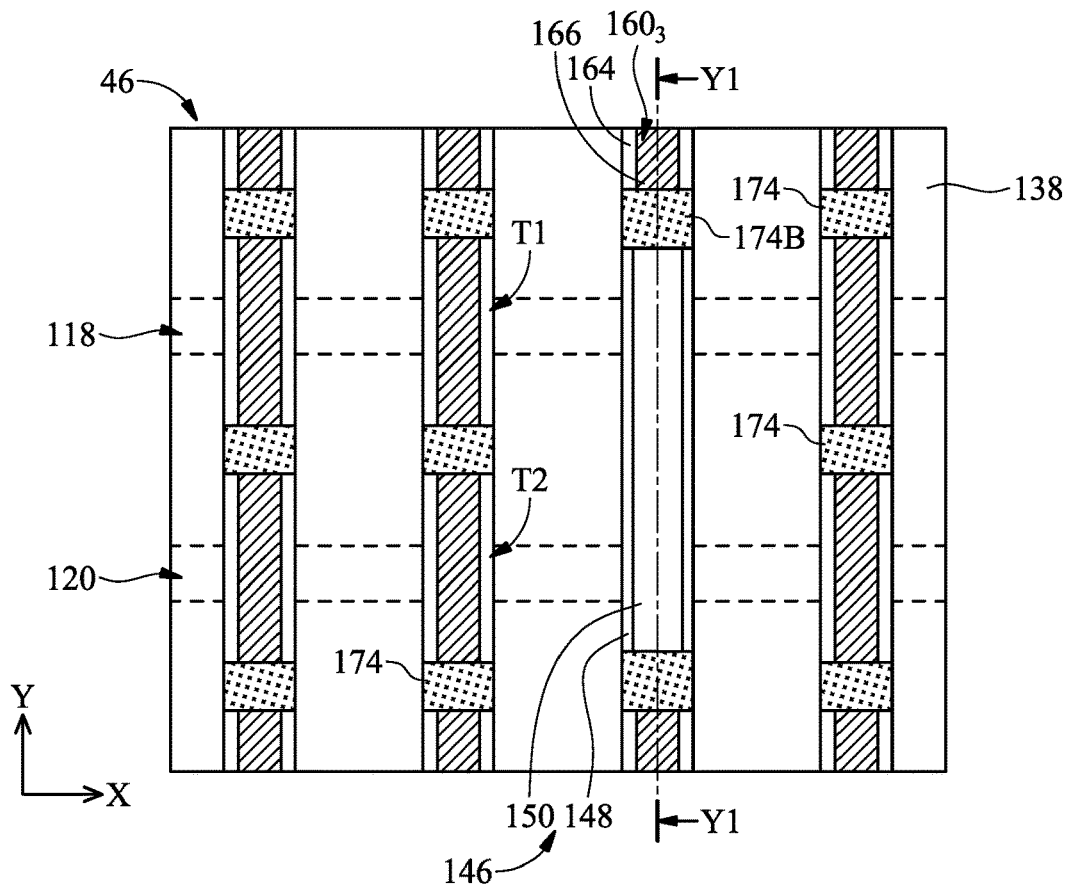
Figures 2, 22:
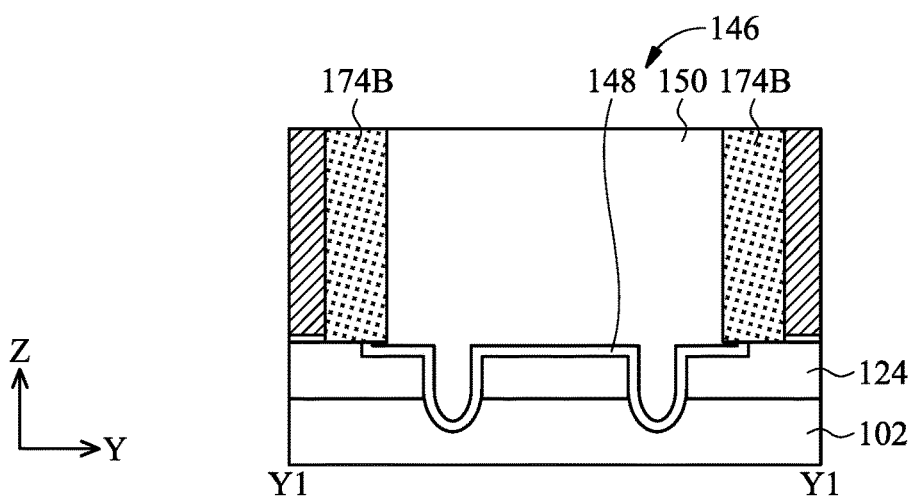

FIGS. 14-1, 15-1 and 16-1 are top views of semiconductor structures 30, 32 and 34 which are modifications of the semiconductor structures 12, 14 and 16 of FIGS. 2K-1, 6-1 and 7-1 respectively, in accordance with some embodiments of the disclosure. FIGS. 14-2, 15-2 and 16-2 are cross-sectional views taken along lines Y1-Y1 in FIGS. 14-1, 15-1 and 16-1. The semiconductor structure 30, 32 and 34 are similar to the semiconductor structures 12, 14 and 16 respectively, except that gate-cut features 174A adjacent to the isolation feature 146 are shorter in length along Y direction as compared to gate-cut features 174 not adjacent to the isolation feature 146, in accordance with some embodiments. This is because during operation 1028, portions of the dielectric lining layer 148 contacting the final gate stack $160_3$ remain unetched, in accordance with some embodiments. In addition, FIG. 14-1 illustrates that the final gate stack $160_4$ is not cut by the gate-cut feature 174. FIG. 14-3 is a cross-sectional view taken along lines Y2-Y2 in FIG. 14-1, in accordance with some embodiments. In some embodiments, the final gate stack $160_4$ continuously extends and wraps around the nanostructure 110 of the first fin structure 118 and the second fin structure 120, as shown in FIGS. 14-1 and 14-3. That is, the gate-all-around FET T1 and the FinFET T2 share a continuous final gate stack $160_4$.

FIGS. 17-1, 18-1 and 19-1 are top views of semiconductor structures 36, 38 and 40 which are modifications of the semiconductor structures 30, 32 and 34 of FIGS. 14-1, 15-1 and 16-1 respectively, in accordance with some embodiments of the disclosure. FIGS. 17-2, 18-2 and 19-2 are cross-sectional views taken along lines Y1-Y1 in FIGS. 17-1, 18-1 and 19-1. The semiconductor structure 36, 38 and 40 are similar to the semiconductor structures 30, 32 and 34 respectively, except that the gate-cut features 174A contacts both the dielectric lining layer 148 and the dielectric fill layer 150 of the isolation feature 146, in accordance with some embodiments. This is because during operation 1028, portions of the dielectric lining layer 148 contacting the final gate stack $160_3$ are removed while the dielectric fill layer 150 remains unetched, in accordance with some embodiments.

FIGS. 20-1, 21-1 and 22-1 are top views of semiconductor structures 42, 44 and 46 which are modifications of the semiconductor structures 12, 14 and 16 of FIGS. 2K-1, 6-1 and 7-1 respectively, in accordance with some embodiments of the disclosure. FIGS. 20-2, 21-2 and 22-2 are cross-sectional views taken along lines Y1-Y1 in FIGS. 20-1, 21-1 and 22-1. The semiconductor structure 42, 44 and 46 are similar to the semiconductor structures 12, 14 and 16 respectively, except that gate-cut features 174B adjacent to the isolation feature 146 are longer in length along Y direction as compared to gate-cut features 174 not adjacent to the isolation feature 146, in accordance with some embodiments. This is because during operation 1028, the dielectric lining layer 148 and the dielectric fill layer 150 suffer more lateral etching.

As described above, the semiconductor structure includes a hybrid structure including first and second gate-all-around FETs T1 and a FinFET T2 over the same substrate 102. The first gate-all-around FET T1 includes first nanostructures 110 and a first gate stack 160 wrapping around the nanostructures 110. The second gate-all-around FET T1 includes second nanostructures 110 and a second gate stack 160 wrapping around the nanostructures 110. An isolation feature 146 interposes the first nanostructures 110 of the first gate-all-around FET T1 and the second nanostructures 110 of the second gate-all-around FET T1. The FinFET T2 includes a floating fin element 106 and a third gate stack 160 over the floating fin element 106. A first gate-cut feature 174 interposes the isolation feature 146 and the third gate stack 160 of the first FinFET T2. Therefore, the hybrid structure may allow lower processing difficulty and greater design flexibility for integrated circuits (ICs) including different type of devices.

In addition, the method for forming the semiconductor structure includes forming the isolation feature 146 before a dummy gate structure 126 is replaced with a final gate stack 160, and forming the gate-cut feature 174 after the final gate stack 160 is formed. As a result, the method of the embodiments may reduce the difficulty of the etching process for forming the cut trench and enlarge the fill window of metal gate structures thereby improving device performance and production yield.

Embodiments of a semiconductor structure may be provided. The semiconductor structure may include a first gate-all-around FET and a first FinFET adjacent to the first gate-all-around FET. The first gate-all-around FET includes first nanostructures and a first gate stack surrounding the first nanostructures. The first FinFET includes a first floating fin element and a second gate stack over the first floating fin element. The semiconductor structure also includes a gate-cut feature interposing the first gate stack of the first gate-all-around FET and the second gate stack of the first FinFET. Therefore, lower processing difficulty and greater design flexibility for integrated circuits (ICs) including different type of devices may be achieved by the semiconductor structure of the embodiments of the present disclosure.

In some embodiments, a semiconductor structure is provided. The semiconductor structure includes a first gate-all-around FET over a substrate, and the first gate-all-around FET includes first nanostructures and a first gate stack surrounding the first nanostructures. The semiconductor structure also includes a first FinFET adjacent to the first gate-all-around FET, and the first FinFET includes a first fin structure and a second gate stack over the first fin structure. The semiconductor structure also includes a gate-cut feature interposing the first gate stack of the first gate-all-around FET and the second gate stack of the first FinFET.

In some embodiments, a semiconductor structure is provided. The semiconductor structure includes a first gate-all-around FET over a substrate, and the first gate-all-around FET includes first nanostructures and a first gate stack wrapping around the first nanostructures. The semiconductor structure also includes a second gate-all-around FET over the substrate, and the second gate-all-around FET includes second nanostructures and a second gate stack wrapping around the second nanostructures. The semiconductor structure also includes an isolation feature interposing the first nanostructures of the first gate-all-around FET and the second nanostructures of the second gate-all-around FET. The semiconductor structure also includes a first FinFET over the substrate, and the first FinFET includes a first fin structure and a third gate stack over the first fin structure. The semiconductor structure also includes a first gate-cut feature interposing the first gate stack of the first gate-all-around FET and the third gate stack of the first FinFET.

In some embodiments, a semiconductor structure is provided. The semiconductor structure includes a first lower fin element extending in a first direction, a set of nanostructures vertically stack over the first lower fin element and spaced apart from one another, a first gate stack wrapping around the set of nanostructures, a source/drain feature over the first lower fin element and adjoining the set of nanostructures, an isolation feature laterally spaced apart from the source/drain feature and vertically passing through the first lower fin element, and a semiconductor stack between the source/drain feature and the isolation feature. The semiconductor stack includes alternatingly stacking first semiconductor layers and second semiconductor layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a first transistor over a substrate, comprising first nanostructures and a first gate stack surrounding the first nanostructures;
   a second transistor adjacent to the first transistor, comprising a first active region and a second gate stack over the first active region; and
   a gate-cut feature interposing the first gate stack of the first transistor and the second gate stack of the second transistor;
   a third transistor adjacent to the second transistor, comprising a second active region; and
   an isolation feature interposing the first active region of the second transistor and the second active region of the third transistor,
   wherein in a top view, the second transistor, the isolation feature and the third transistor are subsequently arranged in a first horizontal direction, and the first transistor, the gate-cut feature and the second transistor are subsequently arranged in a second horizontal direction that is perpendicular to the first horizontal direction.

2. The semiconductor structure as claimed in claim 1, further comprising:
   a semiconductor stack along a lower portion of a sidewall of the isolation feature; and
   a spacer layer along an upper portion of the sidewall of the isolation feature.

3. The semiconductor structure as claimed in claim 1, further comprising:
   a fourth transistor over the substrate, comprising second nanostructures, wherein the isolation feature interposes the first nanostructures of the first transistor and the second nanostructures of the fourth transistor, wherein in a plan view, the first transistor, the isolation feature and the fourth transistor are arranged in the first horizontal direction.

4. The semiconductor structure as claimed in claim 1, wherein the first active region comprises a floating fin element made of a single continuous semiconductor material, and a bottom surface of a lowermost one of the first nanostructures is substantially level with a bottom surface of the floating fin element, and an upper surface of an uppermost one of the first nanostructures is substantially level with an upper surface of the floating fin element.

5. The semiconductor structure as claimed in claim 1, wherein the second gate stack of the second transistor comprises a gate dielectric layer covering an upper surface, sidewalls, and a bottom surface of the floating fin element.

6. The semiconductor structure as claimed in claim 1, further comprising:
   gate spacer layers surrounding an upper portion of the isolation feature; and
   semiconductor stacks under the gate spacer layers and surrounding a lower portion of the isolation feature.

7. The semiconductor structure as claimed in claim 1, wherein the first gate stack comprises a gate dielectric layer, and in a top view, a sidewall of the gate dielectric layer is substantially aligned with a sidewall of the gate-cut feature in the second horizontal direction.

8. The semiconductor structure as claimed in claim 1, wherein a bottom surface of the isolation feature is lower than a bottom surface of the gate-cut feature.

9. A semiconductor structure, comprising:
   a first transistor over a substrate, comprising first nanostructures and a first gate stack wrapping around the first nanostructures;
   a second transistor over the substrate, comprising second nanostructures and a second gate stack wrapping around the second nanostructures;
   an isolation feature interposing the first nanostructures of the first transistor and the second nanostructures of the second transistor;
   a third transistor over the substrate, comprising a first active region and a third gate stack over the first active region; and
   a first gate-cut feature interposing the first gate stack of the first transistor and the third gate stack of the third transistor; and
   a fourth transistor over the substrate, comprising a second active region and a fourth gate stack over the second active region, wherein the fourth gate stack comprises:
      a first gate dielectric layer, wherein the first gate dielectric layer is in direct contact with the isolation feature; and
      a first gate electrode layer over the first gate dielectric layer, wherein the first gate electrode layer is separated from the isolation feature by the first gate dielectric layer.

10. The semiconductor structure as claimed in claim 9, wherein the first gate stack of the first transistor comprises:
   a second gate dielectric layer; and
   a second gate electrode layer over the second gate dielectric layer, wherein the second gate dielectric layer and the second gate electrode layer are in direct contact with the first gate-cut feature.

11. The semiconductor structure as claimed in claim 9, wherein the isolation feature comprises:
   a dielectric fill layer; and
   a dielectric lining layer surrounding the dielectric fill layer and in contact with the first gate dielectric layer.

12. The semiconductor structure as claimed in claim 11, wherein the dielectric fill layer is in contact with the first gate dielectric layer.

13. A semiconductor structure, comprising:
   a substrate;
   a set of nanostructures vertically stack over the substrate and spaced apart from one another;
   a first gate stack wrapping around the set of nanostructures;
   a source/drain feature over the substrate and adjoining the set of nanostructures;
   an isolation feature laterally spaced apart from the source/drain feature, wherein the isolation feature includes a first dielectric layer and a second dielectric layer surrounded by the first dielectric layer and made of a different material than the first dielectric layer; and
   a semiconductor stack between the source/drain feature and the isolation feature; and
   a cut feature abutting and in direct contact with the first dielectric layer and the second dielectric layer of the isolation feature.

14. The semiconductor structure as claimed in claim 13, wherein the semiconductor stack includes vertically stacking semiconductor layers, and the semiconductor layers are made of Si.

15. The semiconductor structure as claimed in claim 13, further comprising:
   a first lower fin element extending in a first direction over the substrate; and
   an isolation structure surrounding the first lower fin element, wherein the isolation feature has a bottom surface lower than a bottom surface of the isolation structure and a top surface higher than a top surface of an uppermost nanostructure in the set of the nanostructures.

16. The semiconductor structure as claimed in claim 15, further comprising:
   a second lower fin element extending in the first direction;
   a floating fin element over the second lower fin element, wherein the floating fin element is thick than one of the first set of nanostructures;
   a second gate stack surrounding the floating fin element; and
   a gate-cut feature between the first gate stack and the second gate stack.

17. The semiconductor structure as claimed in claim 16, wherein the isolation feature extends across the first lower fin element and vertically passes through the first lower fin element.

18. The semiconductor structure as claimed in claim 16, wherein:
   the first gate stack comprises a first gate dielectric layer and a first gate electrode layer, wherein both the first gate dielectric layer and the first gate electrode layer are in contact with the gate-cut feature, and
   the second gate stack comprises a second gate dielectric layer and a second gate electrode layer, wherein both the second gate dielectric layer and the second gate electrode layer are in contact with the gate-cut feature.

19. The semiconductor structure as claimed in claim 13, further comprising:
   an active region; and
   a second gate stack surrounding the active region, wherein a gate dielectric layer and a gate electrode layer of the second gate stack are in contact with the cut feature.

20. The semiconductor structure as claimed in claim 15, wherein the first lower fin element continuously extends under the source/drain features and the semiconductor stack.

* * * * *